United States Patent [19]
Bauchspies

[11] Patent Number: 6,008,847
[45] Date of Patent: Dec. 28, 1999

[54] TEMPORAL COMPRESSION AND DECOMPRESSION FOR VIDEO

[75] Inventor: Roger A. Bauchspies, San Mateo, Calif.

[73] Assignee: Connectix Corporation, San Mateo, Calif.

[21] Appl. No.: 08/810,589

[22] Filed: Mar. 3, 1997

Related U.S. Application Data

[63] Continuation-in-part of application No. 08/630,431, Apr. 8, 1996, Pat. No. 5,675,382.
[51] Int. Cl.[6] .................................................. H04N 7/12
[52] U.S. Cl. .................................... 348/391; 382/232
[58] Field of Search ..................................... 348/391, 416, 348/384, 415, 420, 409, 390, 700, 708, 413, 385, 386, 387, 564, 568, 476; 382/166, 162, 232, 239, 237, 236, 240

[56] References Cited

U.S. PATENT DOCUMENTS

| 5,228,098 | 7/1993 | Crinon et al. | 382/240 |
|---|---|---|---|
| 5,321,750 | 6/1994 | Nadan | 348/476 |
| 5,384,598 | 1/1995 | Rodriguez et al. | 348/384 |
| 5,471,239 | 11/1995 | Hill et al. | 348/700 |
| 5,493,345 | 2/1996 | Ishikawa et al. | 348/700 |
| 5,576,767 | 11/1996 | Lee et al. | 348/413 |
| 5,588,075 | 12/1996 | Chiba et al. | 382/239 |
| 5,642,239 | 6/1997 | Nagai | 348/700 |
| 5,754,700 | 5/1998 | Kuzma | 382/236 |

OTHER PUBLICATIONS

Keith Jack: Video Demystified: A Video Hanbook for the Digital Engineer 1996 http://www.mindspring.com—kjack1/color space.html Color Space Conversion: YcbCr Color Space 6 pages.

*Primary Examiner*—Tommy P. Chin
*Assistant Examiner*—Gims S. Philippe
*Attorney, Agent, or Firm*—Aldo Test; Flehr Hohbach Test; Albritton & Herbert LLP

[57] ABSTRACT

A temporal compression and decompression system is disclosed for color video. A video stream with red, green and blue pixel element values is input to a first computer. In the first computer, a new frame of video data is compared to the frame being displayed on a second computer and the similarity between corresponding blocks and sub-blocks is represented with one tolerance result per sub-block. Based on the number of sub-blocks for which tolerance results exceed a preset threshold and a user-specified quality level, an update quality level is selected that determines the quality at which the frame update is transmitted from the first computer to the second computer. Before the frame update is transmitted the updating information is compressed in a two-stage process. In the first stage 5-bit red, blue and green element values in sub-blocks being updated are is converted to 3-bit categories. In the second stage groups of categories are converted to variable-length Huffman words. The Huffman words are then transmitted over a communications channel to the second computer, which decompresses and displays the updated sub-blocks.

23 Claims, 24 Drawing Sheets

Microfiche Appendix Included
(12 Microfiche, 426 Pages)

Black Mark
321

| | |
|---|---|
| Block Flag (16x16) | 324 |
|    (opt) SB1 Flag | 326-1 |
|       (opt) SB1a Flag (8x8) | 328-1 |
|          (opt) SB1U1 Flag (4x4) | 330-1.1 |
|          (opt) SB1U2 Flag (4x4) | 330-1.2 |
|          (opt) SB1U3 Flag (4x4) | 330-1.3 |
|          (opt) SB1U4 Flag (4x4) | 330-1.4 |
|    (opt) SB2 Flag | 326-2 |
|       (opt) SB2a Flag (8x8) | 328-2 |
|          (opt) SB2U1 Flag (4x4) | 330-1.1 |
|          (opt) SB2U2 Flag (4x4) | 330-1.2 |
|          (opt) SB2U3 Flag (4x4) | 330-1.3 |
|          (opt) SB2U4 Flag (4x4) | 330-1.4 |
|    (opt) SB3 Flag | 326-3 |
|     ~ | |

FIG. 5B

TEMPORAL COMPRESSION AND DECOMPRESSION FOR VIDEO

The present application is a continuation in part of the U.S. patent application having Ser. No. 08/630,431 (*Spatial Compression and Decompression for Video*) filed Apr. 8, 1996 now U.S. Pat. No. 5,675,382.

The microfiche appendix, which is part of the present disclosure, consists of 12 sheets of microfiche having a total of 426 frames.

The present and co-pending applications relate generally to video compression systems. In particular, the co-pending application is directed to spatial compression of video data. The present application builds on the co-pending application by describing inventions that provide temporal compression for video data as well as spatial compression, some principles of which are as described in the co-pending application.

A portion of the disclosure of this patent document contains material which is subject to copyright protection. The copyright owner has no objection to the facsimile reproduction by any one of the patent disclosure, as it appears in the U.S. Patent and Trademark Office patent files or records, but otherwise reserves all copyrights whatsoever.

BACKGROUND OF THE INVENTION

It takes an enormous amount of bandwidth to process, store or transmit high-resolution, full-color digital video data at acceptable frame rates. For example, assuming a video source with a resolution of 320 by 240 pixels (corresponding to VGA resolution) and 16-bit pixel data, one frame of color video data takes up 1,228.8 Kbits (320×240×16). Assuming the video source provides 12 frames per second at this resolution, systems that display or store the video data must have a bandwidth of at least 14.746 Mbits per second. Common transmission systems (telephone lines and 28.8 Kbit per second modems) and storage media (hard disk drives with typical real-world storage rates of no more than 10 Mbits per second) do not have this capability. Consequently, there is a need for systems that compress high-resolution video data so that it can be stored and transmitted more easily.

There are two classes of video compression systems. Systems that perform temporal compression shrink the amount of video data by detecting similarities between corresponding pixels in subsequent video frames and encoding the redundant information so it takes up less space on transmission or storage. In contrast, systems that solely perform spatial compression reduce the amount of data needed to represent a single frame of video by detecting regions within a frame with similar pixel data and compressing the video data corresponding to those regions. Because the present application is directed to temporal compression, the remainder of this section focuses predominantly on some problems with prior art temporal compression systems.

Many prior temporal video compression systems are built on an assumption that all frame updates are to be encoded at the same compression/quality level. Typically, this quality level is specified by a user. For example, a user might specify that the data stream from a video camera always be compressed to a high quality level so fine details of each video frame can be preserved. Upon receiving a new frame of video data, the temporal compression system determines which parts of the new frame are sufficiently different from corresponding parts of the previous frame. The temporal compressor then compresses to the required level the video data from each part of the frame that is to be updated.

This approach to temporal compression can cause two problems. First, if there is a large degree of change from one frame to the next (e.g., where the entire frame needs updating), at the predetermined compression level there might not be enough bandwidth to transmit the compressed data for the parts of the frame that need updating. Second, if there are only small differences between subsequent frames, or if the transmission channel has a large bandwidth, the available transmission bandwidth might not be fully utilized for the update, meaning that the update could have been transmitted at a higher quality level than the predetermined quality level or a lower compression ratio. Therefore, there is a need for a temporal compression system that can adaptively adjust its quality settings so that each frame update fits within the available transmission bandwidth and is also transmitted at the best possible quality.

In addition to determining which parts of a frame are to be updated based on temporal comparisons between subsequent frames, it is well known to spatially compress the updating information so that a frame update takes up less bandwidth (thereby allowing more of a frame to be updated or allowing a higher quality update) than the purely temporally compressed update. Prior art spatial compression techniques can be used for this purpose, but they are not satisfactory for a number of reasons which are described in the co-pending application and are briefly summarized below.

One problem with the prior compression systems (especially systems that make use of RLE, or run-length encoding) is that for random images (i.e., images with little or no correlation between neighboring pixel elements), they are likely to produce a "compressed" video stream that is actually longer than the original video stream. This is the case because the lack of similarity between random neighboring elements causes the RLE systems to generate uniformly long codes for all of the elements. This can even occur in RLE systems for real-world data. Even if the prior art spatial compression systems did not possess this problem, they would still be too slow to compress and then decode highly detailed video data at acceptable frame rates. This is because the encoded data provided by the prior art compression systems is structured so that it can only be decoded bit-by-bit or in time-consuming pattern matching (in the RLE case).

In contrast, the co-pending application describes a color video spatial compression system that is guaranteed to produce compressed data streams that are no bigger than the initial video stream for all possible images. Also, the spatial compression technique described in the co-pending application decodes the compressed video in multi-bit chunks and, as a result, is fast enough to provide the necessary decompression bandwidth for high quality images.

Therefore, there is a need for a temporal compression system that can make use of the spatial compression techniques described in the co-pending application to compress the updating information for each video frame.

SUMMARY OF THE INVENTION

The present invention is a system and method for performing temporal compression and decompression of color video data. The preferred embodiment receives a new frame of video data and then determines differences between contents of the new frame and contents of an on-screen video image displayed from previous frames of the video data. Regions of the new frame for which the differences exceed an updating threshold are designated as updating information. The updating quality of video compression to be applied to the updating information is then determined so that the updating information takes up no more than bandwidth available for a video transmission in which the updating information is transferred to a device displaying the video image.

When the updating information fits within the bandwidth, the preferred embodiment designates for inclusion in the updating information data from other regions of the new frame corresponding to other regions of the on-screen image displayed by the device with a display quality less than the updating quality. The complete set of updating information is compressed at a compression level consistent with the updating quality. The preferred embodiment then forms the video transmission by merging the compressed updating information with block marks indicating the on-screen blocks to be updated with the compressed updating information. To assist in the eventual decompression of the compressed updating information a representation of the updating quality used in the compression operation is appended to the video transmission.

The device receiving the video transmission first determines from the block marks which of the on-screen blocks are to be updated with the compressed updating information. The device then decompresses the updating information based on the transferred updating quality and updates the on-screen blocks to be updated with the decompressed video data. The present invention is applicable to color data that is represented in the RBG (Red, Green, Blue) color domain.

A preferred implementation of the compression operation involves two stages. For each region to be updated the stage 1 compression operation generates a category for each pixel group in the region, where a pixel group includes at least one pixel element. The category generated for a respective pixel group always has fewer bits than an individual pixel element and represents spatial differences between the respective pixel group and neighboring pixel groups. In one embodiment, the pixel elements are 5-bit values and the categories are 3-bit values, resulting in a worst case stage 1 compression ratio of 5:3 (where a category is generated for each pixel element in the region to be updated). Depending on the updating quality, categories can represent same-color pixel element data for as many as 64 pixels, resulting in much higher stage 1 compression ratios.

The stage 2 compression operation converts the stream of category data from the stage 1 compression operation to a stream of Huffman data wherein a respective category group of one or more categories from the stream of category data is represented by a variable-length Huffman value. In particular, the number of bits in a Huffman value is inversely related to the likelihood of occurrence of the respective category group. The compression resulting from this step is due to the fact that the most common category data are encoded using a small number of bits. The data from the stage 2 compression operation forms the compressed video transmission that is output to the display device/ decompressor.

Given this two stage compression procedure, the decompression operation involves the device executing stage 2 and then stage 1 decompression operations (in that order) on the compressed video transmission. Each of these decompression operations is a mirror image of the corresponding compression operation.

BRIEF DESCRIPTION OF THE DRAWINGS

Additional objects and features of the invention will be more readily apparent from the following detailed description and appended claims when taken in conjunction with the drawings, in which:

FIG. 5B depicts the structure of a block mark 321 from FIG. 5A;

DESCRIPTION OF THE PREFERRED EMBODIMENT

Figure 1:
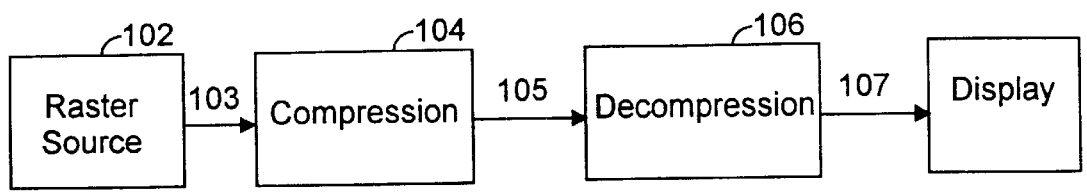
FIG. 1 is a block diagram of the video compression-decompression system of the present invention.

Referring to FIG. 1, there is shown a high-level block diagram that illustrates the environment in which the present invention operates. A conventional rasterizing video source 102 (such as a TV or video camera) generates a video data stream 103 that is input to a video compressor 104. The compressor 104 compresses the data in the data stream 103 (i.e., reduces the number of bits required to represent each frame of the original video image) and generates a corresponding compressed data stream 105 that can be transmitted or stored much more efficiently than the uncompressed video stream 103. For example, the compressed data stream 105 can be written to a storage device for later use. The compressed stream 105 can also be transmitted to a decompressor 106 that reverses (to some extent) the compression process and generates a decompressed data stream 107 that approximates the original data stream 103. A display can make use of the decompressed data stream 107 to display an approximation of the original image scanned by the raster source 102.

Figure 2:
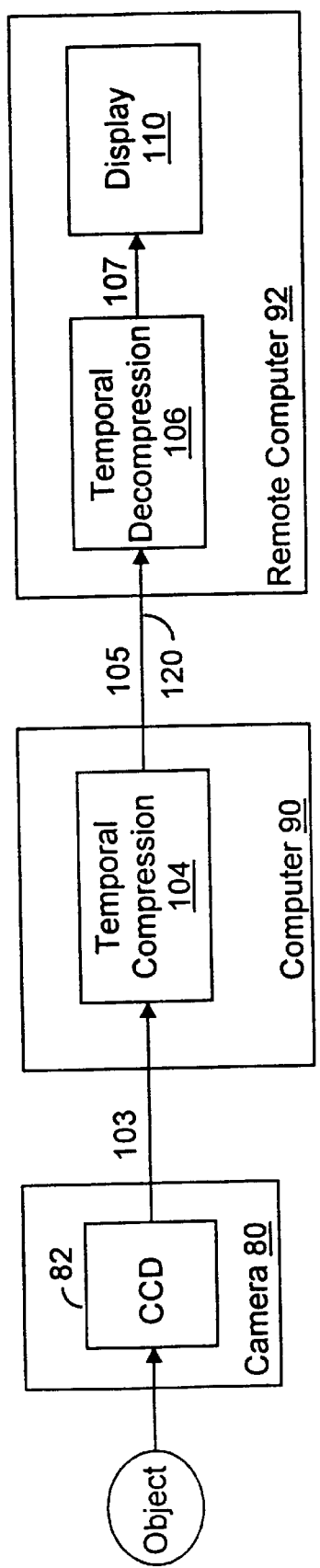
FIG. 2 is a block diagram of the video-compression-decompression system of the present invention as implemented in a digital video camera.

Referring to FIG. 2, there is shown a block diagram that illustrates a preferred embodiment of the present invention in which the raster source 102 is a charge coupled device (CCD) 82 in a video camera 80 and the video compressor 104 is a temporal compression routine 104 implemented in a computer 90 coupled to the camera 80. The CCD 82 generates a video stream 103 representing an object being imaged by the camera 80. The video stream 103 is transmitted to the temporal compressor 104, which generates a corresponding, temporally compressed video stream 105. The compressed video stream 105 is transmitted over a communications channel 120, such as a telephone line, to a remote computer 92 for subsequent temporal decompression 106 and display 110.

While the present invention assumes that a CCD 82 is the source of the video data 103, the present invention is compatible with any source of video data as long as the video data is represented in a standard 5-bit or 8-bit RGB format. Additionally, the present invention can be implemented with a front end that converts video data 103 represented in the YUV (luminance/chrominance color space) format to an equivalent RGB data stream 103'. This is a well-known conversion. Thus, the present invention can be used to temporally compress video data represented in YUV or RGB or any other equivalent color spaces. The characteristics of the video stream 103, assuming that its source is the CCD 82, are now described in reference to FIG. 3.

Figure 3:
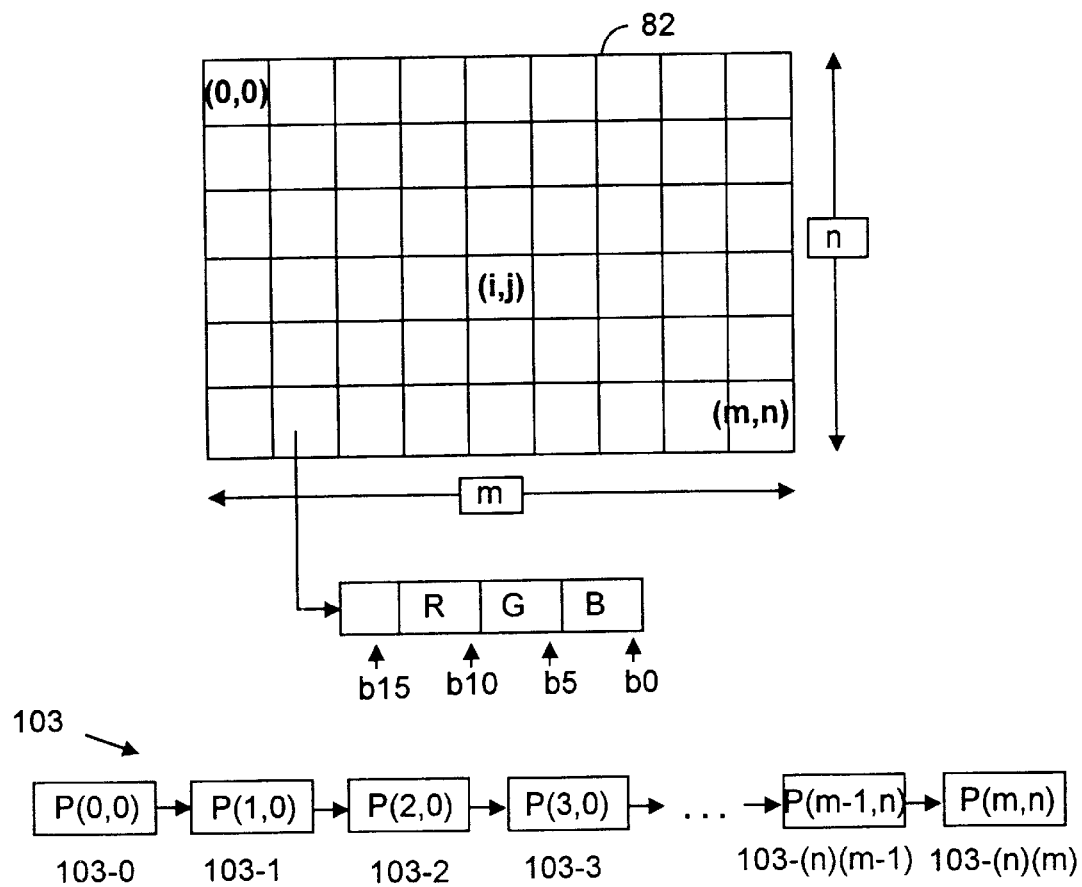
FIG. 3 depicts the structure of a typical video image and a corresponding video stream that is input to the video compression hardware.

As shown in FIG. 3, the CCD 82 scans an image using a grid of m by n pixels (short for picture cells), each of which has an associated index (i,j). For the purposes of this application, pixel(0,0) is in the top left corner of the CCD 82 and pixel(m,n) is in the lower right corner. Each of the pixels is made up of multiple elements, each sensing a different part of the visual spectrum. In the preferred embodiment, each pixel of the CCD 82 includes three pixel elements sensitive, respectively, to red (R), green (G) and blue (B) light. However, the present invention could function equally well with other types of CCDs, such as a CCD 82 having multiple pixel elements sensitive, respectively, to cyan (C), yellow (Y), and magenta (M) wavelengths; or a monochrome CCD.

The CCD 82 represents the signal detected at each pixel using a 16-bit video stream datum 103$i$. Five bits of each datum 103$i$ are used to encode the signal strength from a particular pixel element (R, G or B). The final bit (b15) is reserved for other purposes and is not used in the present invention. The CCD 82 rasterizes the scanned image by generating a video stream 103 wherein the individual 16-bit video datums 103$i$ appear in a fixed order. For example, in the preferred embodiment, the CCD 82 reads out its scanned data row by row starting from pixel(0,0), corresponding to a datum 103-0, and ending with pixel(m,n), corresponding to a datum 103-$(m)(n)$. The CCD 82 repeatedly scans and reads out image data at a fixed frame rate (FR). Depending on the processing capacity of the end user, the resolution (i.e., n and m) of the CCD 82 can be varied.

Referring again to FIG. 2, from the video stream 103 the temporal compressor 104 generates a temporally compressed data stream 105 by first determining which blocks and sub-blocks of the current video frame represented by the video stream 103 underwent a significant enough change from the currently displayed frame to justify their updating. Based on the number of blocks that need updating, the compressor 104 also determines the quality level (and corresponding degree of compression) to be applied to the update so that the update data stream 105 fits within the bandwidth of the channel 120. For each sub-block that needs be updated, the compressor 104 outputs a set of compressed datums 105$i$ of indeterminate length corresponding to those of the sub-block's pixels 103$i$ that are selected for the update based on the update quality level. For each block and sub-block that does not need to be updated, the compressor 104 outputs a single-bit datum 105$i$ set to a predetermined value (e.g., 0), which dramatically reduces the amount of data in the compressed stream 105.

The compressed data stream 105 generated by the compressor 104 is output via the communications channel 120 to the remote computer 92, where it can be processed by the decompressor 106. From the compressed data stream 105, the decompressor 106 generates a 16-bit decompressed video stream 107 that approximates the parts of the original video stream 103 that correspond to the currently-displayed blocks that need to be updated. Because of the structure of the individual datums in the data stream 105, which is a key feature of the present invention, the decompressor 106 is able to generate the decompressed video stream 107 with speed and efficiency that are not possible with prior art decompression techniques. Based on the decompressed video stream 107, the display can display a redisplayed image that resembles the original image. How well the redisplayed image resembles the original image is directly related to the quality level used by the compressor 104 for the update. However, high quality levels are also related to decreased efficiencies in video stream transmission and storage. The compressor 104 of the present invention balances these opposing factors by providing the video data compression at the greatest possible speeds while retaining acceptable redisplayed image quality, all while not exceeding the bandwidth of the communications channel.

Figure 4:
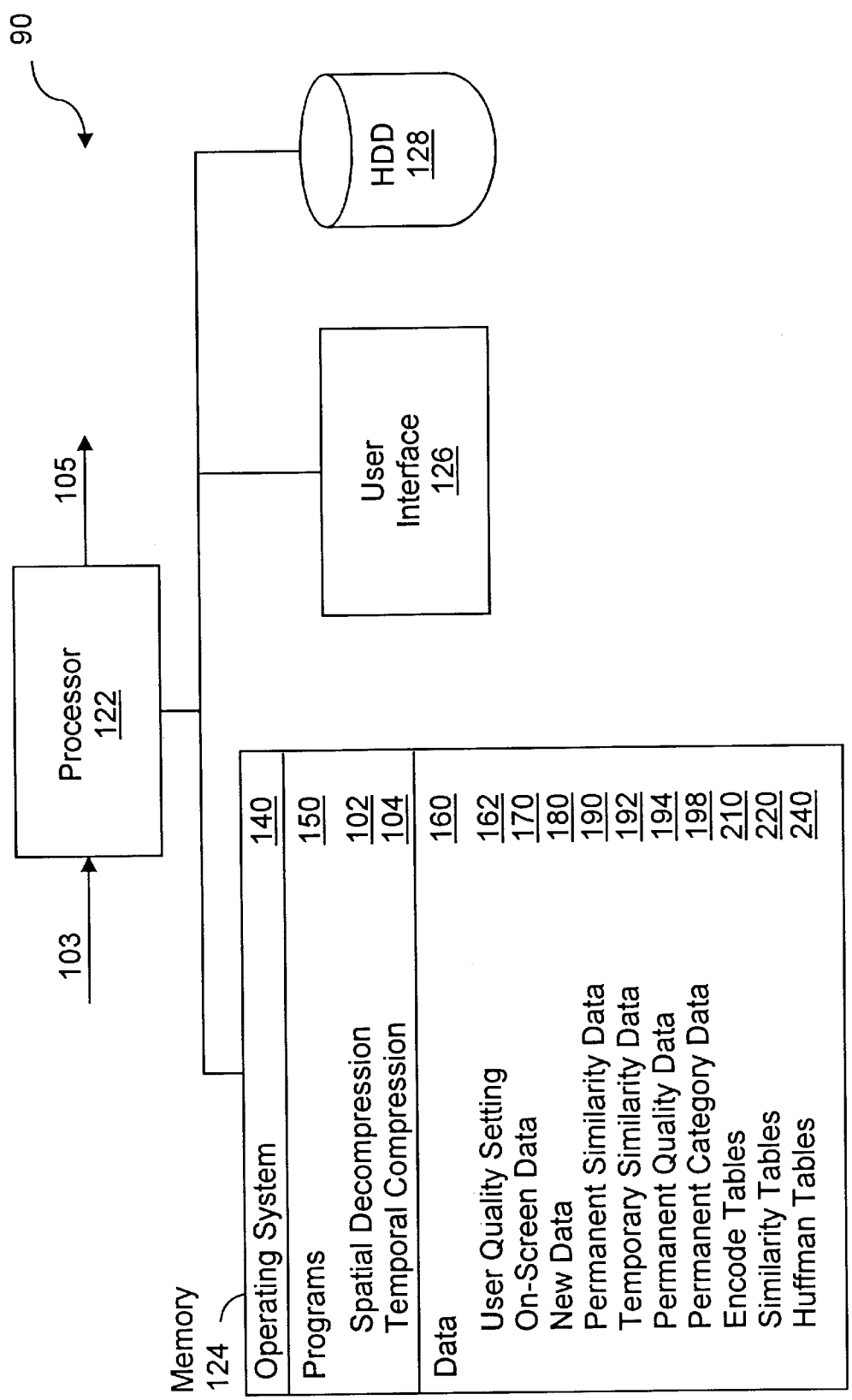
FIG. 4 is a block diagram of the computer 90 in which the present invention is implemented.

Referring to FIG. 4, there is shown a block diagram of the computer 90 in which the temporal compression function 104 of the present invention is implemented. The computer 90 includes a processor 122, a fast primary memory 124, a user interface 126 and a slow secondary memory 128, such as a hard disk drive (HDD) 128. The memory 124 includes an operating system 140, programs 150 and data 160. The operating system 140 controls the execution of the programs 150 in the processor 122 and provides the executing programs 150 with access to system resources such as the data structures 160, the user interface 126 or the hard disk drive 128.

The programs 150 can include a spatial decompression program 102 and the temporal compression program 104, whose basic functions have been described in reference to FIG. 2. The data 160, which are used by either the spatial decompressor 102 or the temporal compressor 104, include a user quality setting 162 that stores the highest quality level (selected by the user) to be applied to the temporal updates.

The quality level 162 is set to a value between 0 and 15, where 0 corresponds to the highest quality level and 15 the lowest. If the temporal compression system 104 determines that the updating information cannot be transmitted at the user quality setting 162, it uses an appropriate, lesser quality level for the particular frame update.

The data 160 also include on-screen data 170, which stores a representation of the estimated value of selected pixels on the display 110, and new data 180, which stores the value of each pixel from the current frame/data stream 103. These data structures 170, 180 are used by the temporal compressor 104 to compute the similarity of comparable sub-blocks of the new frame and the on-screen image. The temporal compressor 104 also uses arrays of permanent similarity data 190 and temporary similarity data 192 and prestored similarity tables 220 to determine the sub-blocks to be updated. The arrays 190, 192 respectively store intermediate values computed from the on-screen pixel values and the new data 180. The similarity table 220 reads out a similarity value for a unit of data based on the similarity data 190, 192 for that unit. Other data used by the temporal compressor 102 include the permanent quality data 194, which stores the quality level of each unit on the display 110, and the permanent category data 198, which stores the category data 281 for each block on the display 110.

As outlined above in reference to FIG. 2, in addition to determining which sub-blocks of the currently displayed image are to be updated with data from the current video stream 103, the temporal compressor 104 compresses the updating information prior to transmitting it to the remote computer 92. As in the parent application, the updating information is compressed in two stages. In the first stage, the temporal compressor 104 converts each 5-bit pixel element used for the update to a 3-bit category by performing a lookup into one of the encode tables 210. In the second stage, the temporal compressor 104 converts up to 5 categories at a time into a variable-length Huffman code using the Huffman table 240.

Temporal Compression

Figure 5A:
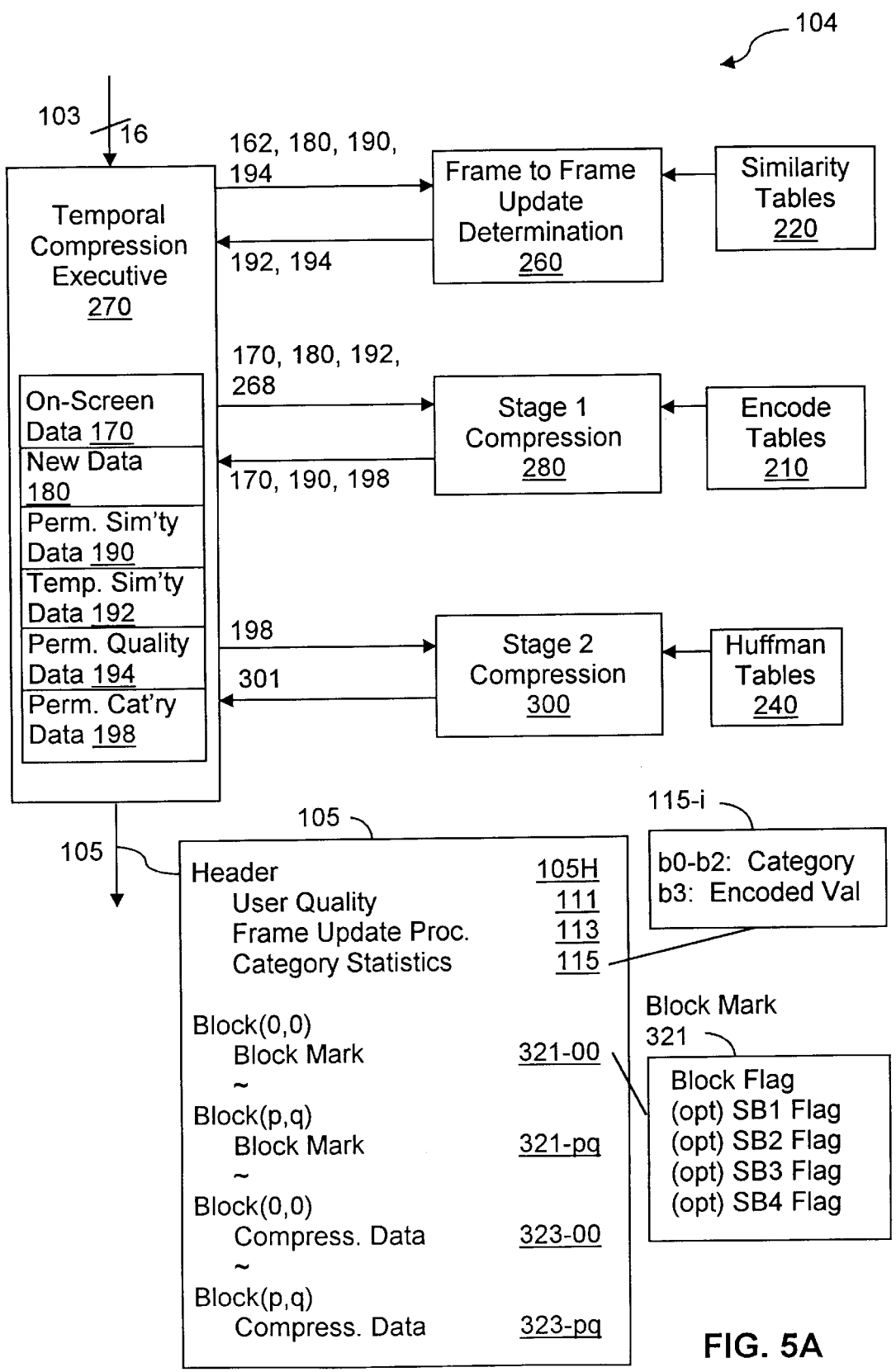
FIG. 5A is a functional block diagram of the video compression system of the present invention.

Referring to FIG. 5A, there is shown a functional block diagram of the compressor 104. The temporal compressor's functions include a temporal compression executive ("exec") 270, frame-to-frame update determination ("FFM") 260, stage 1 compression ("S1C") 280 and stage 2 compression ("S2C") 300.

The temporal compression executive ("exec") 270 receives the video stream 103 and controls the operation of and the flow of data between the other modules 260, 280 and 300. When a new frame of video data 103 becomes available, the exec 270 can perform pre-filtering on each R, G and B pixel element datum $R_{ij}$, $G_{ij}$, $B_{ij}$ according to the following expression (shown only for a representative G pixel element):

$$\text{if } G_{i,j} > \max \text{ of } \{G_{i-1,j-1}, G_{i,j-1}, G_{i+1,j-1}, G_{i-1,j}, G_{i+1,j}, G_{i-1,j+1}, G_{i,j+1}, G_{i+1,j+1}\}:$$
$$G = \max;$$
$$\text{else if } G < \min \text{ of } \{G_{i-1,j-1}, G_{i,j-1}, G_{i+1,j-1}, G_{i-1,j}, G_{i+1,j}, G_{i-1,j+1}, G_{i,j+1}, G_{i+1,j+1}\}:$$
$$G = \min;$$
$$\text{else } G = G_{i,j}.$$

In this expression the $G_{ij-1}$, etc. represent the G element values from the pixels directly above, below and to the left and right of the pixel including the target element value $G_{ij}$, and $G'_{ij}$ represents a filtered current value of the target pixel's G element. This step filters out local anomalies that could effect individual pixel element values. Alternatively, the exec 270 could use the sampled G element value directly, or apply some other filtering function to the input data to compute the target pixel's current value. For example, the eight surrounding pixels could be used. Once computed, the new current value G'i,j is written to the new data 180 in a location that is mapped from the pixel's on-screen location. Note that this filtering is an optional step.

While the exec overwrites the video data previously stored in the new data array 180 with the new frame of video data 103, the present state of the display 110, which reflects the previous video data, is represented in the permanent similarity and quality data 190, 194 and the on-screen data 170. Once it has updated the new data array 180 the exec 270 invokes frame update determination 260 on the new data 180 and the permanent data 190, 194. Frame to frame update determination 260 determines, based on the similarity tables 220 and differences between the new data 180 and the permanent data 190, 194, which blocks of video data need updating and returns the update as temporary similarity data 192 and permanent quality data 194. Using the on-screen data 170, new data 180 and the temporary similarity data 192 the stage 1 compressor 280 performs the first stage of spatial compression using the encode tables 210, after which it updates the permanent similarity data 190 and the permanent category data 198 for the blocks being updated. The first stage of spatial compression involves converting 5-bits of pixel color data to a 3-bit category; this amounts to a 5:3 compression ratio. The stage 2 compressor 300 then uses the Huffman table 240 to compress groups of the permanent category data 198 (i.e, multiple pixel category datums) into respective variable-length Huffman codes in the Huffman data stream 301.

For the two highest quality compression methods the Huffman codes are allocated to category groups so the most frequent category groups are assigned Huffman codes of the fewest possible bits, resulting in additional data compression. The executive 270 uses the Huffman data stream 301 to generate the compressed data stream 105 for the updated blocks.

The data stream 105 includes a header 105H that provides information needed by the decompressor 106 to correctly update the display 110 based on the data stream 105. The header 105H includes:

1) a 4-bit word 111 that provides the user quality setting 162,
2) a 4-bit word 113 that indicates the frame update procedure 268 employed by the compressor 104, and
3) eight, 4-bit category statistics words 115 that collectively indicate the relative frequencies of up to 8 categories 198 generated by the stage 1 compressor 280 for the current update (note that this information is present in the header only for the four lowest quality compression methods).

The data stream 105 also includes for each block a block mark 321 and, optionally, a group of compressed data 323. Each block mark 321 includes sub-block flags SB1 Flag, SB2 Flag, SB3 Flag, and SB4 Flag that indicate whether and how a respective sub-block of data within the block has been compressed. If the block is not being updated, there is no compressed data 323 for that block. Otherwise, the data within the compressed data 323 is structured as described by the corresponding block mark 321.

Figure 6:
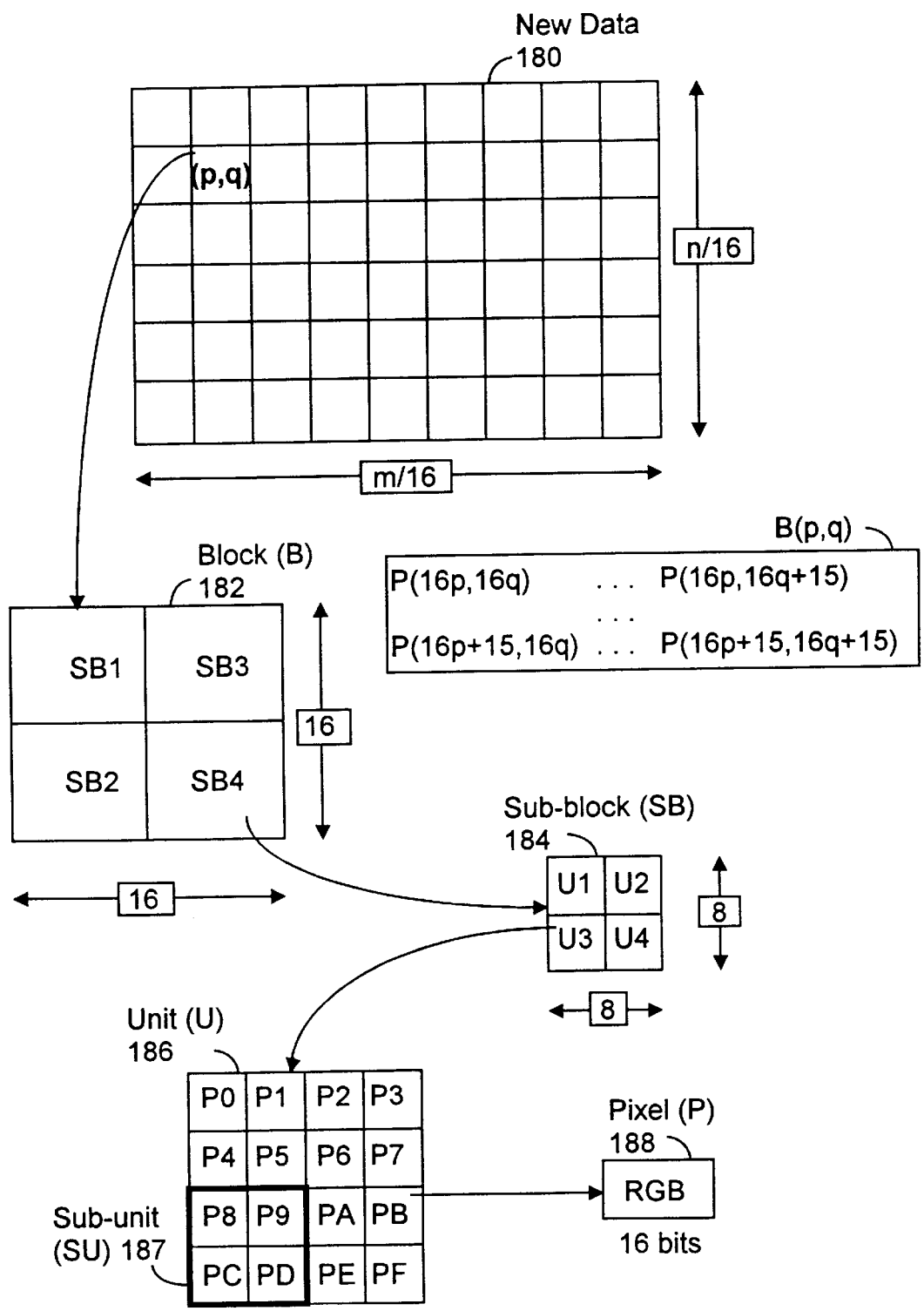
FIG. 6 illustrates the organization of the new data structure and on-screen data structure that are used in the preferred embodiment to represent, respectively, information in the latest frame of video data 103 and the image on the display 110.

Referring to FIG. 6, there is shown the hierarchical organization of the new data 180. Each video frame of m×n pixels is treated as a collection of 16×16 blocks 180. I.e., a particular block B(p,q) 182, where p and q are integer indices, consists of the rectangular group of pixels from the pixel P(16p, 16q) through the pixel P(16p+15 16q+15. Each block (B) 182 is further subdivided into four sub-blocks (SB) 184 designated SB1, SB2, SB3, and SB4. Each sub-block (SB) 184 comprises 4 units (U) 186 organized in a 2×2 square pattern, where the units (U) are numbered U1 through U4 as shown. Each unit 186 consists of sixteen pixels (P) 188, shown as P0 through PF, where each pixel (P) includes 16 bits, 15 bits of which designate the values of the red (R), green (G) and blue (B) pixel elements. A 2×2 group of pixels is referred to as a sub-unit (SU) 187. This data organization plays an important part in the temporal compression functions as it allows entire blocks of data for which there is an insubstantial frame to frame difference to not be updated, meaning such non-updated blocks can be represented with a single bit in the compressed data stream 105. How this is done is now described in reference to FIG. 5B.

Referring to FIG. 5B, there is shown a block diagram of one of the block marks 321. The block mark 321 includes one block flag 324 and, for each sub-block x: a sub-block flag 326-x (e.g., SB1 Flag), a sub-block-a (8×8) flag 328-x (e.g., SB1a Flag) and four unit (4×4) flags 330-x1, 330-x2, 330-x3, and 330-x4 (e.g., SB1U1 Flag). How a block mark 321 is set indicates how the compressed data 323 for the same block (p,q) has been compressed. The block flag 324 is asserted to indicate whether the corresponding block is being updated. If the block flag 324 is not asserted, the block mark 321 includes none of the optional flags 326–330 for any of the sub-blocks SB1–SB4. If the block flag 324 is asserted, then the sub-block flags 326 are set to indicate whether data within the corresponding 8×8 sub-blocks are being updated. If a sub-block flag 326 is asserted, then the 8×8 flag 328 is set to indicate whether the data within that sub-block are being updated at the 8×8 (sub-block) level or a lower level (either the 4×4 (unit) or 1×1 (pixel) levels). If the 8×8 flag 328 indicates that the sub-block is being updated at one of the lower levels, each of the optional unit flags 330 are set to indicate whether their corresponding unit is being updated at the 4×4 or 1×1 level. If the 8×8 flag 328 indicates that the sub-block is being updated at the sub-block level, the optional unit flags 330 are not used. Note that the block marks 330 are not used for the two highest quality compression methods. These flags are interpreted by the decompressor 106, which accordingly decompresses the compressed data 323 for each block being updated.

Frame to Frame Update Determination 260

Figure 7A:
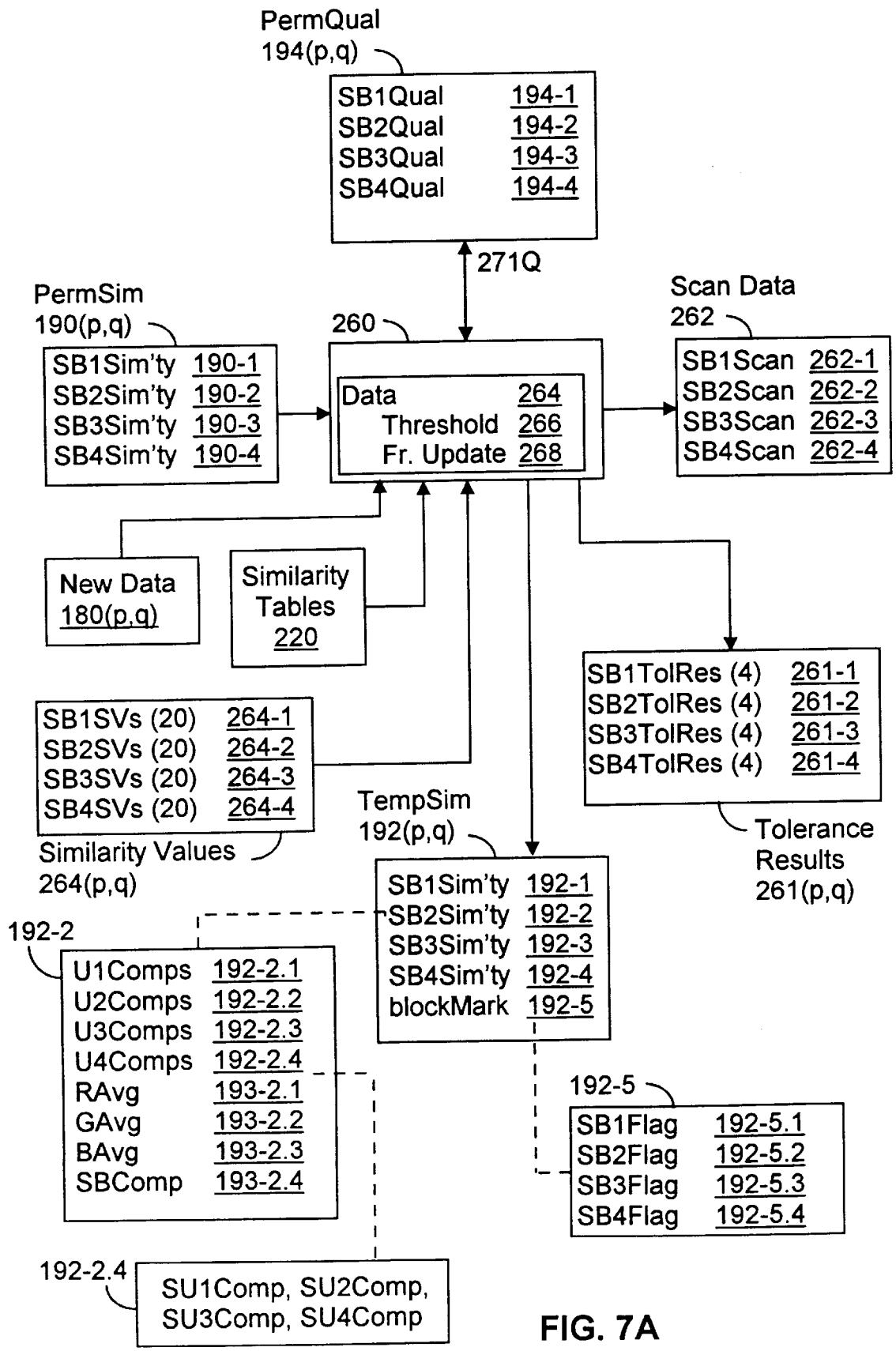
FIG. 7A is a data flow diagram of the frame-to-frame processing module 260.

Referring to FIG. 7A, there is shown a data flow diagram illustrating the interactions of the frame to frame update determination module ("FFM") 260 with some of the data structures of the present invention. Because the FFM 260 processes a frame of data block by block, the relevant data structures are shown at the block level for the same block (p,q). These data structures include the new data 180, permanent similarity and quality data 190, 194, temporary similarity data 192, similarity tables 220, scan data 262 and tolerance results 261.

The first step performed by the FFM 260 involves generating groups of permanent and temporary similarity data 190, 192 that enable the degree of change between corresponding blocks, sub-blocks and units of new (temporary) and on-screen (permanent) pixel data to be quantified. The similarity data 190, 192 are stored at the block level and are organized and generated in the same fashion. Consequently, the following discussion, which is directed only to the temporary similarity data 192, is equally applicable to the permanent similarity data 190.

Each block of temporary similarity data 192 includes a similarity group (SBiSimilarity) 192-i (i=1 to 4) for each of its four sub-blocks SBi. Each similarity group 192-i in turn comprises:

(1) a set of composite data values (UjComp) 192-i.j (j=1 to 4) for each of the four units in a sub-block;
(2) RAvg, GAvg and BAvg values 193-i.1, 193-i.2, 193-i.3 for the sub-block; and
(3) a composite data value (SBComp) 193-i.4 for the sub-block.

A set of composite data values UjComp 192-i.j includes a composite value for each 2×2 pixel sub-unit. Thus, the set of composites 192-2.4 for unit 4 of sub-block 2 includes SU1Comp, SU2Comp, SU3Comp and SU4Comp values. For the purposes of the present invention, a composite value is the sum of R G and B pixel element values for one or more pixels. Each sub-unit composite is computed by the FFM 260 as follows:

(1) add the 5-bit R, G and B values for all four pixels in the sub-unit;
(2) multiply the resulting sum by 4/3;
(3) add $$\frac{4 \times 3}{2} \times \frac{4}{3} = 8$$

to the result from step (2)
(4) truncate the result to 7-bits (using the 7 most significant bits); and
(5) store the most significant 6-bits of the truncated result as one of the composites SU1Comp, SU2Comp, SU3Comp or SU4Comp.

The factor of 8 added in step (3) allows any pixel errors resulting from integer division of SUiComp values by 16 to be symmetrical about zero for ease of processing. That is, with step (3), the pixel error (the difference between the real and integer averages of the result from step (2)) is ±0.25; without step (3) it is +0.5 and −0. For example, assuming respective results from step (1) and (2) of 191 and 254.67 (where 254.67/16=15.92), with step (3) the average (6 MSBs) is 16.0 (INT(16.42)); without step (3) the average (6 MSBs) is 15.5 (INT(15.92)).

Step 3, wherein the result of step (2) is multiplied by 4/3, scales the sum of the 12 pixel elements to 16 values, which facilitates computations on the composites. For example, after scaling, the average of a composite can be computed by right shifting the composite by 4 bits (equivalent to dividing by 16).

Each of the R, G and B averages RAVG, GAVG, BAVG is computed as follows:
(1) add all 64 of the respective pixel element values in the sub-block;
(2) add 64/2 to the sum from step (1);
(3) divide the resulting sum by 64;
(4) truncate the result to 7-bits (using the 7 most significant bits); and
(5) store the most significant 6-bits of the truncated result as the respective average RAvg, GAvg or BAvg.

The factor of 64/2 added in step (2) is a correction factor for the integer math rounding errors that result from the subsequent division in step (3) by 64.

Finally, the FFM 260 computes the sub-block composite value SBComp as follows:
(1) add together the R, G and B values for all of the pixels in the sub-block; and
(2) truncate the resulting sum to 7-bits (using the 7 most significant bits).

Note that, even though only 6-bits are stored for each element of the temporary similarity data 190, the 7-bit values computed for each element (e.g., in step 2, above) are retained and used for computations using the temporary similarity data. However, if the temporary similarity data 190 is used to update the permanent similarity data 192 for sub-blocks that are being updated, only the 6-bit values (e.g., from step 3, above) are written to the permanent similarity data 192. Additionally, all math on similarity data is done in 7-bits. Thus, 6-bit values from the permanent similarity data 192 are left-shifted by one-bit to make 7-bit values when permanent and temporary similarity data 192, 190 are compared.

Figure 7B:
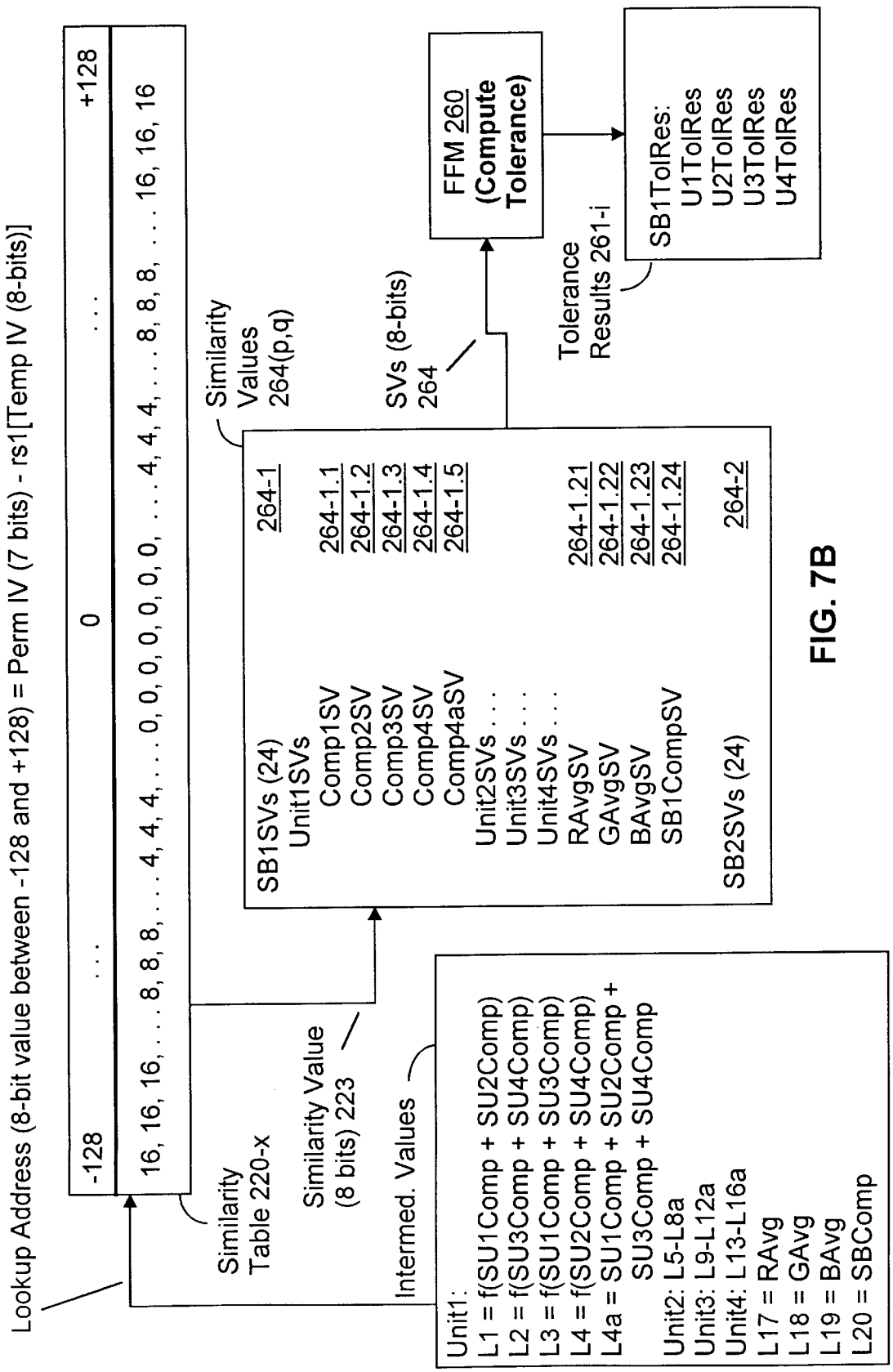
FIG. 7B is a block diagram of a similarity table 220 and the set of similarity values 264 generated for a unit using the similarity table 220.

Based on the temporary and permanent similarity data 190, 192 the FFM 260 outputs a series of 20 similarity values 264 for each sub-block. These similarity values 264 represent the differences between corresponding sub-blocks and units of the data 190, 192 and are intermediate values used by the FFM 260 to compute four tolerance results 261 associated with each sub-block. The FFM 260 computes a similarity value 264-$ij$ by performing an 8-bit lookup into one of the similarity tables 220 as illustrated in FIG. 7B. The particular similarity table 220 that is used is determined by the user quality setting 162. In the preferred embodiment, there are 8 similarity tables 220-$k$, each of which is selected by an integer index k that results from dividing the quality setting 162 by two. For example, the user quality setting 5 is mapped to the similarity table 220-2 (as 2=5/2, using integer division).

Referring to FIG. 7B, the FFM 260 forms the 8-bit lookup address into the selected similarity table 220 by computing the difference between values that are, respectively, functions of the 6-bit permanent and 7-bit temporary similarity data 192, 190. The function applied to the similarity data 190, 192 to generate the intermediate values used to compute each of the 20 similarity values is shown in the "Intermed. Values" box of FIG. 7B. Each intermediate value is designated as Lx, where "x" is an index that matches the index of the corresponding similarity value. For example, the intermediate value L1 is used to generated the lookup values for the similarity value 264-1.

The four composites SU1Comp SU2Comp, SU3Comp, SU4Comp, are combined two-by-two to generate intermediate values that, in turn, are used to generate similarity values that reflect horizontal or vertical change within a unit. In particular, the four intermediate lookup values L1, L2, L3, L4 for unit 1 are computed from the four composites SU1Comp, SU2Comp, SU3Comp, SU4Comp as follows:

$$L1=f(SU1Comp+SU2Comp)$$

$$L2=f(SU3Comp+SU4Comp)$$

$$L3=f(SU1Comp+SU3Comp)$$

$$L4=f(SU2Comp+SU4Comp).$$

The function "f" applied to the composites SUiComp depends on whether the intermediate values Lx are being computed from 6-bit permanent similarity values 190 or 7-bit temporary similarity values 192. For the permanent similarity values 190 the function "f" is the identity function, yielding 7-bit permanent intermediate values. For the temporary similarity values 192 the function "f" is "rs1" (right shift 1 bit), which converts the 8-bit sum of the two 7-bit temporary similarity values 192 to a 7-bit result. The L1 and L2 values respectively represent the composite values of the 2×4 pixel strips at the top and bottom of unit 1 and the L3 and L4 functions respectively represent the composites of the left and right 2×4 pixel strips of unit 1. An additional value, L4$a$, which represents the composite of the entire sub-block is computed as follows:

$$L4a=SU1Comp+SU2Comp+SU3Comp+SU4Comp.$$

The intermediate values L5–L8$a$, L9–L12$a$ and L13–L16$a$ are computed analogously to the similarity data for units 2, 3 and 4, respectively. The L17–L20 intermediate values are derived directly from the RAvg, GAvg, BAvg and the SBComp values.

Once the intermediate values Lx have been computed from respective permanent and temporary similarity data, the difference of corresponding 7-bit temporary and permanent intermediate values Lx is computed The resulting value is the lookup address, which is an 8 bit value between −127 and +127.

The similarity value 264 read out by the FFM 260 from the similarity tables 220 gives the categorical similarity of the corresponding intermediate values computed from the permanent and temporary similarity data. The FFM 260 performs a similarity lookup for each intermediate value L1–L20$a$, resulting in 24 similarity values 264 for each sub-block.

Each similarity value 264 is an 8-bit binary representation of an integer selected from the set that includes 2 (00000000), $2^2$ (00000010), $2^3$ (00000100) and $2^4$ (00010000). Each similarity table 220 is organized so that table entries whose 8-bit address corresponds to a pair of permanent and temporary intermediate values that are identical or very similar are set to $2^0$. As a result, referring to FIG. 7B, the center entries in the similarity table 220 are set to "0". Table entries whose 8-bit addresses correspond to very different intermediate values are set to larger similarity values. For example, if the L1 value from the permanent similarity data 190 were 126 and the L1 value from the temporary similarity data 192 were 0 (this is the maximum possible difference between two "L" values) the FFM 260 would compute a lookup address of +126 and readout a corresponding similarity value 264-*i*.1 of $2^4$. Thus, the position of the set bit (if one is set at all) in a similarity value 264 corresponds to the degree of dissimilarity of corresponding permanent and temporary similarity data.

As previously mentioned, in the preferred embodiment, there are 8 similarity tables 220. The tables 220 that are used in the higher quality modes are more sensitive to fine differences between the permanent and temporary "L" pairs than the low quality tables 220. For example, in a high quality table 220 only a few lookup addresses are mapped to table entries with similarity values of 0 and many lookup addresses are mapped to table entries with the larger similarity values (e.g., 8 and 16). The lower quality tables 220 allow many more lookup addresses to be mapped to the smaller similarity values.

The 8 similarity tables 220 can be generated on the fly or pre-stored. In particular, the 8 tables 220 of the preferred embodiment can be generated according to the following method:

(1) compute a user quality number UQ as follows:

$$UQ = (\text{User Quality Setting } \mathbf{162}+1)/2;$$

(2) compute for a permanent intermediate value (PIV) and a temporary intermediate value (TIV) pair a selection factor n as follows:

$$n = (ABS(PIV-TIV))/UQ;$$

(3) compute a scale factor m for the PIV/TIV pair as follows:

if (n = 0) then m = 0;

else if (n > 3) then $m = 2^4$;

else $m = 2^{n+1}$;

(4) compute the similarity table value SV for the PIV/TIV pair as follows:

$$SV = m(PIV-TIV);$$

(5) repeat the steps (2)–(4) until all combinations of PIV and TIV are exhausted.

For example, when the user quality setting 162 is 15 (very low quality) UQ equals 8. As a result, only for PIV/TIV pairs where the absolute value (ABS) computed in step (2) is greater than 7 will the similarity values SV diverge from 0, resulting in a relatively loose similarity table 220 (i.e., a table relatively insensitive to fine differences between a PIV and a TIV). In contrast, when the user quality setting 162 is 0 (very highest quality) UQ equals 0. As a result, only for PIV/TIV pairs where the absolute value (ABS) computed in step (2) is 0 will the similarity value SV be set to 0, resulting in a tight table.

An example of a high quality similarity table 220-0 is shown in Appendix A0. Note that this table is merely one preferred embodiment of the similarity table 220. Other embodiments are also acceptable as long as the similarity values 264 in the alternative tables encode the degree of similarity between the permanent and temporary data 190, 192 in such as way as to accommodate comparison of that similarity to a tolerance that determines whether a particular sub-block should be updated. An example of a low quality similarity table 220-7 is shown in Appendix A7. Intermediate similarity tables 220-1, . . . 220-6 are shown in Appendices A1-A6. In each of these tables the similarity values corresponding to the address −128 are on the far left and the similarity values corresponding to the lookup address +128 are on the far right.

Referring to FIG. 7B, using the 24 similarity values 264 for one sub-block, the FFM 260 computes four tolerance results 261-*i* for that sub-block. Each tolerance result represents the vertical and horizontal changes between on-screen and new data for a corresponding unit and more global changes occurring over the entire sub-block. The tolerance results 261 are computed as follows:

(1) For each unit, compute the bitwise OR of the composite similarity values (Comp1SV, Comp2SV, Comp3SV, Comp4SV, Comp4aSV)—this results in 4 values per sub-block;

(2) compute the bitwise OR of the RAvgSV, GAvgSV, BAvgSV and SB1CompSV—this results in a fifth value for the sub-block;

(3) compute the bitwise OR of the result from step (2) with each of the 4 values from step (1)—this results in four values;

(4) store the 4 results from step (3) as the four tolerance results U1TolRes, U2TolRes, U3TolRes, U4TolRes 261-*i* for the sub-block.

Because each tolerance result is a bitwise OR of similarity values that are sensitive, respectively, to vertical/horizontal changes within a unit and to general changes across an entire sub-block, each tolerance result can detect the two types of frame-to-frame changes that are most typical of real-word video data (i.e., vertical/horizontal changes and/or changes that affect an entire sub-block). Each of the similarity values has at most a single set bit; as a result the highest set bit in a tolerance 261 indicates the greatest difference between the corresponding permanent and temporary data used to compute that tolerance.

Figure 7C:
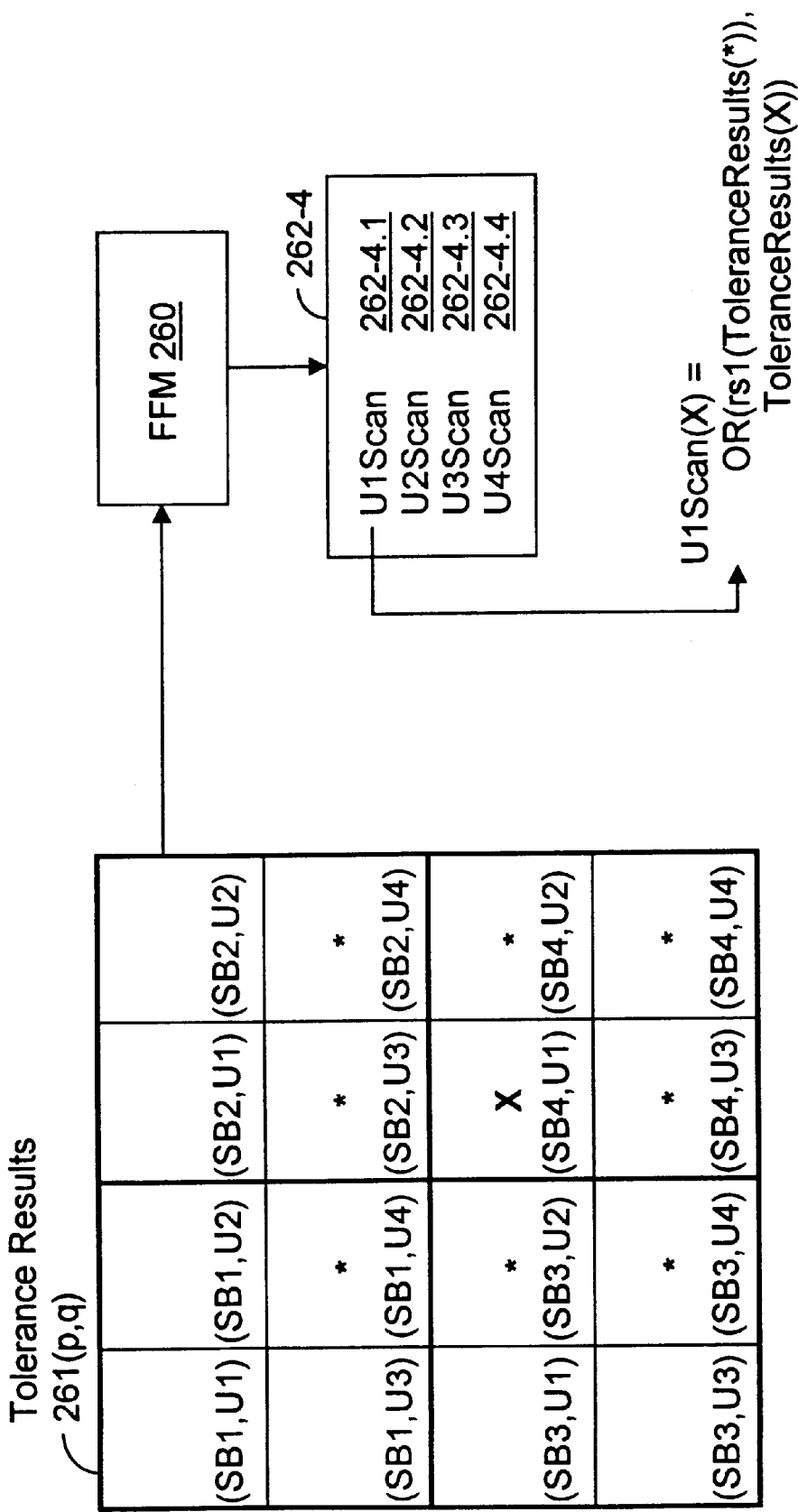
FIG. 7C is a block diagram of a representative block(p,q) of the tolerance results 261 and the scan data 262 generated from that block.

Referring again to FIG. 7A, the FFM 260 stores each tolerance result 261-*ij* (i and j corresponding respectively to sub-block and unit indices in a block (p,q)) in the tolerance results array 261. Referring to FIG. 7C, there is illustrated the structure of a block (p,q) of the tolerance results array 261. The sub-block (SB) and unit (U) indices corresponding to the cells of the block are shown in parentheses (e.g., "(SB1, U1)"). The FFM 260 makes use of the tolerance result data 261 to compute for each unit (i,j) a scan value 262-*ij*. Each scan value 262-*ij* represents a global unit tolerance value that takes into account the context (i.e., state of surrounding units) of a unit (i,j). Referring to FIG. 7A, a temporary similarity block 192 includes a blockMark 192-5 that indicates using four flags (UiFlag) 192-5.*i* which of the sub-block's units has a scan value 262-*ij* that exceeds an update threshold 266 set by the FFM 260. These flags are used by the FFM 260 to keep track of the units that need to be updated for a given temporal update. For example, if the U1TolRes and the U3TolRes exceed the threshold 266, the FFM 260 would set the flags 192-5.1 and 192-5.3 to "1" and the flags 192-5.2 and 192-5.4 to 0. The permanent similarity data 190 does not include a block mark. The use of these flags 192-5 and the iterative updating process performed by the FFM 260 are now described.

Referring to FIG. 7C, the FFM 260 computes the scan value 262-*i.j* (e.g., U1Scan) for the unit (i,j) (marked with an "X") by computing the bitwise OR of the tolerance results 261 for that unit and its neighboring units (marked with an "*"), after being right-shifted by 1-bit ("rs1"). As a result, even if the unit (i,j) being scanned has a small tolerance result 261-X, if even one surrounding unit has a large tolerance result 261-*, the scan value 262-*i.j* will reflect that fact. The FFM 260 compares the scan results 262 to a fixed threshold 266 (in the preferred embodiment, the threshold 266 is "4", or 00000100) to determine whether a unit should be updated. Consequently, because the scan results 262-*i.j* reflect the tolerance results of the target unit (i,j) and its neighbors, the FFM 260 tends to update groups of units, not just a few units in isolation. This prevents artifacts from adjacent blocks from affecting the current block. Additionally, the FFM 260 updates any sub-block that contains a unit that it determines needs updating. This also contributes to the smoothness of the updated image.

Once the FFM 260 has determined the sub-blocks to update, it updates the permanent quality data 194 to a state consistent with the current update, which it returns with a consistent set of blockMarks 192-5 to the temporal compression executive 270 (FIG. 1). These data 192, 194 are subsequently used by the S1 compression module 280 to compress the color data from the blocks/sub-blocks being updated.

For each update, the FFM 260 determines 1) how many of the sub-blocks of the on-screen data 170 will be updated with the new data 180 (a sub-block is updated if one of its units has a tolerance that exceeds the threshold) and 2) the frame update procedure 268 that is to be applied to the update information before it is transmitted. The FFM 260 indicates which on-screen sub-blocks have a scan value 262-*i* that exceeds the threshold 266 (i.e., are to be updated) by marking the appropriate fields of the blockMark 192-5. Each block being updated for a given frame is updated at the respective quality level associated with the frame update procedure 268 selected by the FFM 260).

In the preferred embodiment the FFM 260 can select from six frame update procedures (0–5), each of which has an associated quality level. In particular, the update procedures 0–3 provide high quality updates and the update procedures 4–5 provide low quality updates. In the preferred embodiment, the three highest quality update procedures (0–2) are independent; that is, they do not share data. As a result, if one of these update procedures is selected for a video transmission, every frame of that transmission is compressed according to that single frame update procedure. The three lowest quality update procedures (3–5) are cooperative, meaning they can share each other's data and can be used to update any frame in a transmission that is being compressed at the low quality level. For example, frame 1 of a transmission can be updated with the update procedure 268 set to 3 and frame 2 with the update procedure 268 set to 4.

In alternate embodiments, due to similar processing structures, the two highest quality frame update procedures (0 and 1) can share data and the frame update procedure 2 can share data with the three lowest quality frame update procedure (3–5).

If the user quality level 162 is between 0 and 8, the FFM 260 sets the frame update procedure 268 as shown in the following table:

| User Quality 162 | Frame Update Procedure 268 |
|---|---|
| 0 | 0 |
| 1,2 | 1 |
| 3,4,5 | 2 |
| 6,7,8 | 3 |

If the user quality level 162 is between 9 and 15, the FFM 260 sets the update procedure 268 to 3 unless a lower quality/higher compression update procedure 268 (i.e., 4 or 5) is necessary for the update to fit within the available bandwidth.

To facilitate the updating of stale or lower-quality on-screen data, the FFM 260 writes an on-screen quality level 271Q to the permanent quality data 194 based on the frame update procedure 268 used to update a particular block. The on-screen quality level 271Q is only written to blocks that are being currently updated. There are four on-screen quality levels 271Q that correspond to the six frame update procedures 268 as follows:

| Frame Update Procedure 268 | On-Screen Quality Level 271Q |
|---|---|
| 0–3 (HIGH) | 0, 1 |
| 4 | 2, 3 |
| 5 (LOWEST) | 4, 5 |

Note that the highest quality update procedures 268 (those between 0 and 3) are all associated with the same two on-screen quality levels 271Q (0 and 1). This is because, in the preferred embodiment, those four quality levels 268 are independent and are not used together for the same video transmission. I.e., there is no quality/procedure shifting as between the four highest quality update procedures 268. How the FFM 260 uses the on-screen quality levels 271Q is now described.

If for the selected frame update procedure 268 and threshold 266 the update data is estimated to be sufficiently smaller than the communications bandwidth, the FFM 260 determines which of the un-marked sub-blocks of on-screen data 170 were last updated at an on-screen quality level equal to or lower than the current on-screen quality level 271Q and then marks as many of those blocks (in the similarity data 190) as possible for updating with the current frame data 180. For example, if the current quality level 271Q were set to 2 the FFM 260 would try to update all of the sub-blocks last displayed at on-screen quality levels of 3–5. The FFM 260 prioritizes the updating of sub-blocks from the lowest quality level (5) to the highest quality level (0) so the poorest quality data is updated first. When it is finished, the FFM 260 updates the appropriate sub-blocks of the permanent quality data 194 with the on-screen quality value 271Q corresponding to the quality level 268 set by the FFM 260.

If it has updated all of the possibly updatable sub-blocks to the current quality level 271Q, the FFM 260 toggles the quality level 271Q to its paired value. For example, if the quality level 271Q used for the current update is "2", the quality level 271Q is toggled to "3". Then, if the next update is performed with the update procedure 268 set to 4 (corresponding to 271Q=2 or 3), the quality level 271Q used would be marked in the permanent quality data as "3" and the data to be updated would be identified by permanent quality data values 194 set to 2 and 4–5. The FFM 260 then returns the permanent quality data 194 and the temporary similarity data 192 to the keystroke executive 270 along with the quality value 271Q (FIG. 5A).

Referring to FIG. 5A, upon receiving the data 192, 194 from the FFM 260, the exec 270 calls the stage one spatial compression module (S1C) 280, which performs the first stage in compressing each sub-block of new data 180 specified by a blockMark 192-5 in accordance with the selected frame update procedure 268. In compressing a sub-block of the new data 180, the S1C 280 uses the on-screen data 170, the temporary similarity data 192 and the encode tables 210. The structure and operation of the S1C 280 is shown in FIG. 8.

Stage 1 Compression 280

Figure 8A:
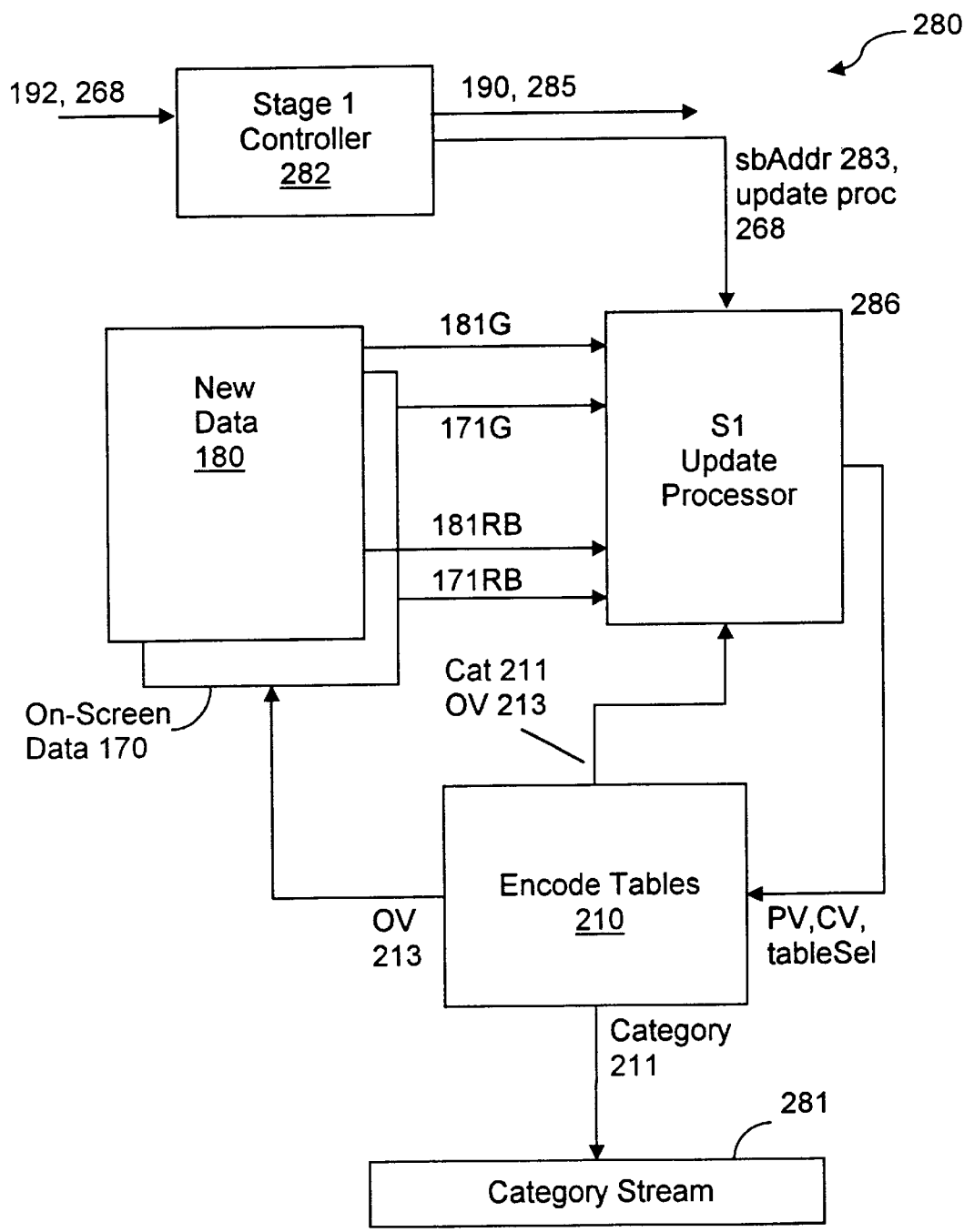
FIG. 8A is a functional block diagram illustrating the operation of the first stage compression module.

Referring to FIG. 8A, there is shown a block diagram of the Stage 1 compressor (S1C) 280. Note that the blocks of the S1C 280 are illustrated in the context of the data flows and data transformations composing the processing performed by the S1C 280. This form of illustration is similar to a hardware block diagram and is not intended to illustrate the organization and operational hierarchy of the software components that make up the S1C 280. The organizational details shall become apparent in the following description.

The S1C 280 includes a stage 1 controller 282 and a S1 update processor 286. Data inputs to the S1C include the new data 180, on-screen data 170 and the encode tables 210. For each block of new data 180 being compressed, the S1C 280 outputs a block mark 285 and a category stream 281 of 3-bit categories 211. Once the current stage one compression step has been completed the S1C 280 updates the permanent similarity data 190 with the temporary similarity data 192 for each sub-block that was compressed.

Figure 8B:
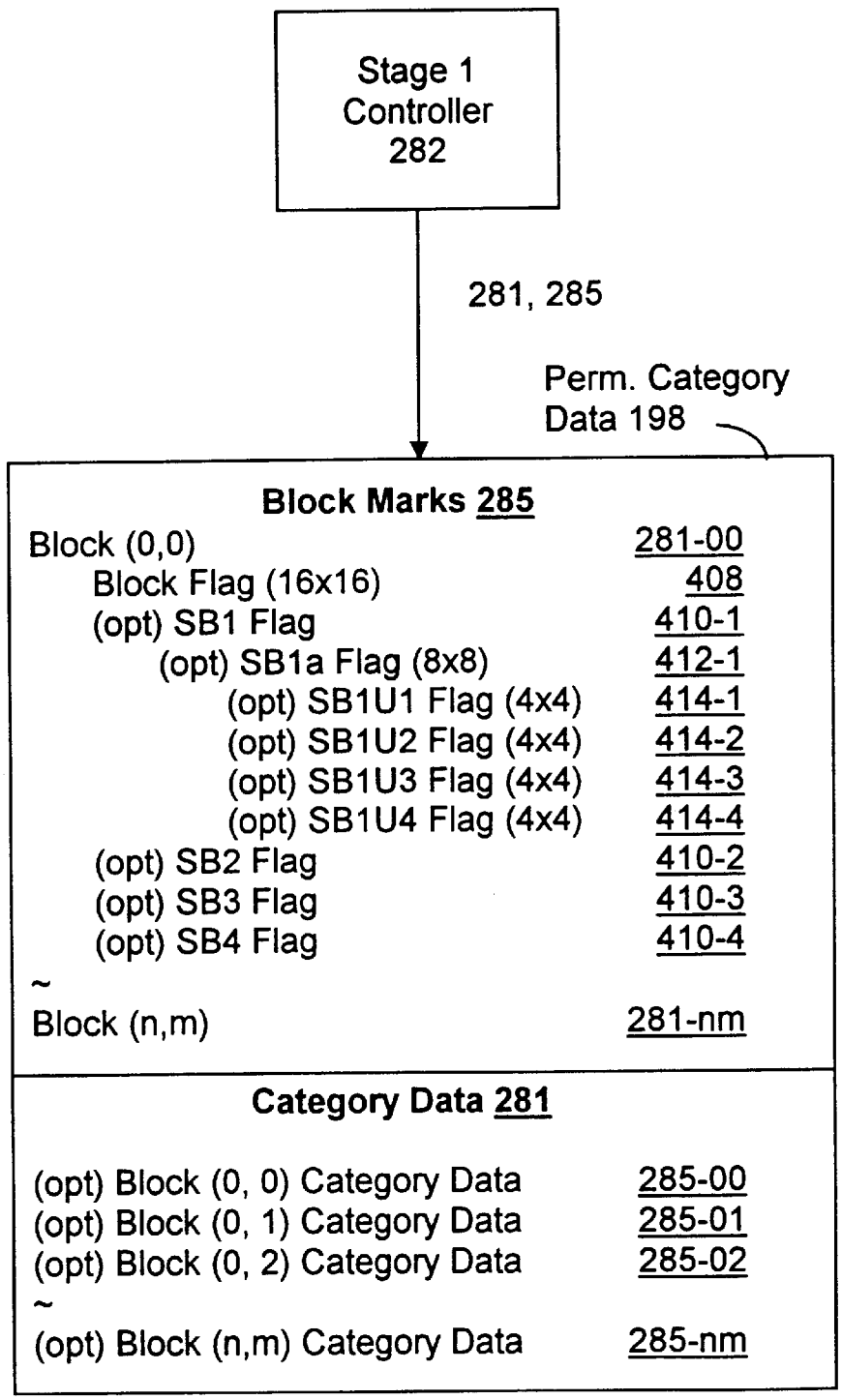
FIG. 8B depicts the structure of the permanent category data 198.

As shown in FIG. 8B, the stage 1 controller 282 writes the block mark 285-ij and category data 281-ij for a particular block (i,j) to the permanent category data 198. A block mark 285 conveys the same information as a block mark 321 (FIG. 5B) from the temporary similarity data 192 (i.e., block flags 408, sub-block flags 410, 8×8 flags 412 and unit flags 414). The permanent category data 198 has the same general structure as the compressed data 323 (FIGS. 5A, 5B) except that the compressed data 323 (FIG. 5A) is formed from Huffman data 301 output by the stage 2 compressor in response to the compressed category data 281.

Upon being called by the exec 270, the stage 1 controller 282 scans the block marks 192-5 in the temporary similarity data 192 to identify a block that has at least one sub-block that needs to be updated using the indicated frame update procedure 268. The stage 1 controller then passes the update procedure 268 and the address 283 of a sub-block to be compressed to the S1 update processor 286. The S1 update processor 286 steps through the new data 180 for the identified sub-block and compresses according to the indicated update procedure 268 selected pixel elements using pixel element data from the on-screen data 170 and an appropriate encode table or tables 210. As described below in reference to Table 1, the encode tables 210 comprise nine encode tables 210-0, . . . , 210-9, each of which provides a different mapping of pixel elements to 3-bit categories.

The S1 update processor 286 compresses a particular new pixel element by performing a lookup into the appropriate encode table 210 using the current value ("CV") of the element, a previous value ("PV") derived from neighboring pixel element values stored in the on-screen data 170 and a table select signal ("tableSel").

The tableSel signal indicates which of two tables 210 is to be used for the lookup. For each lookup the S1 update processor 286 reads out a category (Cat) 211 and a 5-bit output value (OV) 213 stored in the selected encode table 210 at a 10-bit address corresponding to the combination of the previous value PV and the current value CV. The Cat 211 and the OV 213 are fed back to the S1 update processor 286, which determined whether any additional stage 1 update processing is required for that element. If so, the S1 update processor 286 reads out a second Cat 211 and OV 213 by performing a second lookup in the same or different encode table 210. This two-step lookup process is referred to herein as a "recursive lookup." The category 211 is returned to the stage 1 controller 282, which adds it to the category stream 281.

When the update procedure 268 is set to 0 or 1 (the highest quality update procedures), the category stream 281 includes 4, 3-bit categories. For these cases, each time it fills the category stream 281 (which is when it has written 4 categories) or when it is done processing a sub-block, the controller 282 writes the contents of the category stream 281 to the permanent category data 198. When the update procedure 268 is set between 2 and 5 (the lower quality update procedures), the category stream 281 is the same as a single 3-bit category 211. For these cases, the controller 282 individually writes each 3-bit category 211/281 to the permanent category data 198.

Figure 8C:
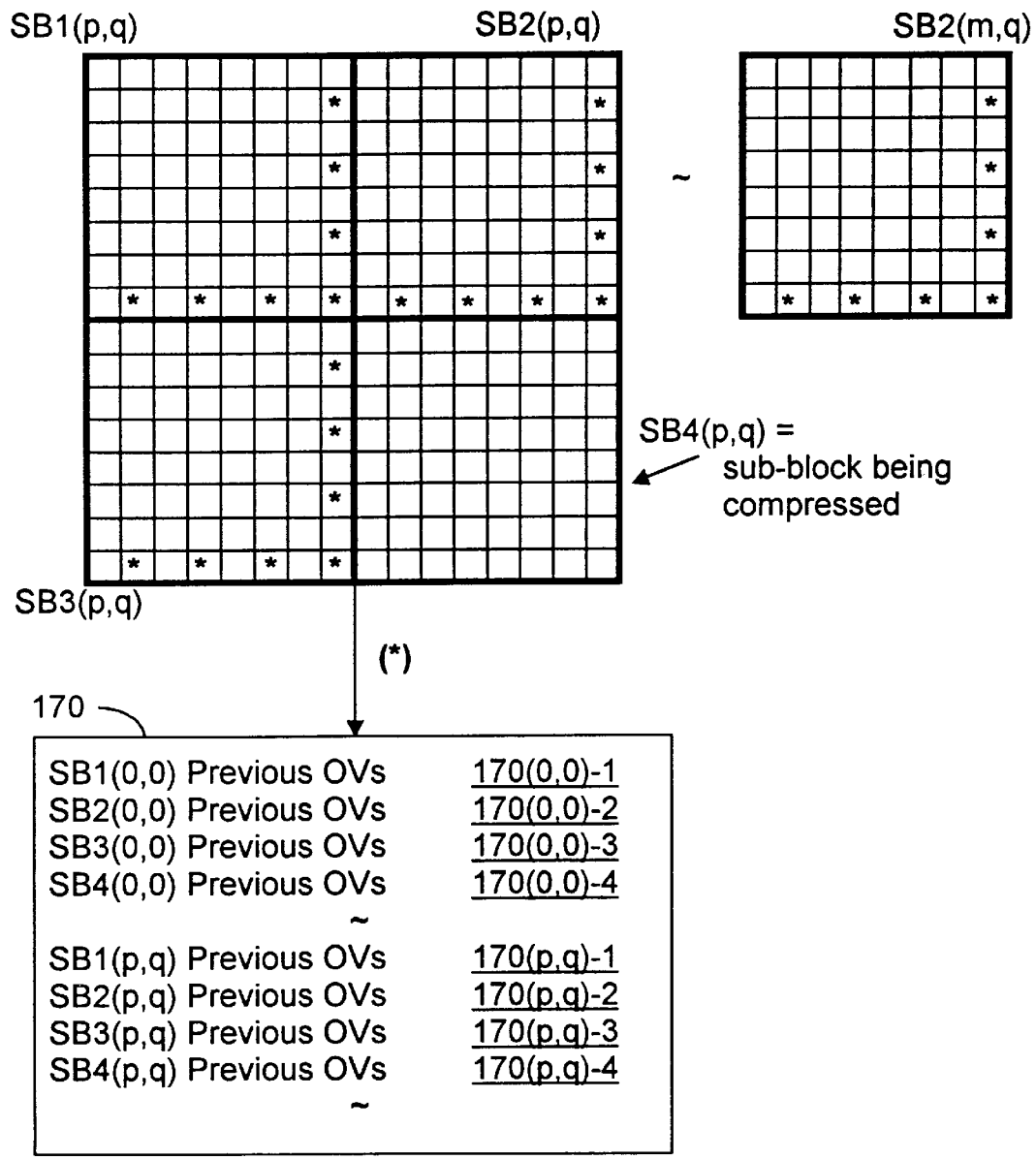
FIG. 8C is a block diagram illustrating the on-screen positions of pixels whose output values are stored in the on-screen data array 170.

As shown in FIG. 8A, the S1 update processor 286 writes the output values OV for selected pixels to the on-screen data 170. Referring to FIG. 8C, there is shown an illustration of the pixels (marked with a "*") from the new data array 180 for which OVs 213 read out from an encode table 210 are stored in the on-screen data 170. As is described below in reference to FIGS. 9A–9D, the previous values (PV) used to form the lookup address for a given sub-block are computed by the S1 update processor 286 from new data 180 from the given sub-block and all or a subset (depending on the frame update procedure 268) of the marked on-screen data 170 from the two sub-blocks immediately to the left and above the given sub-block. For example, given that the sub-block SB4 of block (p,q) is being compressed, the update processor 286 would compute the PVs based on the on-screen data 170 for the pixels marked with a "*" in SB2 and SB3 of block (p,q).

However, note that SB4's neighboring sub-blocks SB2 and SB3 might not have been updated during the current temporal processing cycle. As a result, there is a need to always maintain in the on-screen data 170 the most current on-screen data for each sub-block. Consequently, in the preferred embodiment the on-screen data is not cleared after each temporal processing cycle. Additionally, enough storage is provided in the on-screen data 170 to accommodate the marked ("*") pixels for each block and sub-block represented in a frame. As a sub-block is updated, the S1 update processor 286 overwrites its existing on-screen data with the 5-bit output values OV read out from the encode tables 210 during the current cycle.

Most of the processing performed by the S1 update processor 286 is the same for the red (R), green (G) and blue (B) pixel elements. However, for some frame update procedures 168 the manner differs in which the processor 286 computes the previous values PV and current values CV for the R, G and B pixel elements. For example, the PVs for R and B pixel elements are predicted, whereas the PVs for G pixel elements are computed directly from G elements in the new data 180. The processing performed by the processor 286 is now described for the six different frame update procedures 268 that are supported by the preferred embodiment.

Extra-High (EH) Quality Processing (Update Procedure 268=0)

Figure 9A:
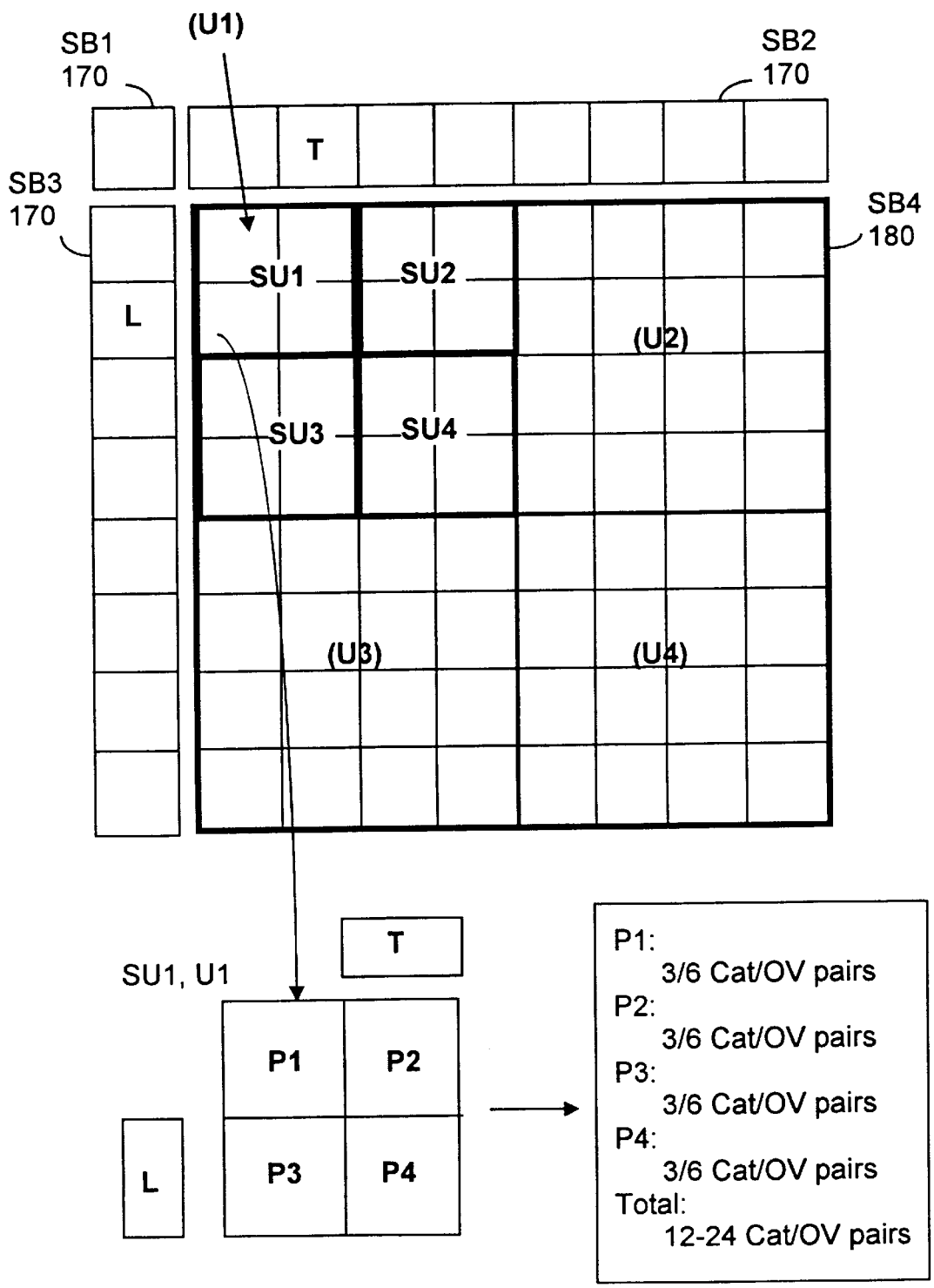
FIG. 9A shows a generic sub-block of new data 180 that is being compressed at the extra-high (EH) level by the stage 1 compressor 280 and some of the resulting outputs.

A goal of the extra-high (EH) update procedure is to deliver a near-lossless image with a data compression ratio of approximately 3:1. To achieve the desired quality, every pixel of a sub-block that is to be updated is compressed individually. Referring to FIG. 9A, there is shown a diagram of a sub-block SB4 to being updated, its constituent units U1–U4 and portions of the neighboring sub-blocks SB1, SB2 and SB3. Each unit has four sub-units SU1–SU4 and each sub-unit has four pixels P1–P4. The boxes marked "T" and "L" correspond, respectively, to pixels from units to the immediate top and left of the current unit that are used to compute some of the previous values (PV) for the SU1 update.

For each pixel element, a 5-bit previous value PV and 5-bit current value CV are computed. The listing below shows how the PVs and CVs are computed for each of the 12 pixel elements in a sub-unit. For the pixels P2, P3 and P4 the output values OV from previous lookups are used to compute the PVs. For example, the just-computed output values of the pixel P1 (OV1) are used to compute the PVs of the pixel P2. The pixels are processed in the following order:

| Pixel 1 (R, G, B): | PV = (L + T)/2 |
|---|---|
|  | CV = P1 |
| Pixel 2 (R, G, B): | PV = (OV1 + T)/2 |
|  | CV = P2 |
| Pixel 3 (R, G, B): | PV(R, G, B) = (OV1 + L)/2 |
|  | CV = P3 |
| Pixel 4 (R, G, B): | PV = (OV2 + OV3)/2 |
|  | CV = P4 |

As shown above, for each pixel Pi (i=1, 2, 3 or 4) the S1 update processor 286 computes the R, G and B PVs by averaging corresponding element values from the nearest pixels to its left and top. Each R, B and G CV is simply derived from the corresponding element value.

For the G elements, the S1 update processor 286 always forms the 10-bit lookup address for reading out Cat/OV pairs using the G CVs and PVs. However, for the R and B elements, the lookup address can be formed from the R and B CVs and PVs (as done for the G elements) or from the R and B CVs and a respective predicted value RPredV, BpredV.

As shown below, if for a given pixel Pi the G OV and PV are not sufficiently close (indicating change in the G element data in the neighborhood of the pixel Pi) then the S1 update processor 286 extrapolates predicted values for the R and B elements of the same pixel Pi based on the R and B PVs previously computed for those elements and the corresponding G PV and CV. Otherwise, the S1 update processor 286 simply uses the previously computed PV for the subsequent lookup. These steps are summarized in the following psuedocode fragment:

```
If |Gi - GiPV| > 1, then
    for the pixel Pi, use predicted values RPredV, BPredV for
    the lookup, where
        RPredV = Gi - GPV + RPV; and
        BPredV = Gi - GPV + BPV;
else
    use the RPV and the BPV values for the lookup.
```

Once it has computed the PV/CV pairs for a pixel's elements (hereinafter, except where specifically noted, the term "PV" shall also include a predicted value "PredV" used for a lookup) the S1 update processor 286 computes the corresponding Cat/OV pair as follows (each of these steps applies to all three pixel elements):

(1) Perform the following computation on L and T pixel element values to determine which of two encode tables (coarse or fine) is to be used for the first lookup on a PV/CV pair:

```
if |L - T| > 1, then
    set tableSel = coarse (i.e., use a coarse table for the
    lookup); and
    go to step 5;
else set tableSel = fine; and
    go to step 2.
```

(2) If tableSel=fine, then
  perform a 10-bit lookup into the encode table 210-0 (the fine encode table for the EH update procedure) using as the 10-bit lookup address the concatenation of PV and CV (hereinafter represented as "PV|CV"); and
  write the resulting Cat 211 and OV 213 to the on-screen data 170 and the category output 281, respectively.

(3) If the resulting Cat 211 is less or equal to 4, then proceed to the next element for the same pixel or, if all elements have been processed, compute the PV|CV pairs for the elements of the next pixel as described above.

(4) If the resulting Cat 211 is greater than 4, then set the encode tableSel=coarse and proceed to step 5.

(5) If the tableSel=coarse, then
  perform a lookup into the encode table 210-1 (the coarse encode table for the EH update procedure) using as the lookup address the concatenation of the OV 213 from the previous lookup and the PV from the first lookup (i.e., OV|PV); and
  write the resulting Cat and the corresponding OV to the on-screen data 170 and the category output 281.

(6) If the lookup in the coarse table was the first lookup for the pixel element and the resulting Cat 211 was less or equal to 4, then proceed to the next element;
  else if the resulting Cat 211 was greater than 4, then set the encode tableSel=coarse and repeat step 5. If the lookup in the coarse table was the second lookup for the pixel element, then proceed to the next element.

The way that the fine and coarse encode tables 210-0 and 210-1 are structured ensures that the final OV 213 (i.e, the OV output after the final lookup for a particular element) never differs by more than 1 from the current input value CV. This ensures near-lossless quality of the compressed image. As a result of the recursive (two table) lookup process, between 12 and 24 Cats are output per sub-unit. Regardless of the number of Cats computed, only 12 OVs (the last computed per element) are stored in the on-screen data 170. It is necessary to transmit to the decompressor 106 the Cat information from both lookups so that the decompressor 106 can decode the Cat information to the correct 5-bit element value for display.

Medium Extra-High (MEH) Processing (Update Procedure 268=1)

Figure 9B:
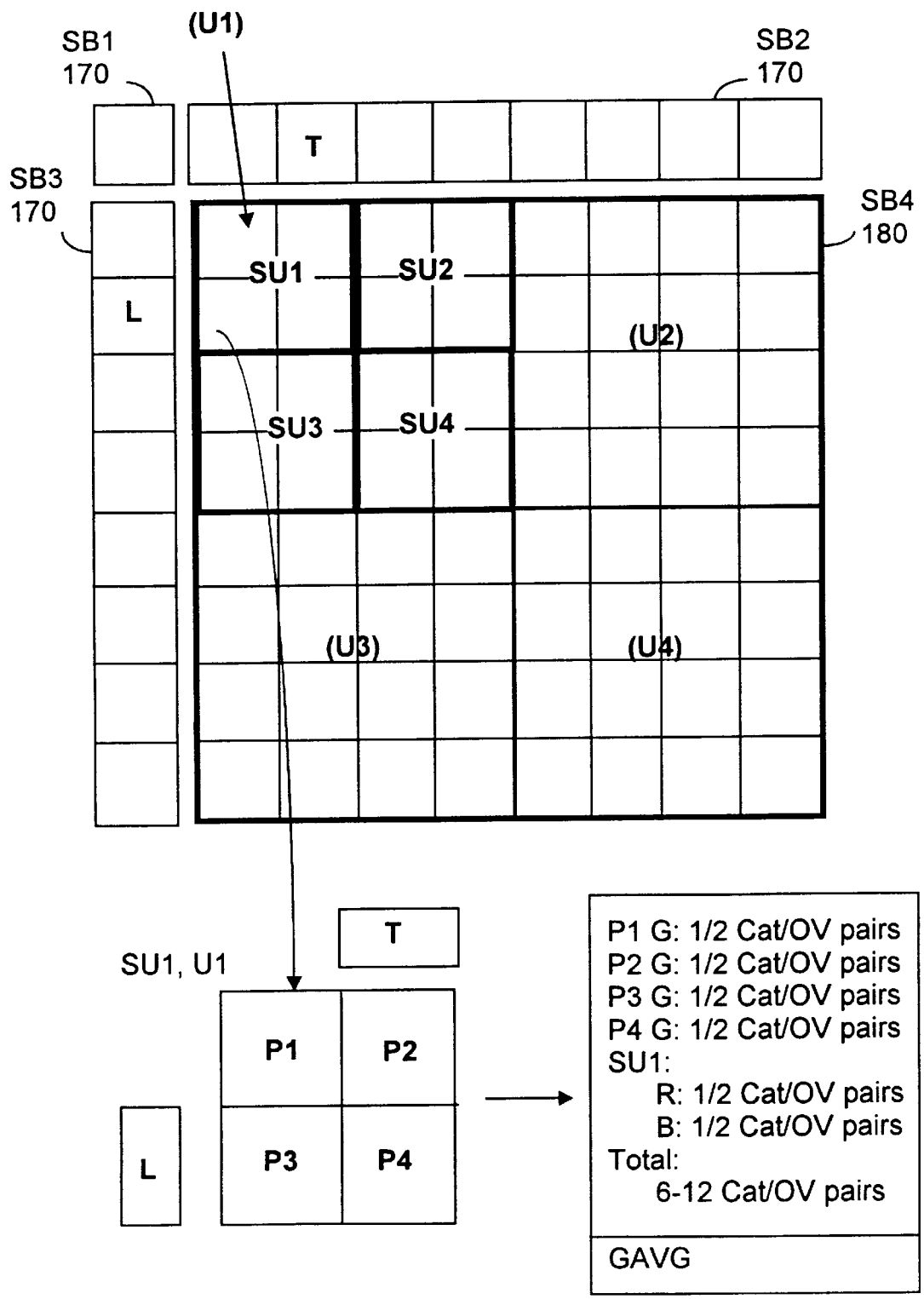
FIG. 9B shows a generic sub-block of new data 180 that is being compressed at the medium extra high (MEH) level by the stage 1 compressor 280 and some of the resulting outputs.

The MEH update procedure provides very high image quality with higher levels of compression (typically, 6:1) than can be achieved for the EH update procedure. The compression operations for this procedure 268 use four times more G data than either R and B data to generate the category and output information 211, 213 for the update. Referring to FIG. 9B, there is shown a diagram of a sub-block to be updated that is similar to that of FIG. 9A.

One difference between FIGS. 9A and 9B is that the L and T boxes in FIG. 9A refer to L and T sub-units, not individual pixels.

For each sub-unit that is to be compressed, the S1 update processor 286 generates between 4 and 8 Cat/OV pairs for the G elements and one or two Cat/OV pairs for each of the R and B pixel elements for that sub-unit. The G PVs and CVs are derived as described in reference to FIG. 9A. Note that when the user quality setting 162 is 1, the same encode tables 210-0 (fine) and 210-1 (coarse) are used as for EH update processing. When the user quality setting 162 is 2, the encode table 210-2 is used for fine lookups and the table 210-1 for coarse lookups. In addition to the Cat/OV pairs, the processor 286 also computes the average (GAVG) of the G elements from the four sub-unit pixels by adding 3 to the sum of the pixel element and then dividing by 4 to account for rounding errors that can occur when doing integer division:

$$GAVG = (R1+R2+R3+R4+3)\ 4.$$

The GAVG is stored in the on-screen data 170 and is used by the update processor 286 to compute the R and B Cat/OV pairs for the current sub-block.

The processor 286 computes the R and B PVs and CVs as follows:

(1) Compute averages RAVG and BAVG of the R and B pixels that compose the subunit:

$$RAVG = (R1+R2+R3+R4+3)/4;$$

and $$BAVG = (B1+B2+B3+B4+3)/4.$$

(2) Compute R and B previous values RPV, BPV for the sub-unit:

$$RPV = (RAVG\ of\ L + RAVG\ of\ T)/2;$$

and $$BPV = (BAVG\ of\ L + BAVG\ of\ U)/2.$$

(3) Determine whether the RPV and BPV values, or predicted values RPredV, BPredV should be used for the lookup operations. This involves testing the difference between GAVG and GPV (where GPV is the average of the average G OVs of the L and T subunits). In particular:

```
If |GAVG - GPV| > 1, then
    use predicted values RPred, BPred for the lookup, where
        RPred = GAVG - GPV + RPV; and
        BPred = GAVG - GPV + BPV;
else
    use the RAVG and BAVG values for the lookup.
```

(4) Determine whether to use a coarse or fine table for the first encoding operation by comparing average element values from the L and T sub-blocks:

```
if |LAVG - TAVG| > 1, then
    use the coarse table for the first lookup;
else
    use the fine table for the first lookup.
```

(5) Do a recursive lookup on the address PV|CV as described above for EH processing using encode tables 210 appropriate to MEH update processing (i.e., tables 210-0 and 210-1 when the user quality setting 162 is 1 and tables 210-2 and 210-1 when the user quality setting 162 is 2); for the MEH As a result of the above-described processing, the processor 286 generates between 6 and 12 Cat/OV pairs.

Shared Processing for Update Procedures 268=2–5

The stage 1 compression processing for the very high (VH) quality update procedure (level 2) and lower quality update procedures (3–5) is quite different from the processing performed for the EH and MEH update procedures. The stage 1 compression procedures for these lower quality levels (2–5) share many common steps, which are now described in reference to FIG. 9C.

Figure 9C:
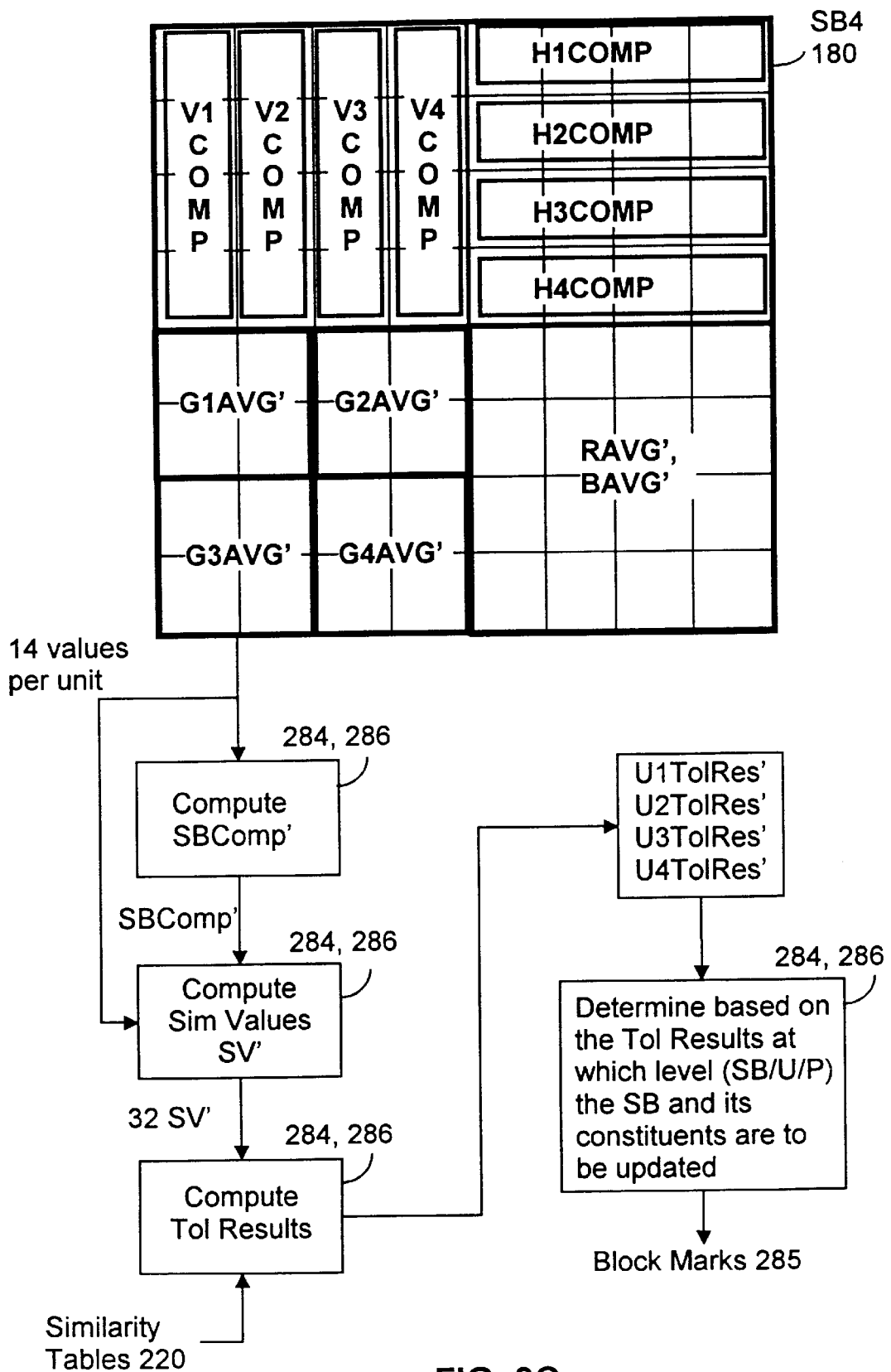
FIG. 9C is a data flow diagram that shows stage 1 compression steps that are performed for the very high (VH), high (H), medium (M) and low (L) quality levels.

Referring to FIG. 9C, there is shown an 8×8 sub-block SB4 that is being updated at one of the quality levels 2–5. As a first step in each of these updates the stage 1 update processor 286 performs a preliminary scan on the sub-block data to establish a group of preliminary values that will be used to determine the level of detail at which the sub-block needs to be updated. The preliminary values include, for each unit in the sub-block:

(1) four composites H1Comp–H4Comp of the 4×1 pixel horizontal strips H1–H4 that compose the unit;

(2) four composites V1Comp–V4Comp of the 4×1 pixel vertical strips V1–V4 that compose the unit (note: for clarity, FIG. 9C shows the vertical and horizontal stripes superimposed on different units; in fact, vertical and horizonal composites are computed for each unit);

(3) four averages G1AVG'–G4AVG' (the prime character (') is used to avoid confusion with similar names used in the discussion of the FFM 260), each representing the average of the 4 G elements that compose a sub-unit (each average is computed as described above);

(4) an average RAVG' of the 16 R elements that compose the sub-unit; and (5) an average BAVG' of the 16 B elements that compose the sub-unit.

These 14 values per unit (56 per sub-block) are stored for each sub-block that has been marked for updating and are used in stage 1 compression 280 as needed.

The processor 286 next computes a composite value SBComp' for the entire 8×8 sub-block as follows:

(1) add together the R, G and B element values for all pixels in the sub-block;

(2) truncate the result to 7 bits (using the 7 significant bits); and (3) store the 7-bit truncated result as the sub-block composite SBComp'.

The S1 update processor 286 then computes 32 similarity values SV' representing the differences between each of the 32 vertical and horizontal composites and the sub-block composite value SBComp. The processor 286 computes the 32 similarity values SV' in the same manner as the FFM 260, which is described in reference to FIGS. 7A–7C. Briefly, the steps of one similarity lookup procedure include:

(1) computing the 8-bit difference of the 7-bit SBComp' and one of the 7-bit composites (e.g., V1Comp);

(2) using the resulting 8-bit value as the lookup address into the appropriate similarity table 220;

(3) performing a lookup into the appropriate similarity table using the 8-bit lookup address; and (4) storing the 8-bit output from the similarity table 220 as one of 32 similarity values SV' for the sub-block being updated.

As with the FFM 260, the S1 update processor 286 selects a similarity table 220-$i$ by computing i=(user quality setting 162)/2. E.g., if the user quality setting is 14, the processor 286 selects the similarity table 220-7.

Once the 32 similarity values have been computed, the update processor 286 determines whether the sub-block needs to be updated at the 8×8 (sub-block), 4×4 (unit) or 1×1 (pixel) level. This process includes:

(1) if the similarity values for the 4 units that compose a sub-block are all less than or equal to 4, updating the sub-block at the 8×8 level (this is because the characteristics of the constituent units are not significantly different from the sub-block as a whole);

(2) else if at least one of the similarity values is greater than 4, computing the bitwise OR of the 8 similarity values SV' for each unit (this provides one tolerance result for each unit in the sub-block) and comparing each unit's tolerance result to a predetermined threshold (in the preferred embodiment, the threshold is 4);

(4) if a unit's tolerance result is less than or equal to 4, updating that unit at the 4×4 (unit) level;

(5) else if a unit's tolerance result is greater than 4, updating that unit at the 1×1 (pixel) level;

After each sub-block has been scanned, the processor 286 updates the block marks 285 (FIG. 8B) for the block/sub-block being updated. The block marks 285, which are stored in the permanent category data 198 along with the stage 1 category data 281, are organized as described in reference to FIG. 5B. For each block that includes a sub-block that is being updated the corresponding block flag 408 is set to 1; otherwise, the block flag is set to 0. For each sub-block that is being updated, the corresponding sub-block flag 410 is set to 1 and the 8×8 flag 412 is set to 0 to indicate that the sub-block is being updated at the 8×8 level or to 1 to indicate that the sub-block is being updated at the 4×4 level or lower. When the 8×8 flag 312 is set to 1, the optional unit flags 414 are set to 0 or 1 to indicate that the corresponding unit is being updated at the 4×4 or pixel level, respectively. These flags are set in accordance with the evaluation of the tolerance results described above.

The preceding steps are common to each of the quality levels 2–5. The subsequent stage 1 compression steps differ between each of the quality levels 2–5, although all share certain similarities. The subsequent steps employed for the very high quality level (2) are now described, followed by descriptions of the high (H), medium (M) and low (L) quality levels of stage 1 compression 280.

Very High (VH) Quality Processing (Update Procedure 268=2)

Figure 9D:
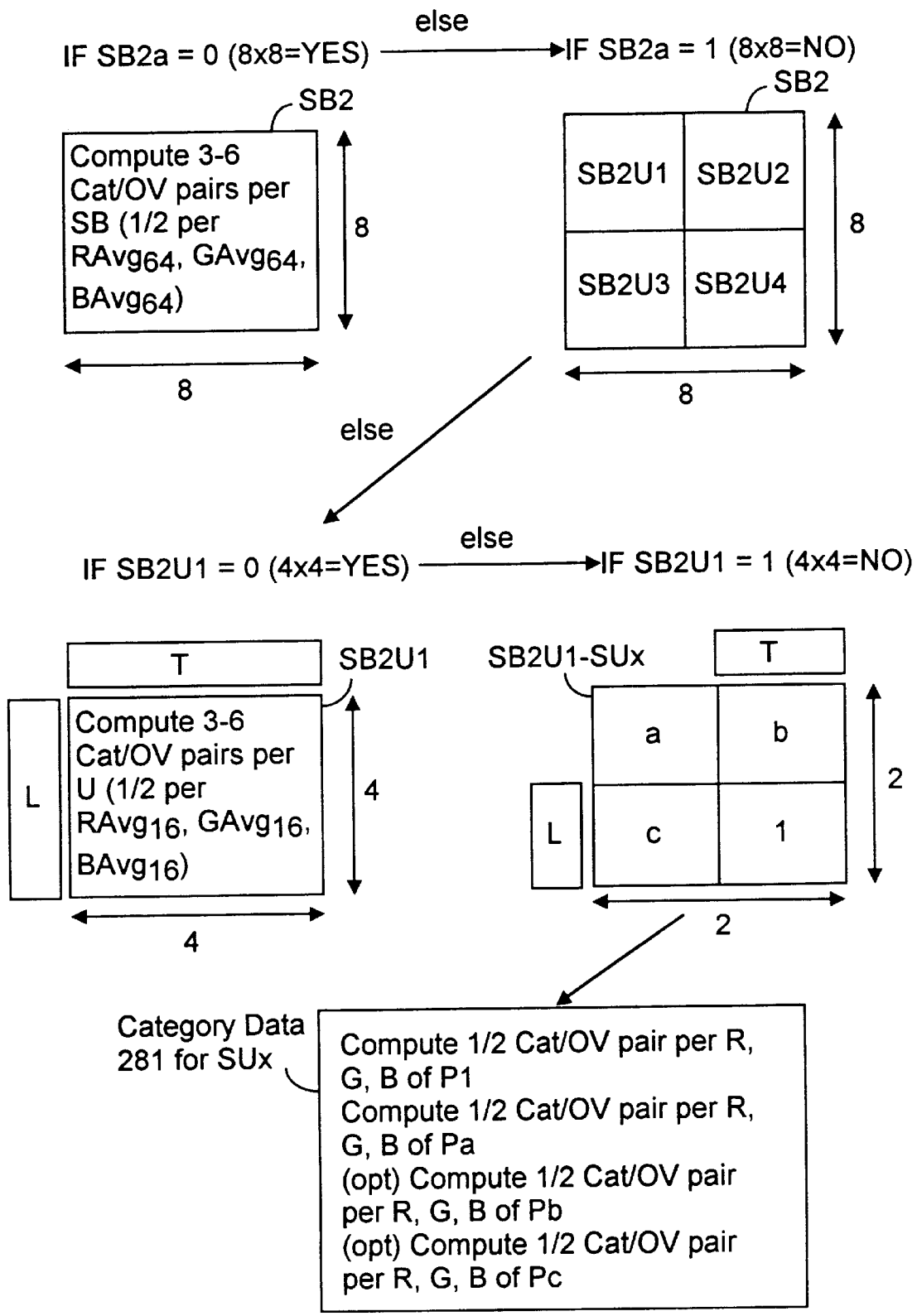
FIG. 9D shows a generic sub-block of new data 180 that is being compressed at the very high (VH) level by the stage 1 compressor 280 and some of the resulting outputs.

Referring to FIG. 9D, there is shown a data flow diagram depicting the subsequent stage 1 compression steps for the VH quality level as performed on a representative sub-block SB2 and unit SB2U1. As the first step (not shown), the processor 286 scans a block mark 285 (FIG. 8B) to determine whether the corresponding block is to be updated. If the mark's block flag 408 indicates that the block is to be updated, the processor 286 checks each of the block's sub-block flags (SB1 Flag, SB2 Flag, SB3 Flag, SB4 Flag) 410 to determine whether the corresponding sub-blocks are to be updated (this step is also not shown). If a sub-block (e.g., SB2) is to be updated (indicated by the corresponding sub-block flag 410 being set to 1), the processor 286 checks the sub-block's 8×8 flag 412 (e.g., the SB2$a$ Flag) to determine whether the sub-block is to be updated at the 8×8 level (SB2a Flag=0) or lower (SB2$a$ Flag=1).

For each sub-block to be updated at the 8×8 level, the processor 286 computes between three and six Cat/OV pairs based on the sub-block's RAVG', BAVG', and GAVG' values (FIG. 9C). In particular, single sub-block averages $RAVG_{64}$, $BAVG_{64}$, and $GAVG_{64}$ are computed from the sub-block's 4 RAVG', 4 BAVG' and 16 GAVG' values as follows:

$$RAVG_{64}=AVG(R1AVG, R2AVG, R3AVG, R4AVG);$$

$$BAVG_{64}=AVG(B1AVG, B2AVG, B3AVG, B4AVG);$$

$$GAVG_{64}=AVG(G1AVG, \ldots, G16AVG);$$

After this point, the process of computing the Cat/OV pairs corresponding to the sub-block averages is similar to that described above for the MEH quality level. I.e., current values (CV) are taken directly from the $RAVG_{64}$, $GAVG_{64}$ and $BAVG_{64}$ values. Corresponding previous values (PV) are computed for the R, G and B pixel elements using data from neighboring sub-blocks; as described for MEH update processing, where appropriate, R and B PVs are replaced for lookup purposes by predicted values RPredV, BPredV. Recursive (two table) lookup procedures into the appropriate encode tables 210 are performed using the computed PV/CV pairs. As described above for the MEH quality level, if two lookups are used for each of the sub-block averages six Cat/OV pairs will be generated for the entire sub-block. If one lookup is used per sub-block average, only three Cat/OV pairs result. In particular, the encode table 210-0 is used for fine lookups and the encode table 210-1 is used for coarse lookups.

If the sub-block is being compressed at the 4×4 level or lower, the processor 286 visits each of the sub-block's unit flags 414 (e.g., the SB2U1 Flag) to determine whether the corresponding units are to be compressed at the 4×4 or 1×1 level. For each unit that is to be compressed at the 4×4 level (indicated by the unit flag 414 being set to 0), the processor 286 computes between 3 and 6 Cat/OV pairs. The procedure used to compute these Cat/OV pairs is similar to that described for the 8×8 update except for differences due to the smaller number of pixels in a 4×4 unit. In particular, instead of computing sub-block averages, the processor 286 computes unit averages $RAVG_{16}$, $BAVG_{16}$, $GAVG_{16}$ for each unit being updated at the 4×4 level as follows:

$$RAVG_{16}=RAVG';$$

$$BAVG_{16}=BAVG';$$

$$GAVG_{16}=AVG(G1AVG', \ldots, G4AVG).$$

As at the 8×8 level, prediction is applied to the R and B data where appropriate; the different numbers of Cat/OV pairs are due to the possibility of a recursive lookup. As with the 8×8 level, the encode table 210-0 is used for fine lookups and the encode table 210-1 is used for coarse lookups.

If it is necessary to step within an 4×4 unit to compress the data at the pixel (1×1) level (indicated by the unit flag 414 being set to 1), the processors re-scan the new data 180 at the pixel level. In particular, for the VH quality level, at least 50% of the pixels are used to generate the category data 211. The R and B elements are never used at the pixel level; neither are recursive lookup procedures employed. All of the information generated for the 4×4 level (e.g., the 3–6 Cat/OV pairs computed for the $RAVG_{16}$, $BAVG_{16}$, $GAVG_{16}$ values) is retained in addition to the results from pixel level compression. The pixel-level compression operation is now described in reference to FIG. 9D.

The sub-units SU1–SU4 within a unit (e.g., SB2U1) being compressed at the pixel level are processed in turn. Within each sub-unit SUx, the pixels for the purposes of this discussion are designated as P1, Pa, Pb and Pc. Pixels T and L are from the sub-units that are to the immediate left and top of the sub-unit being compressed. The steps of the pixel-level processing are as follows:

(1) compute Cat/OV pairs for P1 and Pa as described above except that no recursive lookup is used and only G pixel elements are compressed; use the encode table 210-3 for the P1 lookup and the encode table 210-4 for the Pa lookup (the PV for the lookups is the OV computed for the GAVG$_{16}$ value in the 4×4 compression operation);

(2) compute the average AVGU1 of P1 (taken twice), Pa and T:

$AVGU1=(P1+P1+Pa+T+3)/4;$ (3) using the similarity tables, compute similarity values that represent comparisons between:
P1 and AVGU1;
Pa and AVGU1;
T and AVGU1;

(4) compute the bitwise OR of the similarity values computed in step 3;

(5) compare the result of the bitwise OR computed in step 4 to a predetermined threshold (in the preferred embodiment, this is set to the same threshold 266 used by the FFM 260);

(6) if the result of the bitwise OR is less than the threshold, then do not update Pb;

(7) if the result of the bitwise OR is greater than or equal to the threshold, then update Pb as follows;
  (a) compare Pb to P1 using the similarity tables as described above;
  (b) if Pb and P1 are close (i.e., if their difference is less than the threshold), then set the category of Pb to 0 (note: setting a pixel's category to 0 indicates that the pixel's value is close to the value of its neighboring pixel);
  (c) if Pb and P1 are not close, then perform a lookup for Pb and compute a corresponding Cat/OV pair; use the encode table 210-4 for this lookup;

(8) repeat steps (2)–(7) to determine how to update Pc (the only modifications required to compute Pc rather than Pb are to use the P1, Pa and L values instead of the P1, Pa and T values); also use the encode table 210-4 for this lookup.

Note that, for the VH update procedure, the previous value PV used to compute the Cat/OV pair for the pixel P1 is GAVG.

High (H) Quality Processing (Update Procedure 268=3)

The high quality processing performed by the S1 update processor 286 is nearly identical to that already described in depth for the very high (VH) quality level. Characteristics of the high quality processing include:

(1) when a sub-block is being updated at the 8×8 level, processing is performed as described for the VH quality level;

(2) when a sub-block is being updated at the 4×4 level, R and B data is not used at all; the G data is handled as described for the VH level;

(3) when a unit is being updated at the 1×1 level, R and B data are again not used; the G data is handled in the same manner as described for the VH quality level; differences at the 1×1 level include:
  a) P1 is compressed, when the user quality setting 162 is 6, using the lookup table 210-3;
  b) P1 is compressed, when the user quality setting 162 is 7, using the lookup table 210-4;
  c) When the user quality setting 162 is 6 or 7, Pa, Pb (optional) and Pc (optional) are compressed using the lookup table 210-4.

Note that the above description only refers to the encode tables 210 that are employed by the update processor 286 for the H update procedure when the user quality setting 162 is 6 or 7. As mentioned above, depending on the available bandwidth, the high (H) quality update procedure can also be applied (perhaps alternating with the medium (M) and/or low (L) quality update procedures) to a frame update when the user quality setting is between 8 and 15. For the set of user quality settings 162 between 8 and 15 the encode table 210 employed for the H, M and L update procedures 268 is determined solely by the user quality setting (i.e., regardless of the quality level of the update procedure 268). To clarify the application by the S1 update processor 286 of the various encode tables 210 the following table is provided. This table sets out for each of the 16 user quality settings 162:

(1) its associated frame update procedure(s) 268;

(2) the encode tables 210 used for fine and coarse recursive lookups (these are also the tables used to compress sub-block (SB) and/or unit (U) data for the lower quality update procedures 268); and (3) for the lower quality procedures the encode tables 210 used respectively to compress high priority and low priority pixels from within a sub-unit (where appropriate, the high and low priority pixel indices are shown—e.g., for the user quality setting 3, the encode table 210-3 is used to compress the pixel P1).

TABLE 1

DESCRIPTION OF ENCODE TABLES 210

| User Quality Setting 162 | Frame Update Proc. 268 | Fine/Coarse Tables (SB&U) | Pixel-high Tables | Pixel-low Tables |
| --- | --- | --- | --- | --- |
| 0 | 0 (EH) | 0/1 | n/a | n/a |
| 1 | 1 (MEH) | 0/1 | n/a | n/a |
| 2 | 1 (MEH) | 2/1 | n/a | n/a |
| 3 | 2 (VH) | 0/1 | P(1): 3 | 4 |
| 4 | 2 (VH) | 0/1 | P(1): 3 | 4 |
| 5 | 2 (VH) | 0/1 | P(1): 3 | 4 |
| 6 | 3 (H) | 0/1 | P(1): 3 | 4 |
| 7 | 3 (H) | 0/1 | P(1): 4 | 4 |
| 8 | 3, 4 (H,M) | 0/1 | 4 | 4 |
| 9 | 3, 4, 5 (H,M,L) | 2/1 | 4 | 4 |
| 10 | 3, 4, 5 | 2/1 | 4 | 5 |
| 11 | 3, 4, 5 | 2/1 | 4 | 6 |
| 12 | 3, 4, 5 | 9/1 | 4 | 6 |
| 13 | 3, 4, 5 | 9/1 | 4 | 6 |
| 14 | 3, 4, 5 | 7/7 | 7 | 7 |
| 15 | 3, 4, 5 | 8/8 | 8 | 8 |

Having set out the manner in which the encode tables 210 are applied, the medium and low quality update procedures 268-4, 268-5 are now described.

Medium (M) Quality Processing (Update Procedure 268=4)

The medium quality processing performed by the G and RB processors is nearly identical to that performed for high quality processing. Differences between the stage 1 processing at these two quality levels include:

(1) when a unit is being updated at the 1×1 level, the G data is handled in the same manner as described for the H quality level except that data from the pixels Pb and Pc are not used; and (2) the pixel Pa is used but, similar to the treatment of the pixels Pb and Pc for the high (H) quality update, it can be set to 0 if it's value is close to that of P1.

The manner in which data is compressed in medium quality processing requires a special decompression procedure. This is because data from only 50 percent of the pixels are used to generate a frame update at the M quality level. The special procedure is described below.

Low (L) Quality Processing (Update Procedure 268=5)

The low quality processing performed by the G and RB processors is nearly identical to that performed for the medium quality level. Differences between the stage 1 processing 280 at these two quality levels include:

(1) when a unit is being updated at the 1×1 level, the G data from all four pixels P1, Pa, Pb, Pc is averaged; and (2) a single Cat/OV pair is generated using the average computed in step 1 as the current value (CV) for the lookup.

Figure 10:
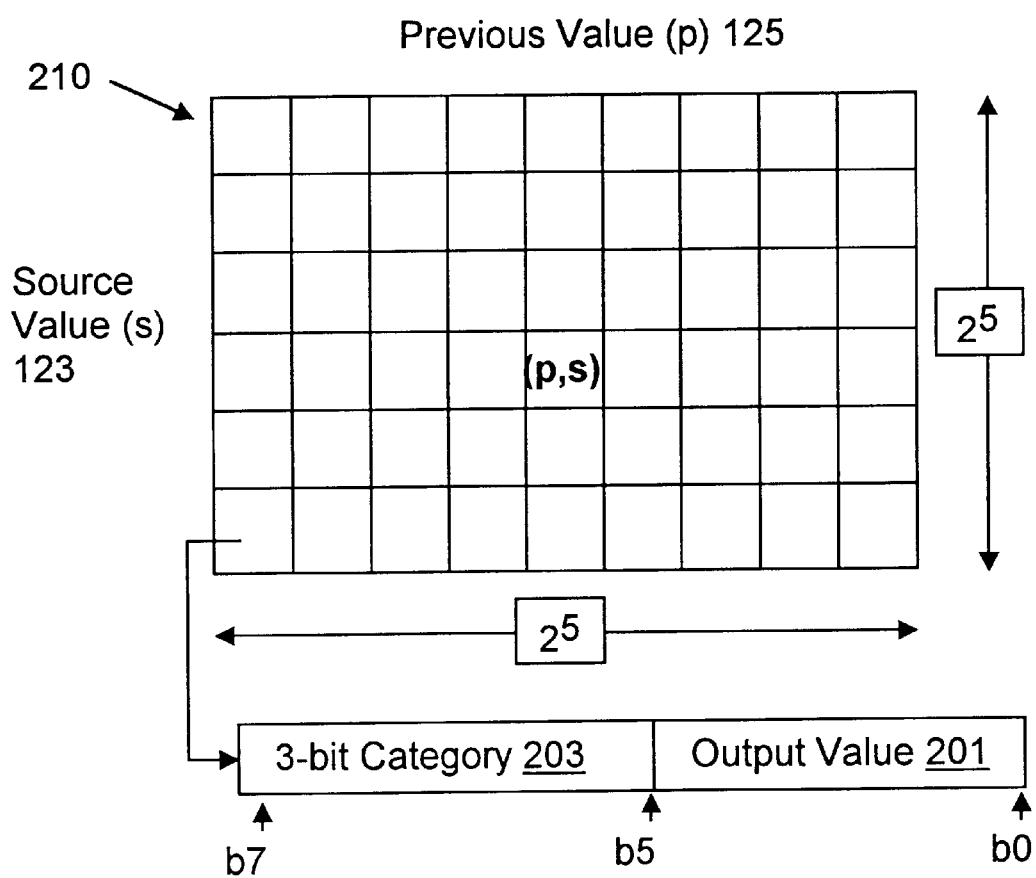
FIG. 10 is a block diagram illustrating the structure of one of the encode tables 210.

Having described how the processor 286 computes the PVs and CVs for the various quality levels, the encode tables 210 are now described in reference to FIG. 10.

Encode Tables 210

Once it has computed a 5-bit PV (or PredV) and 5-bit CV for a respective pixel element, the processor 286 combines those 5-bit values to form a 10-bit address [p, s] (where p corresponds to the PV and s to the CV) which is used to readout a corresponding OV and Category from the entry 210[p,s] of an appropriate one of the encode tables 210. The structure of an encode table 210 is now described in reference to FIG. 10. Note that in the preferred embodiment there are nine tables 210-0 . . . , 210-9 wth slightly different organizations. The table 210 that is shown in FIG. 10 and described below encodes a five bit pixel element with a value ranging from 0–31 as a 3-bit category between 0 and 7.

Referring to FIG. 10, each entry 210[p,s] in a encode table 210 includes a 3-bit category 203 and a 5-bit output value 201. The 3-bit category 203 for an entry 210[p,s] captures the difference between the 5-bit current value (s) 123 and the 5-bit previous value (p) 125. Thus, for the set of entries 210[p,s] where "p" and "s" are identical or similar (e.g., if "p" and "s" are 16; or if "p" is 6 and "s" is 7) the 3-bit category 203 stored in those entries would be 0. In contrast, for entries 210[p,s] where the difference between "p" and "s" is large (e.g., if one is 0 and the other is 31), the 3-bit category 203 for those entries would be 7, or as large as possible. The 5-bit output value 201 represents a quantized version of the source value 123 that is used as a proxy for the actual source value 123 for all compression and decompression stages subsequent to the initial lookup. This quantized 5-bit value 201 is the same for all encode table entries 210[p,s] with the same previous value (p) 125 and category value 203.

For example, consider one row (for p=16) of a encode table 210 used in the preferred embodiment:

| previous val 125 | current val 123 | category 203 | output val 201 |
|---|---|---|---|
| 16 | 0  | 6 | 3  |
| 16 | 1  | 6 | 3  |
| 16 | 2  | 6 | 3  |
| 16 | 3  | 6 | 3  |
| 16 | 4  | 6 | 3  |
| 16 | 5  | 6 | 3  |
| 16 | 6  | 6 | 3  |
| 16 | 7  | 4 | 9  |
| 16 | 8  | 4 | 9  |
| 16 | 9  | 4 | 9  |
| 16 | 10 | 4 | 9  |
| 16 | 11 | 4 | 9  |
| 16 | 12 | 2 | 14 |
| 16 | 13 | 2 | 14 |
| 16 | 14 | 2 | 14 |
| 16 | 15 | 0 | 16 |
| 16 | 16 | 0 | 16 |
| 16 | 17 | 1 | 17 |
| 16 | 18 | 1 | 17 |
| 16 | 19 | 3 | 19 |
| 16 | 20 | 3 | 19 |
| 16 | 21 | 3 | 19 |
| 16 | 22 | 5 | 24 |
| 16 | 23 | 5 | 24 |
| 16 | 24 | 5 | 24 |
| 16 | 25 | 5 | 24 |
| 16 | 26 | 5 | 24 |
| 16 | 27 | 7 | 29 |
| 16 | 28 | 7 | 29 |
| 16 | 29 | 7 | 29 |
| 16 | 30 | 7 | 29 |
| 16 | 31 | 7 | 29 |

Note that there are more common output values 201 for high-numbered categories 203 than for low-numbered categories. This is due to the fact that the current pixel and previous pixel values 123, 125 represent the values of the same color element for neighboring pixels on the CCD 82. Because viewers of the image ultimately displayed from the decompressed data 107 are less likely to notice small alterations between the values of neighboring pixel elements when the original differences between those pixel elements was large, the encode tables 210 use finer resolution in categories 203 and output values 201 for neighboring pixel elements (e.g., current 123 and previous 125 values) that were originally very close in value. Thus, the above example of a encode table row assigns seven different current values 123 (i.e., 0–6), which are as different from the previous value "16" as is possible, the same category "6" and output value "3". In contrast, there are only two current values (15, 16), which are as similar to the previous value "16" as possible. These current values 123 are assigned the category "0" and output value "16". This design of the encode tables 210 is extremely important as it allows an image to be compressed in such a way that important details are not lost.

Note that the categories are assigned so that the 0 category is at the point in the row where the previous value 125 and the current value 123 are most similar, and the other categories are assigned in increasing order on alternating sides of the 0 category.

Complete examples of encode tables 210-0, . . . , 210-9 are shown respectively in Appendices B0–B9. In these table listings, each row includes all table values for a single previous value 125, which in the tables is called "prevRGB". Other information in these tables includes the current value 123 ("inRGB") and the output value 201 ("outRGB") and output category 203 ("out") that correspond to each pair of previous value 125 and output value 123. Note that these tables are used to compress the red, green, and blue color data of a sampled pixel. Each of the tables 210-0, . . . , 210-9 has characteristics that are tailored to the quality levels for which it is used. The manner in which the various tables 210 are employed for the Extra-High (EH), Medium Extra-High (MEH), Very High (VH), HIGH (H), Medium (MED) and Low (L) quality levels has already been described in reference to Table 1.

As an alternative to using tables such as those shown in Appendices B0–B8, the present invention also encompasses a method for generating the encode tables 210 on-the-fly. A preferred "C" language implementation of this method is shown in Appendix C. The concepts underlying the operation of this program should be apparent given the following variable definitions:

categoryCount: a counter of the three bit category data starting at zero;

incrementalStep: a counter that establishes a relationship between the zero category location (i) and subsequent categories;

lowValues: the lowest value used in a category 211;

highvalues: the highest value used in a category 211;

fiveBitOutput: corresponds to a 5-bit output value (OV) 213;

output: eight bit data used in a compression lookup equalling Is3(OV)+categoryCount;

table: an array of 1024 bytes used to store the generated stage 1 encode table 210;

tableEntry: a placeholder used to set the location of the table 210 entry being generated.

As described above, the resulting categories 211 are output to a category stream 281. The stage 1 controller 282 also outputs block marks 285, which reflect the decision of the S1 compressor 280 on how to compress particular sub-blocks or parts of sub-blocks (i.e., units) which were recommended by the FFM 260 for updating. The stage 1 controller 282 can also output a quality level 271Q update to the present highest quality setting for the sub-block being compressed if the spatial compression does not update any units within the sub-bock below the 4×4 pixel level. Of course, these different conclusions of the FFM 260 and the S1C 280 are consistent in that the S1 compressor 280 performs spatial compression and the FFM 260 performs temporal compression 260. The updated block marks 285 and the category output word 281 are written by the S1 controller to the permanent category data 198, where both are processed by the stage 2 compressor 300.

Stage 2 Compressor 300

Stage 2 compression (S2C) 300 converts the category datums 281*i* for sub-blocks with a set bit in a block mark 285-*i* to Huffman datums 301*i* with a variable length that is inversely related to the likelihood of their occurrence. For example, category datums 281*i* whose bit pattern occurs frequently are represented by the S2C module 300 as Huffman datums 301*i* with a small number of bits (e.g, as few as 1 or 2 bits), and datums 281*i* whose content occurs infrequently are represented by the S2C 300 as Huffman datums 301*i* using a larger number of bits. This means that some of the datums 281*i* are actually expanded in the second compression stage (S2). However, because the most likely patterns in the datums 281*i* are associated with Huffman datums 301*i* of very few bits, for typical images (where there is high degree of correlation between adjacent pixels) high levels of compression are achieved by stage 2 compression 300. Operations of the S2C module 300 are controlled by a S2C Controller 302, which generates the Huffman datums 301 by performing 12-bit lookups into a Huffman table 240-0 (for the EH and MEH update procedures) or by implementing a layered Huffman procedure (for the VH, H, M and L update procedures).

The Huffman datums 301*i* are returned to the temporal compression executive 270, which uses them to form the data units 323 of the compressed output data stream 105 (FIGS. 5A, 5B). Because only a fraction of all of the sub-blocks making up an on-screen frame are updated at a time, not all of the sub-blocks are represented by compressed datums 301. The compressed datums 301 from stage 2 compression 300 are simply appended in the order provided at the end of the compressed data stream 105. The manner in which the data from each of the blocks being updated is represented in the compressed data stream 105 is conveyed by the corresponding block marks 321, which are transmitted in the data stream 105 before the compressed data 323. The structure of the block marks 321 has already been described in reference to FIG. 5B; the information content in these block marks is identical to those of the block marks 285 generated by stage 1 compression 280. The following is an example of the compressed data stream 105:
Block Marks:

```
Block (0,0)
   Block Flag = 0                                    321-1
Block (0,1)
   Block Flag = 1                                    321-2
   SB1 Flag = 0
   SB2 Flag = 1
      SB2a Flag = 1
         SB2U1 Flag = 1
         SB2U2 Flag = 0
         SB2U3 Flag = 1
         SB2U4 Flag = 0
   SB3 Flag = 1
      SB3a Flag = 0
   SB4 Flag = 0
Block (0,2)
   Block Flag = 0                                    321-3
etc.
Compressed Data
   Block (0,1)
      Compressed Data {                              323-2
         SB2 Data {
            Unit 1 Data (compressed at the P level)
            Unit 2 Data (compressed at the SU level)
            Unit 3 Data (compressed at the P level)
            Unit 4 Data (compressed at the SU level)
         }
         SB3 Data (compressed at the SB level)
      }
etc.
```

In this data stream, blocks B1 and B3 have no sub-blocks that are being updated; therefore, they are represented solely by the block flags 321-1 and 321-3, which are set to "0". Block B2 has two sub-blocks, SB2 and SB3, that are to be updated. Consequently, the block B2 has sub-block flags SB2 Flag and SB3 Flag set to "1" and SB1 Flag and SB4 Flag set to "0". The SB2*a* Flag is set to "1", indicating that sub-block 2 is to be updated at the 4×4 or 1×1 levels. The unit flags SB2U1–SB2U4 for sub-block 2 indicate that units 1 and 3 are to be updated at the pixel (1×1) level and that units 2 and 4 are to be updated at the sub-unit (4×4) level. The SB3*a* flag is set to "0", indicating that it is to be updated at the 8×8 level. No additional unit flags are required for sub-block 3. Indeterminate-length Huffman codes 323-2 for sub-blocks 2 and 3 of block 2 follow the entire set of block marks 321.

Stage 2 Compression for the Highest Two Quality Levels

How the category data 281 is compressed depends on the quality level 268 at which the update is taking place. The manner in which stage 2 compression is performed for the lower quality levels (VH, H, M, L) is described below. For the EH and MEH quality levels (i.e., for the update procedures 268=0 or 1), the Huffman table 240-0 carries out the stage 2 compression operation 300. The Huffman table 240-0 includes $2^{12}$, 16-bit entries, each of which provides 4-bits for a Huffman bit count 303 and 12-bits for a Huffman value 305. The 4-bit count 303 indicates how many of the other 12-bits are actually used for the Huffman value 305. The 12-bit category data 281 provides the address of the 16-bits of Huffman data to be read out by the Huffman table 300. The 16-bit Huffman data 303, 305 is returned by the S2C 302 to the temporal compression exec 270 in a predetermined order as the compressed data 301.

Huffman Table 240

Figure 11A:
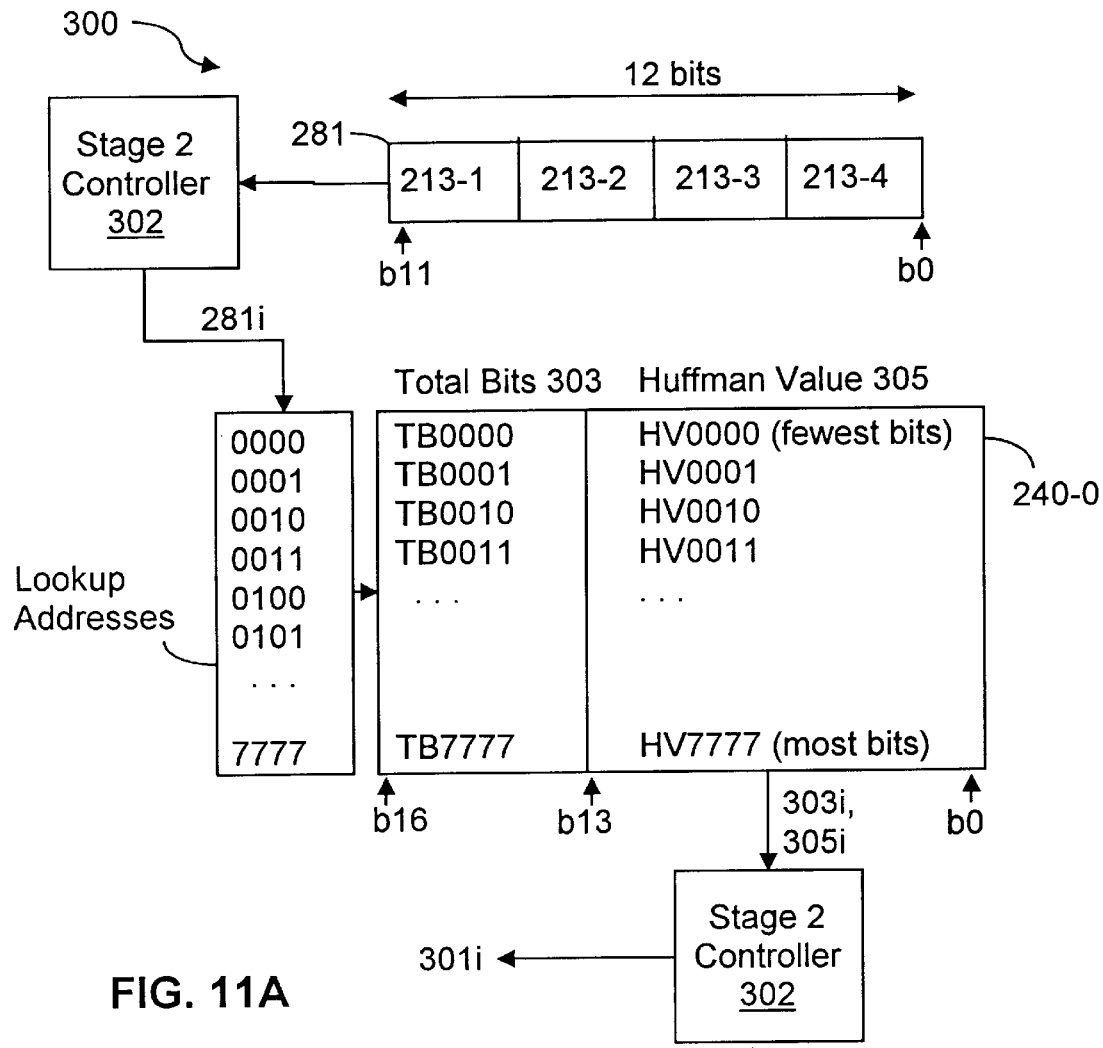
FIG. 11A is a functional block diagram illustrating the operation of the second stage 300 of temporal video compression.

Referring to FIG. 11A, there is shown a block diagram illustrating the structure of a Huffman table 240-0 as implemented in the present invention and the 12-bit category data 281 that is used to perform the Huffman table lookup.

This 12-bit category data 281 represents combined category data for as many as five pixel elements from a single sub-block. Among other things, each Huffman table lookup produces a variable-length Huffman value 305 that characterizes the 12-bit category 281 used for the lookup. In the preferred embodiment, the longest Huffman value is 13-bits, although Huffman values of different lengths could be used. Thus, each Huffman table lookup simultaneously encodes the combined category data for 4 pixel elements. This simultaneous processing (i.e., compression) of 4 pixel elements is unknown in prior art video compression systems (e.g., systems using run-length encoding (RLE) and discrete cosine transforms (DCT)), where each pixel element is separately encoded. These combined categories 281 provide additional levels of compression because, in typical images, pixel elements tend to change very little from pixel to pixel for large portions of the image.

In the Huffman table 240-0, each of the 212 possible 12-bit categories 281 is associated with a Huffman code, or value, 305 whose total number of bits is inversely related to the likelihood of the occurrence of that 12-bit category 281. For example, because repetition is very common in video data (i.e., it is common for large areas of contiguous pixels to have the same color data), the Huffman code 305 with the fewest bits is typically associated in the present invention with the 12-bit value that is represented in octal as 0000 (indicating there was no or nearly no difference between neighboring pixels' element values). Similarly, the Huffman code 305 with the most bits is typically associated with the 12-bit value that is represented in octal as 7777 (indicating there was the largest possible difference between neighboring pixels' element values).

Beyond the general rule that the Huffman codes for more frequent categories have fewer bits than the Huffman codes for the less frequent categories, the present invention generally imposes no strict rules on the ordering of Huffman values that have the same number of bits.

Each Huffman table entry 240i also has a 4-bit field (adequate to encode 16 unique values) that includes a Huffman bit count 303i. The Huffman bit count indicates to the temporal executive 270 how many of the 13 bits that could be used to represent Huffman values are actually used for the Huffman value 305i. Based on this Huffman bit count 303i the executive 270 knows how many Huffman value bits to use to form a word of the compressed output 105. The Huffman bit count also tells the exec 270 how many leading zeros to append to the returned Huffman value. For example, if the bit count 303i is greater than 12, the executive appends 1 leading zero (i.e., 12 bit Huffman values 305 from the table are sometimes used to represent 13-bit output Huffman values). In the preferred embodiment, the Huffman data is right-justified so that it can be easily shifted out by the exec 270.

A portion of a Huffman encode table 240-0 used in an implementation of the preferred embodiment is shown in Appendix DO. This example shows the Huffman values ("Huff") assigned to some of the $2^{12}$ categories 281 ("array val") of the present invention and the number of bits ("bits") associated with those Huffman values. Note that all of the values shown in Appendix E are decimal values. Thus, the array values 1, 8 and 64 all correspond to category values where only one of the constituent 3-bit categories is 1. Consequently, these entries are associated with a small number of bits. The longest Huffman value in this table is 13 bits (associated with many values), while the shortest Huffman values is 4 bits (associated with the 12-bit category whose decimal value is 0). A portion of an 8-bit Huffman encode table 240-1 used in an implementation of the preferred embodiment is shown in Appendix D1.

Various methods of implementing Huffman tables for use in Huffman coding and decoding are well-known. These prior art methods typically use Huffman trees to decode the streams of variable length Huffman data output from the Huffman table. This is a slow process that limits the amount (i.e. resolution) of video data that can be processed in real time. The present invention completely eliminates the need for this slow, tree-based Huffman decoding by encoding as Huffman values 305 the 12-bit categories in such a way that only one or two tables lookups need be performed by the decoder 106 to decode the Huffman data 105.

For an illustration of the present invention's Huffman encoding technique, consider a situation where there are only four values Vi to be encoded (think of these values Vi as representing the $2^{12}$, 12-bit categories). Assume for the present example that the values V1, V2, V3 and V4 are most likely to occur in the order given (i.e., V1 is more likely to occur than V2 and so on). Thus, consistent with well-known Huffman coding principles, the Huffman value 305V1 for the input value V1 should have no more bits than the Huffman value 305V2, and so on. Subject to these constraints, the Huffman values 305 could be assigned in many different ways. One possible Huffman table 240 for encoding the values Vi is as follows:

| Value (Address) | Total Bits | Huffman Value |
| --- | --- | --- |
| V1 | 1 | 1 |
| V2 | 2 | 01 |
| V3 | 3 | 001 |
| V4 | 3 | 000 |

Figure 11B:
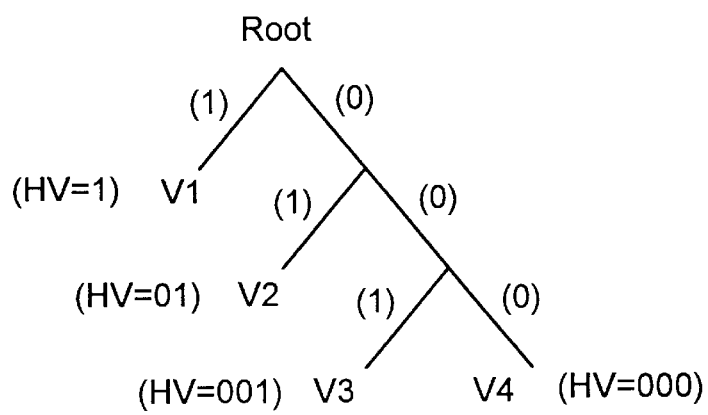
FIG. 11B illustrates a Huffman decode tree used in the prior art to decode variable-length Huffman codes.

Given this Huffman table 240, a traditional Huffman decoder would decode the resulting compressed video stream 105 using a three-level Huffman decode tree wherein the various Huffman values are distributed at different tree levels based on their total bits and contents. For example, the traditional decode tree corresponding to the above Huffman table is shown in FIG. 11B. Given the decode tree of FIG. 11B, the traditional decoder would analyze the video data stream 105 bit-by-bit, starting at the root node of the tree and taking the applicable tree branch based on the state (1 or 0) of the current bit. The value corresponding to the Huffman value being decoded is only discovered when the decoder reaches a leaf node. For example, to decode the Huffman value 001, the traditional Huffman decoder would perform the following steps:

1) read the first bit (0)
2) take the right hand branch;
3) read the next bit (0);
4) take the right hand branch;
5) read the next bit (1);
6) take the left hand branch (to a leaf); and
7) return the leaf value (V3).

In contrast to the prior art, the present invention represents the information needed to decode Huffman values 305 generated by a particular Huffman table 240 in a Huffman decode table 430. The Huffman decode table 430 is a logical construct that can be subdivided into multiple tables; however, for the purposes of this discussion, it shall be assumed that the Huffman decode table 430 is a single table. The Huffman decode table 430 has $2^q$ entries, where q is the maximum length of a Huffman value (q is 13 in the preferred embodiment for a high quality Huffman decode table 430-0 and 8 for a low quality Huffman decode table 430-1). Each entry 430i in the decode table 430 is associated with one Huffman value 305 and includes a Huffman bits field 432 that represents the number of bits in the associated Huffman value 305 and a decoded value field 434 that represents the decoded value or category associated with the same Huffman value 305. Because there are more Huffman table entries ($2^{13}$ in the preferred embodiment for the table 430-0) than values 281 to be decoded ($2^{12}$ in the preferred embodiment for the table 430-0), some of the Huffman values 305 are associated with more than one of the decode table entries. Each of the redundant entries associated with a particular Huffman value 305i has identical information (e.g, number of bits and decoded value) and has a lookup address that in its most significant bits matches the associated Huffman value 305i. For example, the Huffman decode table 430 related to the 4-entry Huffman table presented above (where q is 3) would look as follows:

Huffman Decode Table 430

| Lookup Address | Number of Bits | Decoded Value |
|---|---|---|
| 000 | 3 | V4 |
| 001 | 3 | V3 |
| 010 | 2 | V2 |
| 011 | 2 | V2 |
| 100 | 1 | V1 |
| 101 | 1 | V1 |
| 110 | 1 | V1 |
| 111 | 1 | V1 |

Given this type of Huffman decode table 430, the decompressor 106 is able to decode compressed data chunks 105i q bits at a time (i.e., in a single lookup). For example, using the table 430 shown above, the decompressor 106 decodes any q-bit chunk that begins with a "1" to the input value V1 (because all of the entries associated with Huffman codes beginning with "1" are mapped to the same decoded value V1, the Huffman bits other than the first bit are irrelevant to the value returned by the lookup). Similarly, any q-bit chunk that begins with a "01" pattern is decoded to V2. Once it has decoded a q-bit chunk, the decompressor 106 shifts-out the number of bits used by that decode operation and does a lookup on the remaining bits of the chunk 105i until there are no unprocessed bits left. For example, the decompressor 106 would decompress the variable-length Huffman data stream 105i (101001) in the following set of steps:

1) datum 105i=101001;
2) do a lookup into decode table using first three bits of the datum 105i (101) and output the "decoded value" returned from table (V1);
3) shift the datum 105i contents left by "number of bits" returned from table (1);
4) do a lookup into decode table using first three bits of the datum 105i (010) and output the "decoded value" returned from table (V2);
5) shift the datum 105i contents left by "number of bits" returned from table (2);
6) do a lookup into decode table using first three bits of the datum 105i (010) and output the "decoded value" returned from table (V2); and
7) shift the datum 105i contents left by "number of bits" returned from table (2).

The Huffman decode table 430 and decompression steps performed by the decompressor 106 are discussed below, following a summary of the compression method of the preferred embodiment.

Huffman Compression for Lower Quality Levels

Figure 11C:
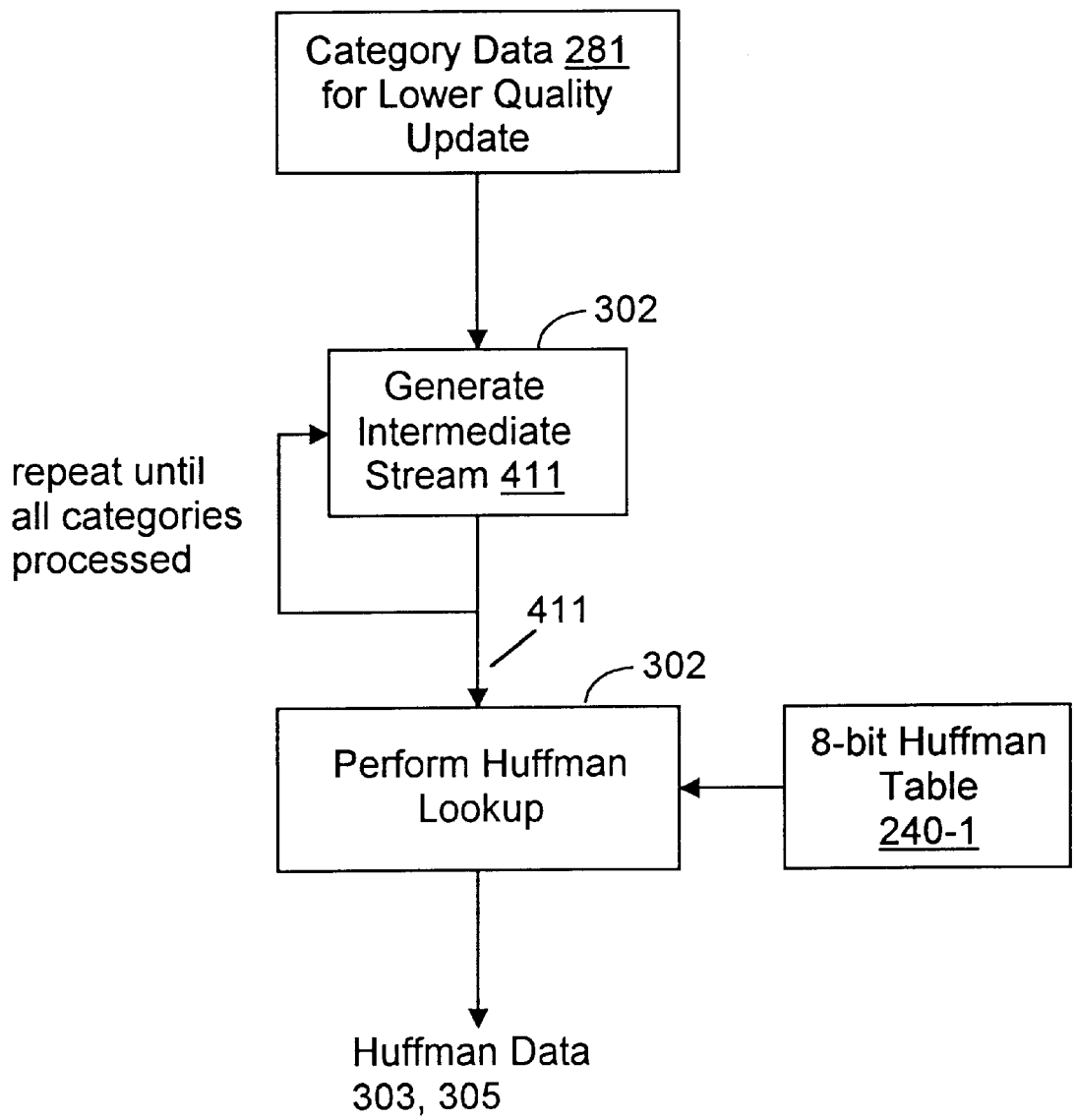
FIG. 11C is a functional block diagram illustrating the data flows for stage 2 compression as applied to lower quality updates.

Referring to FIG. 11C, there is shown a data flow diagram depicting a subset of the stage 2 compression steps for the lower quality levels 168 (VH, H, M, L). As with the higher quality levels (EH, MEH), for the lower quality levels the stage 2 controller 302 assigns the most frequent category data 281 Huffman codes of fewer bits. However, the stage 2 controller 302 does not generate the Huffman data via immediate lookup into the Huffman table 240. Rather, the S2C first generates an intermediate data stream 302 by performing multiple passes (one less pass than the number of categories) over the compressed category data 281. The intermediate stream is then compressed to the Huffman data stream 301 via the Huffman lookup procedure described above except that a different 8-bit Huffman table 240-1 is used for the final compression step. The 8-bit Huffman table 240-1 is structured similarly to the 12-bit Huffman table 240-0; however, there are some minor differences between the tables 240-0 and 240-1 that follow from their different uses. Some different aspects of the Huffman table 240-1 include:

(1) the longest Huffman value is 9-bits; and
(2) the Huffman values are statistically oriented to the bit-wise intermediate stream 411 rather than category data.

As a preliminary step to lower quality Huffman compression, all of the category data 281 is pre-scanned to determine the an order of categories from most to least frequent. This Huffman method provides compression at levels approaching those of arithmetic compression techniques but at faster speeds. Another advantage of the present approach is its adaptivity.

In each pass used to generate the intermediate stream 411 the stage 2 controller 302 encodes the statistically most common category not yet encoded to a "1" or a "0" and the remaining categories to the other 1-bit value. Whether the most common category is encoded to one or the other of the 1-bit values depends on whether that category's likelihood of occurrence divided by the total occurrences of all categories not encoded in the previous pass is less than fifty percent. It is not important to what 1-bit value the most common remaining category is encoded. What is important is that each category is encoded to the same 1-bit value when it's likelihood is respectively less than or greater than fifty percent. This consistency ensures that a particular 1-bit value will predominate in the intermediate data 411, which facilitates greater compression ratios when the intermediate data 411 is compressed as Huffman data.

For example, the following table shows category statistics for a hypothetical set of category data 281 ordered by decreasing number of occurrences. This table also shows the percentage of occurrences, not counting the previous categories, that are accounted for by the corresponding category. For example, after accounting for the 52 out of 102 occurrences of category 0 in the stage 1 compressed data stream, the 20 occurrences of category 1 are compared to the remaining 52 (=102−50) occurrences of categories other than category 0.

| | Occurrences | Category | % of Category | >1/2 |
|---|---|---|---|---|
| | 50 | 0 | 50/102 | no |
| | 20 | 1 | 20/52 | no |
| | 20 | 2 | 20/32 | yes |
| | 5 | 3 | 5/12 | no |
| | 5 | 4 | 5/7 | yes |
| | 1 | 5 | 1/2 | yes |
| | 1 | 6 | 1/1 | yes |
| Total: | 102 | | | |

Using the preceding table, the stage 2 controller 302 proceeds to encode the stage 1 compressed data stream in a series of passes as described above. For example, assume that the beginning of the compressed data stream that gave rise to the above statistics consists of the string of categories: "10020010003". Assume also that all categories whose occurrence percentage is greater than or equal to 50 percent are encoded to a "1". In the first pass on this stream the stage 2 controller encodes all occurrences of the category 0 (the most frequent category) to "0" because the category 0 data makes up less than 50% (i.e., 50/102) of the occurrences in the compressed data stream 281. All other categories are marked with a "1". Thus, after the first pass the intermediate stream is as follows:

Compressed Stream=10020010003

Intermediate Stream=10010010001.

In the second pass on the compressed stream the stage 2 controller 302 encodes all occurrences of the category 1 (the second most frequent category) to "0" and the remaining occurrences to "1". For the purposes of this discussion, the results from the additional pass are shown appended to the intermediate stream from the first pass. The categories that remain to be encoded after the first pass are shown in boldface type; each of these categories has a corresponding value in the new addition to the intermediate stream:

Compressed Stream=10020010003

Intermediate Stream=10010010001, 0101

During the third pass, the stage 2 controller 302 encodes each occurrence of category 2 (the next most common category yet to be encoded) to a "1" and the other categories to "0". The results of this pass are shown below using the same conventions as for the first two passes:

Compressed Stream=10020010003

Intermediate Stream=10010010001, 0101, 10

There is no need for a fourth pass as the final pass fully encoded the remaining two unencoded categories (2 and 3).

The resulting intermediate stream 411 is encoded by the stage 2 controller using the Huffman table 240-1 as described above. However, for these lower quality levels (2–5) this Huffman stream cannot be decompressed unless the statistics that gave rise to the encoding decisions are passed to the decompressor along with the Huffman data stream 301. This information is supplied in the category statistics 115 in the header 105H (FIG. 5A).

Compression Method

Figure 14:
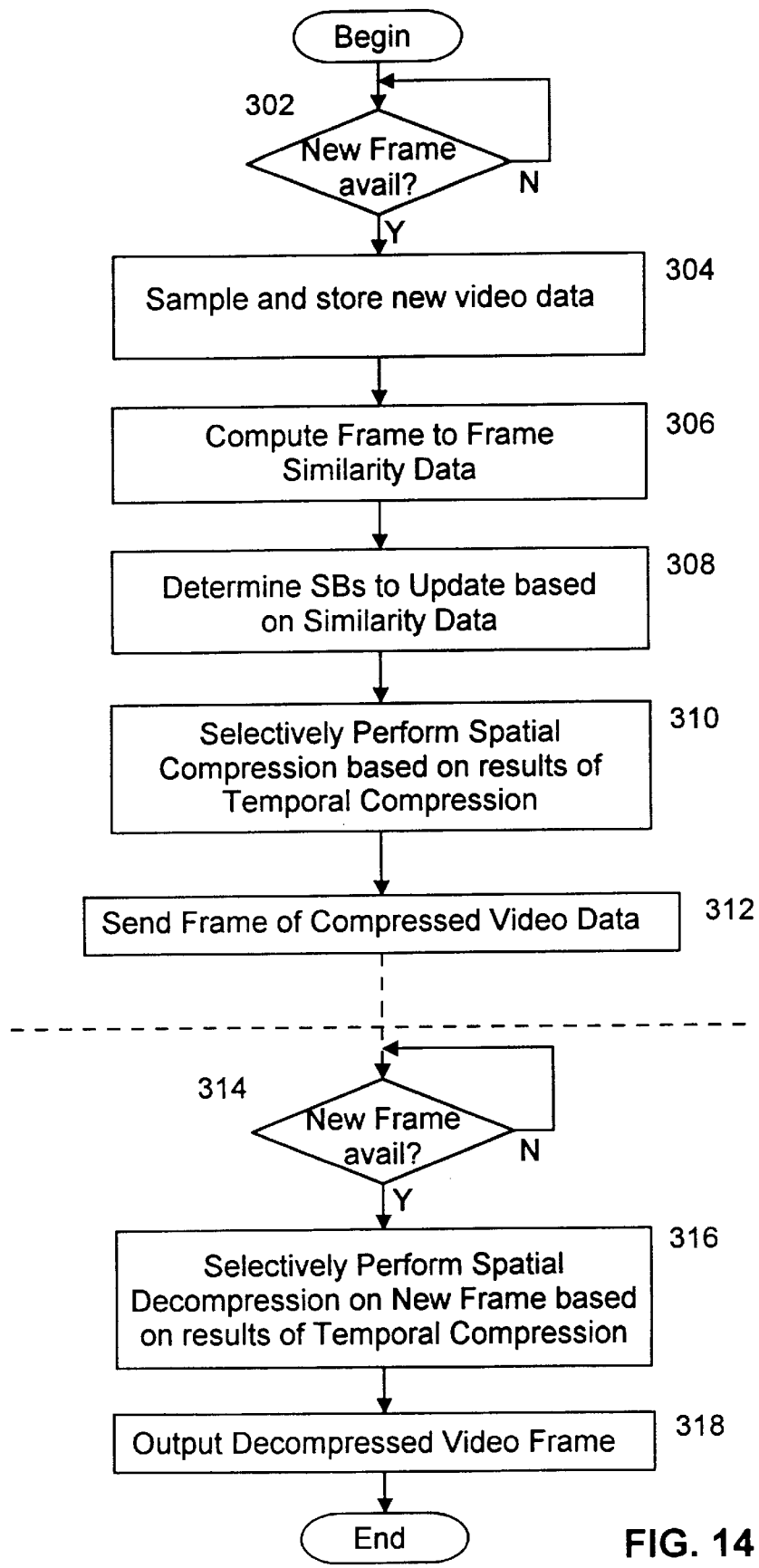
FIG. 14 is a flow diagram illustrating the method of the preferred embodiment.

Referring to FIG. 14, there is shown a flow chart of the video compression method of the present invention, which is implemented in the temporal compression executive 270 in conjunction with the FFM 260, the S1C 280 and the S2C 300. Because the structure of the elements involved in the compression steps have already been described, the present discussion focuses on the overall flow of the data compression method.

Referring to FIG. 14, the first step of the compression process is initiated when a new frame of data becomes available from the CCD 82 (302-Y). Upon receiving a new frame, the temporal compression executive 270 extracts the R, G and B element values from the data stream 103 and stores those values in the new data storage 180 (304). The temporal executive 270 then calls frame to frame update determination (FFM) 260, which characterizes differences between the new data 180 and corresponding blocks of the on-screen image (306).

The FFM 260 extracts the new data 180 in 8×8 pixel sub-blocks, which it then divides into 4, 4×4 pixel units and 16 2×2 pixel sub-blocks. For each sub-block the FFM 260 computes a group of temporary similarity data 192 comprising 20 datums. The same 20 datums for the currently-displayed image are made available to the FFM 260 as the permanent similarity data 190.

The FFM 260 generates a similarity value 264 that characterizes the similarity between corresponding datums from the permanent and temporary data 190, 192. In the preferred embodiment, this is accomplished by a lookup into the similarity table 220 using an 8-bit lookup address formed from corresponding permanent and temporary similarity datums. However, the similarity values could also be computed directly. The FFM 260 then computes the bitwise OR of a subset of the similarity values 264 for a single unit, which it stores as a single tolerance result 261. Each tolerance result 261 therefore characterizes the largest temporal differences between a unit of new data and a corresponding on-screen unit. The FFM 260 repeats these steps until it has exhausted all new data 180 from the new frame.

Once the tolerance results 261 have been computed, the FFM 260 determines which sub-blocks need to be updated (308).

As the first step in this process the FFM 260 scans the tolerance results 261. This requires the FFM 260 to compute for each unit a scan value 262 that represents the bitwise OR of the tolerance results for the current unit and its neighboring units. Each scan result therefore accounts for the most temporally dissimilar units in the neighborhood of that unit.

If the user quality setting 162 is between 0 and 8 (these are the high quality settings), the FFM 260 sets the quality level 268 to which a marked sub-block is to EH (0), MEH (1), VH (2) or H (3) in accordance with the user quality setting. If the user quality setting 162 is between 9 and 15 (these are the low quality settings), the FFM 260 adaptively sets the quality level 268 to H (3), M (4) or L (5) depending on the amount of data that needs to be transmitted for the update and the available bandwidth for the transmission (the higher quality levels are preferred). Once the quality level 268 is determined, the FFM 260 updates the permanent quality data 194 with one of two corresponding on-screen quality numbers 271Q.

If the number of sub-blocks marked for updating is less than the quality level setting, the FFM 260 re-scans the data, toggling the on-screen quality levels 271Q for sub-blocks that were not marked for updating from the lowest value of a corresponding quality pair 271Q to the higher value. The FFM 260 then marks for updating as many blocks as possible of on-screen data last displayed at a lower quality level than that used for the current update. In this way the FFM 260 incrementally improves the quality of a displayed image, even for parts of the image that have not changed from when they were first displayed.

Note that all of the aforementioned marking takes place in the block mark 192-5 of the temporary similarity data 192, which is cleared and then re-written by the FFM 260 after each iteration. When it has determined finally which sub-blocks are to be updated for the current update, the FFM 260 updates the permanent quality data 194 with the final quality setting 271Q and copies the temporary similarity data 192 to the permanent similarity data, which is used to compute the next frame update.

Once the FFM 260 has determined the sub-blocks to be updated, the S1 compressor (S1C) 280 and the S2 compressor (S2C) 300 compress the data from the sub-blocks marked for updating (310).

The S1C first scans the temporary similarity data 192 to locate a sub-block whose block mark 192-5 indicates that the sub-block is to be updated (i.e., for which a corresponding bit is set to "1"). The S1C 280 then spatially compresses the data in that sub-block in a manner that depends on the current quality level 168 set for the update (310). Upon the completion of step (310), the temporal compression executive 270 assembles the compressed datums generated by the S2C 280 into the compressed video stream 105 which it then transmits to a receiving computer.

As long as a communications link is established between the sending and receiving computers, the receiving computer stays in a loop, waiting for the next new frame of compressed video data (314). Upon receiving a new frame of data (314-Y) the receiving computer selectively performs spatial decompression on the incoming data stream (316). This requires the receiving computer to reverse the Huffman and stage 1 compression steps and to fill in the R and B element values which were compressed in the steps of stage 1 compression. The resulting de-compressed data stream 107' can then be displayed on the display.

Having discussed the method and system of the compressor 104, the decompressor 106 of the present invention is now discussed.

Temporal Decompression

Figure 12:
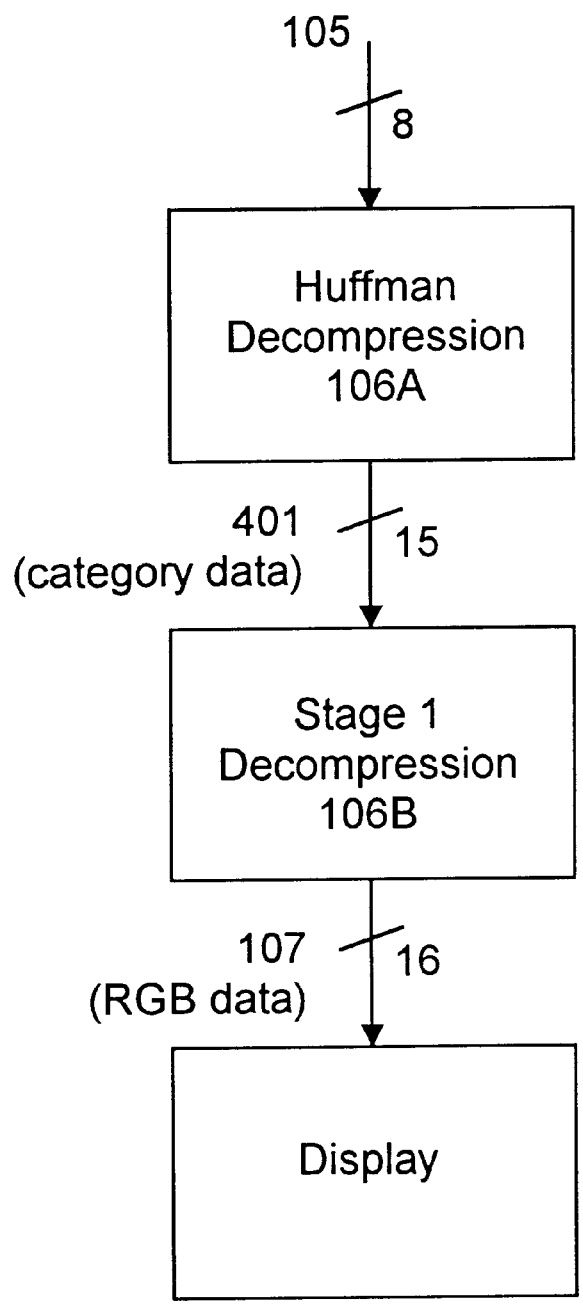
FIG. 12 is a functional block diagram of the video decompression system of the present invention.

Referring to FIG. 12, there is shown a functional block diagram of the decompression operation as it is implemented by the decompressor 106 of the present invention. In the first decompression stage 106A, the decompressor 106 reads the block marks 321 in the data stream 105 to determine whether any of that block's constituent sub-blocks are being updated with the current transmission. If none of the constituent sub-blocks are being updated, the decompressor 106 will not decompress the corresponding portion of the screen for that block. Otherwise, the decompressor 106 notes which blocks/sub-blocks are to be updated and initiates the process of de-coding the Huffman codes 323 for those sub-blocks.

The decompressor 106 performs the first stage of decompression 106A by taking in the compressed video datums 323 in 8-bit chunks and converting different numbers of bits (corresponding to the variable Huffman values) from the compressed datums 323 into category values 401i. When the compressed stream 105 was generated by the two highest quality update procedures 268 (0, 1), the category values 401i are 12-bits wide (i.e., four 3-bit categories). When the compressed stream 105 was generated by the lower quality update procedures 268 (2–5), the Huffman decompression step 106A includes the additional step of recreating the intermediate stream 411 generated during compression from which 3-bit categories 401 are generated. This intermediate step requires the decompressor 106 to reference category statistics 115 provided by the compressor 104 in the header 105H (FIG. 5A). The category statistics 115 comprise eight 4-bit, statistics category fields 115-i, 3 bits of which indicate a category and 1 bit of which represents the 1-bit value used to represent that category in a corresponding Huffman layer i. The first category field 115-1 corresponds to the most frequent category, which is the category encoded in the first Huffman layer. Subsequent category fields 115-i (i=2, ..., 8) correspond to increasingly less frequent categories.

In the second decompression stage 106B, the decompressor 106, using multiple decode tables 460-0, ..., 460-9 (which correspond to the encode tables 210-0, ..., 210-9), outputs for each pixel represented by between one and three category datums 401i an associated 15+1 (=16)-bit video data value 107i that can be displayed as part of the reconstructed video stream 107. How the decompressed data 107 is generated from the category data for the lower quality levels (2–5) depends on information contained in the block marks 321 that indicates at what level data from the respective sub-blocks is compressed (i.e., at the sub-block, unit or pixel level). Note that the decompressor 106 of the present invention can be implemented in hardware or software. However, for the purposes of the present application, it shall be assumed that the decompressor 106 is being implemented in software running inside a computer that controls the display of the reconstructed data 107.

Figure 13A:
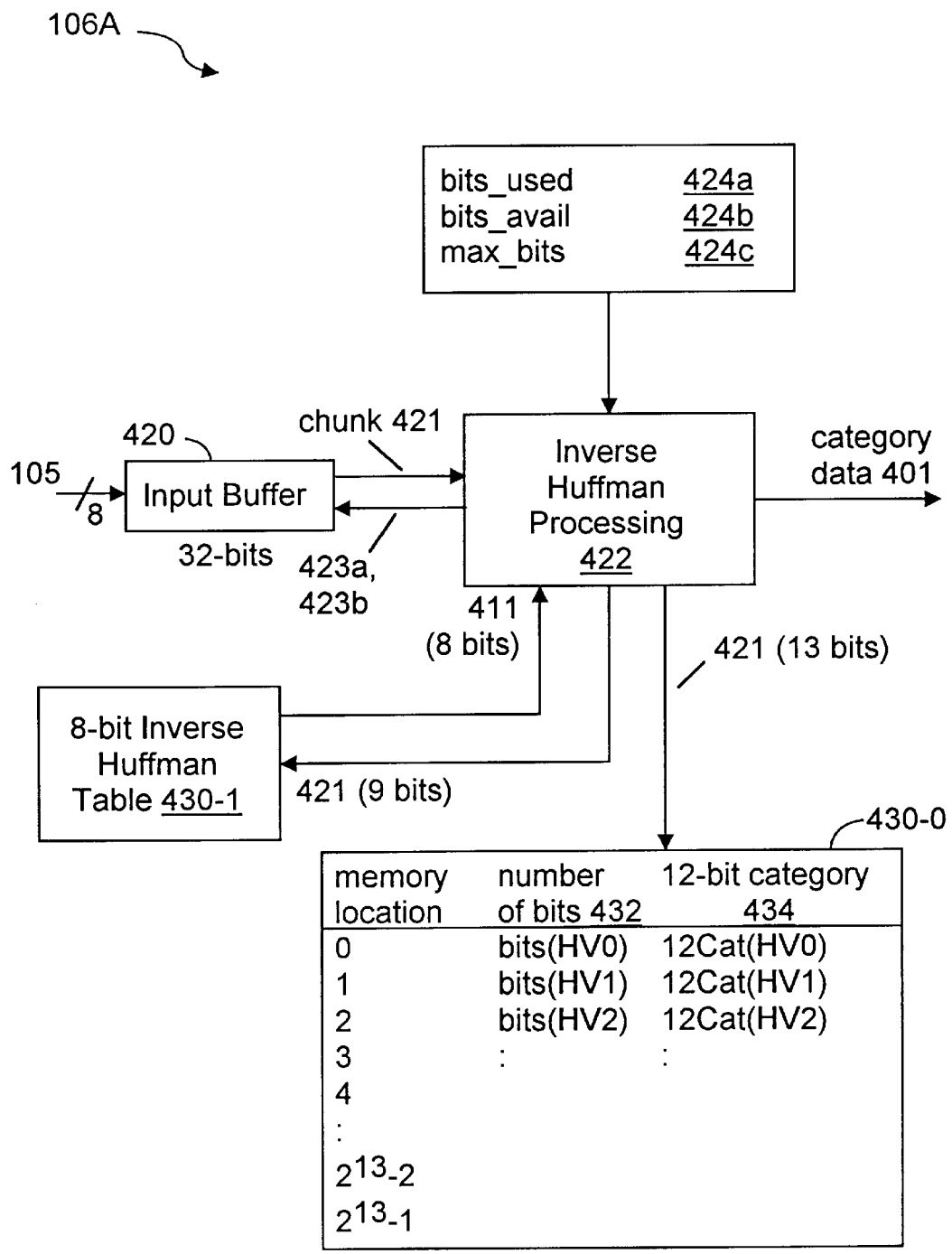
FIG. 13A is a functional block diagram of the first stage of the decompression system of the present invention.

Referring to FIG. 13A, there is shown a block diagram of the decompressor 106A that performs the first stage 106A of the two decompression stages described in reference to FIG. 12. This decompressor 106A includes a 32-bit input buffer 420, an inverse Huffman processor 422 and inverse Huffman tables 430-0 and 430-1. The input buffer 420 is a 32-bit buffer that receives the compressed data 105 from the output buffer and various control signals 423 from the inverse Huffman processor 422. These control signals include a bits_used signal 423a and a send_bits signal 423b. The inverse Huffman processor 422 also has access to several status variables, including bits_used 424a, bits_avail 424b and max_bits 424c. All of these elements can be equivalently implemented as a computer program or with digital electronic hardware, such as an integrated circuit supported by high-speed memory and registers.

Whenever it receives the send_bits signal 423b the input buffer 420 supplies the inverse Huffman processor 422 with an appropriate (what is meant by "appropriate" is described below) chunk of compressed video data 105 of the length of the longest Huffman value 305 (this length is provided by the max_bits value 424c). In the preferred embodiment this length is 13 bits for higher quality compression and 9 bits for lower quality compression. The inverse Huffman processor 422 decompresses the chunk 421 returned by the input buffer 420 by performing a lookup into the inverse Huffman table 430-0 for higher quality compression or by performing a lookup in the inverse Huffman table 430-1 for lower quality compression. Note that the inverse Huffman processor 422 also performs the checking of block marks 321 in the data stream 105 to determine the location of the on-screen blocks being updated.

If the data 105 were updated with one of the two highest quality update procedures 268 (i.e., 0, 1), the data generated by the Huffman processor 422 from the Huffman table lookup corresponds to a stream of 12-bit category data 401. The inverse Huffman processor 422 performs no additional processing in this case.

If the data 105 were updated with one of the lower quality update procedures 268 (i.e., 2–5), the 8-bit data generated by the Huffman processor 422 from the Huffman table 430-1 lookup does not correspond to a stream of category data 401. Instead, this data corresponds to the intermediate stream 411 (FIG. 11C) generated by the compressor 104 during the stage 2 compression operation. The Huffman processor 422 generates the corresponding category data 401 by reversing the process that created the intermediate stream 411. For example, in light of the category statistics, the Huffman processor 422 decodes the intermediate data stream 10010010001, 0101, 10 according to the following procedure:

(1) Read the category statistics 115 in the header 105H to determine the number of categories that are represented in the intermediate data stream, their relative frequencies and the one-bit values with which they are encoded. For this example, the category statistics would look as follows:

| Category | Encoded Value |
|----------|---------------|
| 0 | 0 |
| 1 | 0 |
| 2 | 1 |
| 3 | 0 |

(2) Analyze the first chunk (chunk 1="10010010001") in the compressed input 105 as follows:
  (a) in reference to the category statistics, determine the most common category represented in the chunk ("0"); and
  (b) decode its value in the intermediate stream ("0") to that category. This results in the following preliminary category data 401:

10010010001→1 0 0 1 0 0 1 000 1

(in this expression the string on the left is a bit stream that represents the first chunk from the intermediate stream 411 and the string on the right is the resulting preliminary category data 401, which is a bytestream representing at this step a partially decoded version of the intermediate stream 411. The bits on the left that are shown in bold typeface are the bits being decoded at the current step; the bolded bytes on the right are the corresponding decoded values of the bolded bits; in subsequent depictions of the preliminary category data 401, bytes that have been decoded are kept bolded).

(3) Analyze the next chunk (chunk 2="0101") as follows:
  (a) in reference to the category statistics, determine the most common category represented in the chunk ("1") and its encoded value in the second chunk ("0");

(b) identify byte locations BL in the category data 401 not used to encode the most common category in the previous chunk (for the current example, BL="1 0 0 1 0 0 1 0 0 0 1"); and
  (c) encode bytes in the byte stream corresponding to a "1" in the BL and a "0" in the current chunk to the current most common category (i.e., a "1") and encode the other bytes in the byte stream corresponding to a "1" in the BL to the next most frequent category (i.e., a "2"), giving the resulting partially decoded category data:

1 0 0 1 0 0 1 0 0 0 1→1 0 0 2 0 0 1 0 0 0 2.

(4) Decode the last chunk "10":
  (a) in reference to the category statistics, determine the next most frequent category represented in the chunk ("3") and the value in the chunk ("1") that encodes the most frequent category ("2"); and
  (b) determine the byte locations BL of intermediate values remaining to be decoded (BL ="0 0 0 1 0 0 0 0 0 0 1"); and insert a "3" at the locations coinciding with a "0" in the last a "0" in the last chunk (i.e., the chunk value not used to encode a category of 2), transforming the category data 401 as follows:

1 0 0 2 0 0 1 0 0 0 2→1 0 0 2 0 0 1 0 0 0 3.

Once the additional steps required for the lower quality Huffman processing have been performed as described, the remaining stage 2 decompression steps are performed. These steps are described following a description of the inverse Huffman processing for the EH and MEH quality levels.

As already described, for the EH and MEH quality levels the inverse Huffman processor 422 uses a lookup technique wherein a chunk 421 of compressed data 323 is used to read out a 12-bit category value 434 from an inverse Huffman table 430-0. This compressed data 323 is stored in the input buffer 420. Because the Huffman values of the present invention can be as long as 13-bits and because the temporal compressor 104 of the preferred embodiment can package together Huffman data from two different category words 281 (e.g., the compressor 104 can output an 8-bit chunk of compressed data 323 that includes a 7-bit Huffman value and 1-bit from a second, 13-bit Huffman value), the input buffer 420 needs to be at least as large as the sum of the longest Huffman value max_bits 424c (e.g., 13 bits) and the width of the temporal compressor's output word size minus 1 (e.g, 7-bits). These values ultimately depend on the architecture of the computer hosting the decompressor 106. In the preferred embodiment, the input buffer is 32 bits wide.

In the preferred embodiment, the table 430-0 includes $2^{13}$ entries. As previously described, each of these entries includes a number_of_bits field 432 that indicates the number of bits in the Huffman value that corresponds to that entry and a 12-bit category field 434 that provides the Huffman value's associated 12-bit category 401.

An actual example of the 12-bit lookup table 430-0 used in the preferred embodiment is shown in Appendix E0. In this example, the 13-bit lookup addresses of the table 430-0 are represented by the "array val" field. The number of bits field 432 and 12-bit category field 434 from the table 430-0 are encoded as a single decimal value "dec value". This "dec value" can be decoded by converting it to its 32-bit binary representation, wherein the least significant 12 bits (b0 to b11) are the 12-bit category 281 and the next 4-bits (b12–b15) provide the number of bits 432. Thus, using Table 430-0, for "array val"=64 (corresponding to a 12-bit address represented in octal as 0100), "dec val"=16411, which has the binary representation: 1000 0000 0001 1011. From this binary representation, it can be determined that the number of bits in the corresponding Huffman value is 8 ("1000") and the associated 12-bit category is 27 ("000011011"). One can verify this result by referring back to the Huffman table 240-0 shown in Appendix D0. An actual example of the 8-bit lookup table 430-1 used in the preferred embodiment for lower quality compression is shown in Appendix E1.

The inverse Huffman processor 422 is a state machine that keeps track of and controls the progress of the Huffman decompression operation based partly on stored status data. One particularly important item of status data is the bits_used variable 424a that is continually updated by the inverse Huffman processor 422 to indicate how many bits of the compressed data currently stored in the input buffer 420 have already been processed (i.e., decompressed). The status data also includes a bits_avail variable 424b that indicates how many of the bits in the input buffer 420 remain to be processed. Because the Huffman decompression method of the present invention uses a lookup technique wherein a multi-bit block of compressed data is used to read out a 12-bit category value from an inverse Huffman table 430-0, the inverse Huffman processor cannot perform a lookup until there is enough data in the input buffer 420 for the worst case Huffman value, which could be as long as 13-bits. Moreover, there is no guarantee that, just because the input buffer 420 has max_bits 424c of stored data, that all of those bits belong to a single Huffman value. This is because the output register 390 can package multiple Huffman values together and can also package incomplete Huffman values. For example, assuming the output buffer 390 provides 8-bits of data at a time, one buffer of compressed data 105 might include a 7-bit Huffman value and one bit from a 13-bit Huffman value that corresponds to the next pixel.

Consequently after each lookup, the inverse Huffman processor 422 updates the bits_used and bits_avail variables 424a, 424b and issues the bits_used message 423a to the input buffer 420. (The bits_used variable 424a is updated with the number of bits data 432 for the current Huffman-decoded category data.) Upon receiving this message, the input buffer makes the bits_used 424 unavailable for further processing and subtracts bits_used 424a from the bits_avail value 424b. If at this point, bits_avail 424 is still greater than or equal to max_bits 424e, the inverse Huffman processor 422 performs another lookup on the remaining bits in the lookup buffer. If bits_avail 424b is less than the longest Huffman string max_bits 424c, the inverse Huffman processor 422 issues the get_bits message 423b to the input buffer, upon which the input buffer 420 loads another 8-bit chunk 105 from the compressor (in alternative embodiments, this could also be a 4 or 12 bit chunk) and passes the new bits on to the inverse Huffman processor 422 along with the other available bits in the input buffer 420 as a max_bits chunk 421.

Figure 13B:
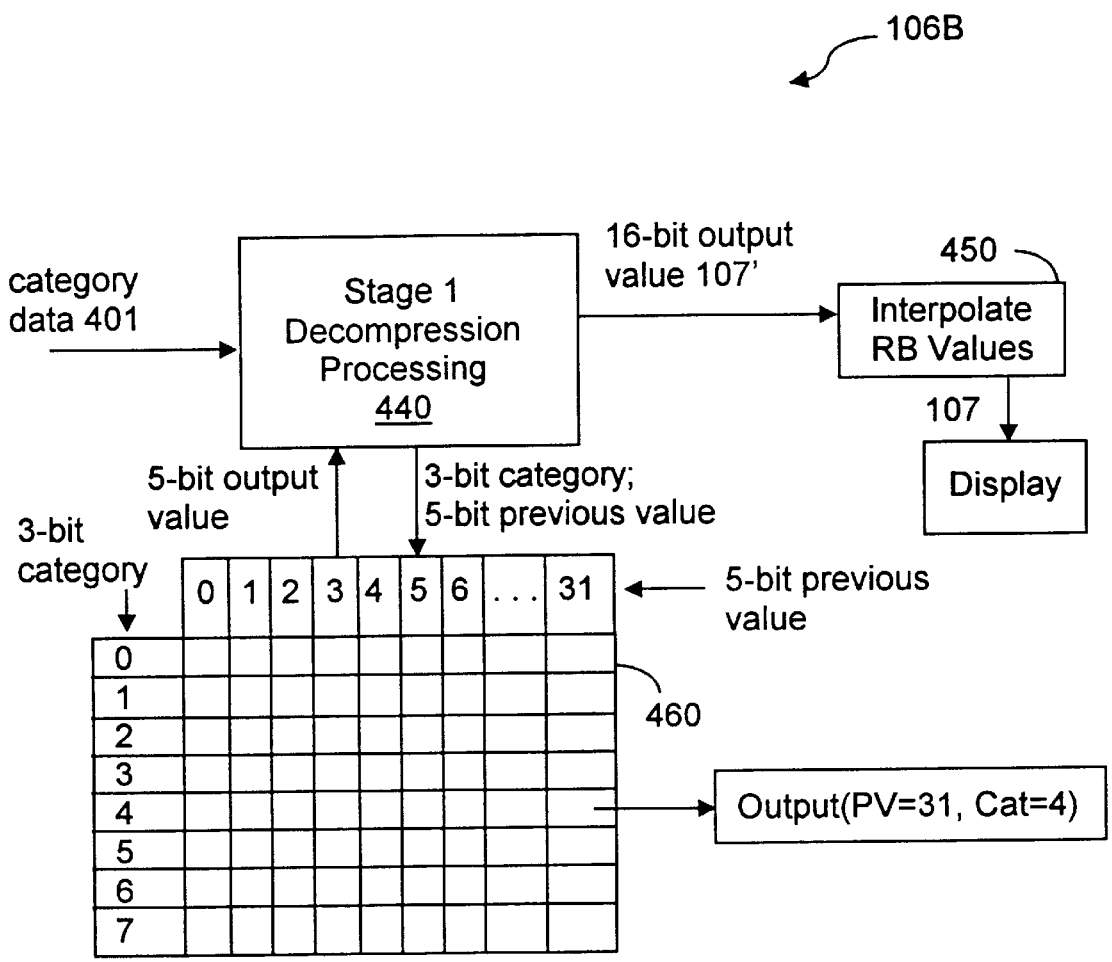
FIG. 13B is a functional block diagram of the second stage of the decompression system of the present invention.

Once it has decompressed a Huffman datum from the compressed bit stream 105, the inverse Huffman processor 422 outputs the corresponding category data 401 (3-bit categories for the VH, H, M and L quality levels and 12-bit words for the EH and MEH levels) to stage 1 decompression 106B, which is described in reference to FIG. 13B.

Referring to FIG. 13B, there is shown a block diagram of a preferred embodiment for performing stage 1 decompression 106B. This embodiment includes a stage 1 decompression processor 440, an interpolator 450, display 107 and various inverse category lookup tables 460. The decompression processor 440 performs a lookup into an appropriate inverse category lookup table 460-0, . . . , 460-9 using 3-bits of the category data 401 and 5-bits of the 15-bit previous value (computed by the decompressor 106 in the previous processing interval). Note that the inverse lookup tables 460-0, . . . , 460-9 are respectively associated with the lookup tables 210-0, . . . , 210-9. The stage 1 decompressor 440 determines which table to use based on the user quality setting 162 and frame update procedure 268 which are respectively transmitted in the frame update header 105H in the 4-bit fields 111, 113. As with the lookup tables 210, the value of the 5-bit previous pixel is set to 16 when the pixels being decoded are in the first row or first column of a frame. Using respective ones of the 5-bit previous values and 3-bit categories from the category data 401, the stage 1 decompression processor 440 is able to generate the 5-bit RGB values for a decompressed video datum 107i', which is packaged as a 16-bit value that can be displayed as part of a video image.

The previous values needed to perform stage 1 decompression (and to evaluate stopping conditions in the Huffman decompression step) might not be from the current frame update, the decompressor 106 maintains a permanent memory, similar to the permanent category data maintained by the compressor.

However, at this point, the 16-bit decompressed video datums 107' are not ready to be displayed. This is because the preferred embodiment includes in the compressed data stream 105 less data for RB pixel elements than for G element data (i.e., depending on the update quality level, the video compressor might output only 1 R and B categories/OVs per 4, 16 or 64 G categories/OVs). Consequently, it is necessary for the decompressor 106 to fill in the missing categories/OVs for the R and B pixel elements which were not represented in the compressed data stream 105. The compressor does this in accordance with the following expression:

$$G_{AVG} - G_i \cdot R_{AVG} = R_i.$$

In this expression, $G_{AVG}$ is the average of all of the decompressed G elements from the pixels represented by a single R category/OV (e.g., in the LOW quality situation, 16 sampled pixels are represented by a single R value), $G_i$ is the decompressed G output value of a pixel i (which is one of the aforementioned pixels), $R_{AVG}$ is the decompressed R value corresponding to the aforementioned R elements, and $R_i$ is the estimated value computed by the RB interpolator 450 for the R element of the pixel i. The interpolator 450 then outputs the interpolated R and B values, along with the corresponding G values as an updated decompressed video stream 107 to the display. Note that the RAVG from the decompressor is never directly used for any particular pixel.

Figure 15:
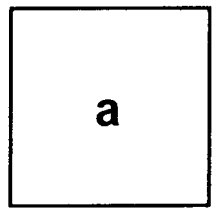
FIG. 15 is a diagram showing the positions of pixels used to reconstitute R, G and B data for a pixel "x" during medium (M) quality update processing.
Figure 15:
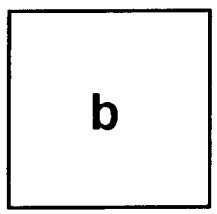
Figure 15:
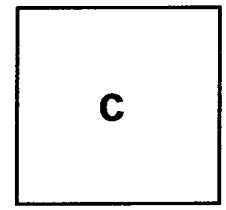
Figure 15:
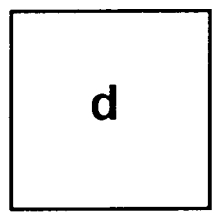

As mentioned above, decompression of data that has been updated at the "M" quality level requires special processing. At the M quality level data from only 50 percent of the pixels is used to generate the update data. As a result, the decompressed output data for the entire image is reworked so that the missing data is filled in. Referring to FIG. 15, there is shown a group of four pixels (a, b, c, d) for which there are decompressed values and another pixel (x) for which there is no decompressed value (i.e., data from the pixel x was not used in the compression step). The preferred embodiment fills in R, G and B output values for the pixel x as follows:

if ($a>d$) then $v=a-d$; else $v=d-a$;

if ($b>c$) then $h=b-c$; else $h=c-b$;

if (v<h) then x=a; else x=b.

This method is applied to each of the pixels whose data was not used in the compression operation.

While the present invention has been described with reference to a few specific embodiments, the description is illustrative of the invention and is not to be construed as limiting the invention. For example, any of the tables described can exist in different sizes or dimensions and the methods and operations described can be implemented in software or hardware. Various modifications may occur to those skilled in the art without departing from the true spirit and scope of the invention as defined by the appended claims.

What is claimed is:

1. A method for performing temporal compression and decompression of color video data, comprising the steps of:
   a) receiving a new frame of said video data;
   b) determining differences between contents of said new frame and contents of an on-screen video image displayed from previous frames of said video data;
   c) designating as updating information data from regions of said new frame for which said differences exceed an updating threshold;
   d) determining updating quality of video compression to be applied to said updating information so that said updating information takes up no more than bandwidth available for a video transmission in which said updating information is transferred to a device displaying said video image;
   e) when said updating information fits within said bandwidth, designating for inclusion in said updating information data from other regions of said new frame corresponding to other regions of said on-screen image displayed by said device with a display quality less than said updating quality;
   f) compressing said updating information at a compression level consistent with said updating quality;
   g) forming said video transmission by merging the compressed updating information with block marks indicating the on-screen blocks to be updated with the compressed updating information; and
   h) appending to said video transmission a representation of said updating quality.

2. The method of claim 1, further comprising the steps, implemented in said device, of:
   receiving said video transmission;
   determining from said block marks which of said on-screen blocks are to be updated with said compressed updating information;
   decompressing said compressed updating information based on said updating quality; and
   updating said on-screen blocks to be updated with the decompressed video data.

3. The method of claim 2 wherein pixels of said color video data comprise red, green and blue pixel elements.

4. The method of claim 1, wherein the difference-determining step comprises:
   sub-dividing said regions into sub-regions; and
   computing for each sub-region:
      a plurality of color element datums each representing a color characteristic of a respective group of pixel elements;
      for corresponding on-screen and new color element datums a corresponding similarity value that quantizes degree of similarity between said corresponding datums; and
      a tolerance result that is a function of said similarity values for said sub-regions; such that said tolerance result encodes the largest dis-similarity between said new and on-screen sub-regions.

5. The method of claim 4 wherein the step of computing the similarity value comprises performing a lookup into a similarity table at a similarity lookup address that is a function of values of the corresponding on-screen and new color datums.

6. The method of claim 5, further comprising the step of:
   receiving a user quality setting indicating a preferred quality level at which the updating information is to be provided;
   wherein there are a plurality of similarity tables, each being associated with a respective user quality setting, such that the similarity table used for the lookup is determined by the received user quality setting.

7. The method of claim 6, further comprising the step of generating similarity table values for the similarity table associated with the respective user quality setting as follows:
   (1) computing a user quality number UQ, where:

$UQ = (\text{user quality setting} + 1)/2;$ (2) computing for a permanent intermediate value (PIV) and a temporary intermediate value (TIV) pair a selection factor n, where:

$n = (\text{absolute value}(PIV - TIV))/UQ,$ wherein the PIV and the TIV correspond respectively to functions of the values of the corresponding on-screen and new color datums;
   (3) computing a scale factor m for the PIV/TIV pair where:

$$\text{if } (n = 0) \text{ then}$$
   $$m = 0;$$
   $$\text{else if } (n > 3) \text{ then}$$
   $$m = 2^4;$$
   $$\text{else } m = 2^{n+1};$$

(4) computing the similarity table value SV for the PIV/TIV pair, where:

$SV = m(PIV - TIV);$ (5) repeating the steps (2)–(4) until all PIV/TIV combinations are exhausted.

8. The method of claim 1, further comprising the steps of:
   receiving a user quality setting indicating a preferred quality level at which the updating information is to be provided;
   when the user quality setting is in highest group, setting the updating quality to extra high (EH) quality;
   when the user quality setting is in second highest group, setting the updating quality to medium extra high (MEH) quality;
   when the user quality setting is in third highest group, setting the updating quality to very high (VH) quality;
   when the user quality setting is in fourth highest group, setting the updating quality to high (H) quality;
   when the user quality setting is in fifth highest group, determining the updating quality as described in accordance with claim 1.

9. The method of claim 8 wherein, when the updating quality is in the fifth highest group, limiting the updating quality from the updating quality determining step to high (H), medium (M) or low (L) quality levels.

10. The method of claim 9, wherein the compression step comprises, for each of the regions to be updated:
performing a stage 1 compression step wherein a category is generated for each pixel group in the region, the pixel group including at least one same-color pixel element, the category for a respective pixel group having fewer bits than an individual pixel element and representing spatial differences between the respective pixel group and neighboring pixel groups, the output of the stage 1 compression step being a stream of category data, the stream of category data being used to generate the compressed updating information.

11. The method of claim 10 wherein, when the updating quality is the EH quality, said stage 1 compression operation comprises:
for each pixel element in a sub-block to be updated, wherein the sub-block is a constituent of the region to be updated:
computing a previous value (PV) and a current value (CV);
generating a first category (Cat1) and a corresponding first output value (OV1), wherein the Cat1 and the OV1 are functions of the PV and the CV;
when the Cat exceeds a first predefined threshold; generating a second category (Cat2) and a corresponding second output value (OV2), such that the OV2 value is always within a first predetermined distance of the CV that is less than the distance between the OV1 and the CV.

12. The method of claim 11, wherein:
the pixel element, previous value, current value and output values are 5-bit values, the categories are 3-bit values, and the sub-block is an 8×8 collection of pixels;
the step of generating the first category (Cat1) comprises performing a lookup into a fine table associated with the EH quality level that maps PV/CV pairs into associated Cat/OV values; and
the step of generating the second category (Cat2) comprises performing a lookup into a coarse table associated with the EH quality level that maps the PV/CV pairs into different associated Cat/OV values;
such that the fine table maps fewer of the PV/CV pairs into small Cat values than the coarse table.

13. The method of claim 10 wherein, when the updating quality is the MEH quality, said stage 1 compression operation comprises:
(1) for each G pixel element in a sub-block to be updated, wherein the sub-block is a constituent of the region to be updated:
computing a G previous value (GPV) and a G current value (GCV);
generating a first G category (GCat1) and a corresponding first G output value (GOV1), wherein the GCat1 and the GOV1 are functions of the PV and the CV;
when the GCat1 exceeds a first predefined threshold; generating a second G category (GCat2) and a corresponding second G output value (GOV2), such that the GOV2 value is always within a first predetermined distance of the GCV that is less than the distance between the GOV1 and the GOV; and
(2) for each sub-unit in a sub-block to be updated:
for R and B pixel element sets, wherein the R and B element sets respectively comprise all R and B pixel elements from the sub-unit:
computing a respective R, B previous value (RPV, BPV) and a R, B current value (RCV, BCV);
generating a first R, B category (RCat1, BCat1) and a corresponding first R, B output value (ROV1, BOV1), wherein the RCat1, BCat1 and the ROV, BOV are functions of the RPV and the RCV; and
when the RCat1, BCat1 exceeds a first predefined threshold; generating a second R, B category (RCat2, BCat2) and a corresponding second R, B output value (ROV2, BOV2), such that the ROV2, BOV2 value is always within a first predetermined distance of the RCV, BCV that is less than the distance between the ROV1, BOV1 and the RCV, BCV.

14. The method of claim 13 wherein:
the pixel elements, previous values, current value and output values are 5-bit values, the categories are 3-bit values, the sub-block is an 8×8 collection of pixels and the sub-unit is a 2×2 collection of pixels;
the step of generating the first categories comprises performing a lookup into a fine table associated with the MEH quality level that maps PV/CV pairs into associated Cat/OV values; and
the step of generating the second categories comprises performing a lookup into a coarse table associated with the MEH quality level that maps the PV/CV pairs into different associated Cat/OV values;
such that the fine table maps fewer of the PV/CV pairs into small Cat values than the coarse table.

15. The method of claim 10 wherein, when the updating quality is selected from the VH, H, M or L qualities, said stage 1 compression operation comprises:
(1) for each unit in a sub-block to be updated, wherein the sub-block is a constituent of the region to be updated:
computing four horizontal composites (HCOMP), wherein a composite is a value computed from R, G and B values of a group of pixels and each of the horizontal composites is computed from a respective horizontal strip of pixels within the unit;
computing four vertical composites (VCOMP), wherein each of the vertical composites is computed from a respective vertical strip of pixels within the unit;
computing a set of green averages (GAVG), wherein each of the green averages is computed from G element data for a respective sub-unit within the unit;
computing a single red average (RAVG) from R element data for the unit's pixels;
computing a single blue average (BAVG) from B element data for the unit's pixels;
(2) computing a sub-block composite value (SBCOMP) for the sub-block that is a function of the R G and B element data for the sub-block;
(3) for each horizontal/vertical composite computed for the sub-block, computing a horizontal/vertical similarity value representing differences between the horizonal/vertical composite and the sub-block composite;
(4) when each of the horizontal/vertical similarity values is less than or equal to a first predetermined threshold, setting an update level to sub-block level, the update level indicating level of detail at which the sub-block is to be updated;
(5) when at least one of the horizontal/vertical similarity values is greater than the first predetermined threshold, computing a tolerance result for each unit in the sub-block and comparing each of the tolerance results to a second predetermined threshold;

(6) when the tolerance result does not exceed the second predetermined threshold, setting the update level for the corresponding unit to unit level;

(7) when the tolerance result exceeds the second predetermined threshold, setting the update level for the corresponding unit to pixel level; and (8) generating for the sub-block a number of OV/Cat pairs consistent with the update level and the updated quality.

16. The method of claim 15 wherein, when the updating quality is the VH quality, step (8) of said stage 1 compression operation comprises:

(1) when the sub-block is to be updated at the sub-block level:

computing a red previous value (RPV), green previous value (GPV) and blue previous value (BPV) respectively representing averages for previous R, G and B element values taken over the entire sub-block;

computing a red current value (RCV), green current value (GCV) and blue current value (BCV) respectively representing averages for current R, G and B element values taken over the entire sub-block;

generating for each PV/CV pair consisting of the PV and CV computed for corresponding color elements, a first G category (Cat1) and a corresponding first output value (OV1), wherein the Cat1 and the OV1 are functions of the PV and the CV; and when the Cat1 exceeds a first predefined threshold; generating a second category (Cat2) and a corresponding second output value (OV2), such that the OV2 value is always within a first predetermined distance of the CV that is less than the distance between the Cat1 and the OV1;

(2) when the sub-block includes a unit to updated at the unit level, for that unit:

computing a red unit previous value (RUPV), green unit previous value (GUPV) and blue unit previous value (BUPV) respectively representing averages for previous R, G and B element values taken over the unit;

computing a red unit current value (RUCV), green unit current value (GUCV) and blue unit current value (BUCV) respectively representing averages for current R, G and B element values taken over the unit;

generating for each unit PV/CV pair consisting of the unit PV and unit CV computed for corresponding color elements, a third category (Cat3) and a corresponding third output value (OV3), wherein the Cat3 and the OV3 are functions of the unit PV and the unit CV; and when the Cat3 exceeds a second predefined threshold; generating a fourth category (Cat4) and a corresponding fourth output value (OV4), such that the OV4 value is always within a second predetermined distance of the unit CV that is less than the distance between the OV3 and the unit CV; and (3) when the sub-block includes a unit to updated at the pixel level, for each sub-unit within that unit:

designating upper-left, upper-right, lower-left and lower right pixels as pixels Pa, Pb, Pc, P1;

computing respective pixel Cat/OV pairs for G data from the pixels P1 and Pa;

determining whether to compute respective pixel Cat/OV pairs for G data from the pixels Pc and Pb based on comparisons between P1 and Pa and respective neighborhood averages of selected groups of pixels neighboring the pixels Pc and Pb, respectively; and computing the pixel Cat/OV pairs for the pixels Pc and Pb only when the respective comparison is greater than a third predefined threshold.

17. The method of claim 15 wherein, when the updating quality is selected from the H, M or L quality, step (8) of said stage 1 compression operation comprises:

(1) when the sub-block is to be updated at the sub-block level:

computing a red previous value (RPV), green previous value (GPV) and blue previous value (BPV) respectively representing averages for previous R, G and B element values taken over the entire sub-block;

computing a red current value (RCV), green current value (GCV) and blue current value (BCV) respectively representing averages for current R, G and B element values taken over the entire sub-block;

generating for each PV/CV pair consisting of the PV and CV computed for corresponding color elements, a first G category (Cat1) and a corresponding first output value (OV1), wherein the Cat1 and the OV1 are functions of the PV and the CV; and when the Cat1 exceeds a first predefined threshold; generating a second category (Cat2) and a corresponding second output value (OV2), such that the OV2 value is always within a first predetermined distance of the CV that is less than the distance between the Cat1 and the OV1;

(2) when the sub-block includes a unit to updated at the unit level, for that unit:

computing a red unit previous value (RUPV), green unit previous value (GUPV) and blue unit previous value (BUPV) respectively representing averages for previous R, G and B element values taken over the unit;

computing a red unit current value (RUCV), green unit current value (GUCV) and blue unit current value (BUCV) respectively representing averages for current R, G and B element values taken over the unit;

generating for each unit PV/CV pair consisting of the unit PV and unit CV computed for corresponding color elements, a third category (Cat3) and a corresponding third output value (OV3), wherein the Cat3 and the OV3 are functions of the unit PV and the unit CV; and when the Cat3 exceeds a second predefined threshold; generating a fourth category (Cat4) and a corresponding fourth output value (OV4), such that the OV4 value is always within a second predetermined distance of the unit CV that is less than the distance between the OV3 and the unit CV;

(3) when the sub-block includes a unit to updated at the pixel level and the quality level is the H level, for each sub-unit within that unit:

designating upper-left, upper-right, lower-left and lower right pixels as pixels Pa, Pb, Pc, P1;

computing respective H pixel Cat/OV pairs for G data from the pixels P1 and Pa;

determining whether to compute respective H pixel Cat/OV pairs for G data from the pixels Pc and Pb based on comparisons between P1 and Pa and respective neighborhood averages of selected groups of pixels neighboring the pixels Pc and Pb, respectively; and computing the H pixel Cat/OV pairs for the pixels Pc and Pb only when the respective comparison is greater than a third predefined threshold;

(4) when the sub-block includes a unit to updated at the pixel level and the quality level is the M level, for each sub-unit within that unit:

computing respective M pixel Cat/OV pairs for G data from the pixels P1 and Pa; and (5) when the sub-block includes a unit to be updated at the pixel level and the quality level is the L level, for each sub-unit within that unit:
  computing an average GAVGSU from G element values of the pixels composing the sub-unit;
  computing a single L pixel Cat/OV pair for the sub-unit using the GAVGSU as the CV in a lookup operation that produces the Cat/OV pair.

18. The method of claim 10, wherein the compression step further comprises:
  after the stage 1 compression step, performing a stage 2 compression step wherein the stream of category data is converted to a stream of Huffman data wherein a respective category group of one or more categories from the stream of category data is represented by a variable-length Huffman value wherein the number of bits is inversely related to the likelihood of occurrence of the respective category group.

19. The method of claim 18, wherein, when the updating quality is selected from the EH or MEH quality:
  the category group comprises four 3-bit categories;
  the longest variable length Huffman value comprises 13-bits; and
  the stage 2 compression step comprises reading the Huffman value corresponding to the category group from a pre-computed Huffman table wherein the category group comprises the address of the readout value.

20. The method of claim 18, wherein, when the updating quality is selected from the VH, H, M or L qualities, the stage 2 compression step comprises:
  (1) determining statistical likelihood of occurrence of each of the categories, the statistical likelihood for a particular category including a weighted likelihood representing the likelihood of the particular category occurring with respect to the total of the less-frequent categories;
  (2) setting a scan category to the most likely category;
  (3) scanning in order a category stream including the categories from the stage 1 compression operation, including the steps of:
    (a) when the weighted likelihood of the scan category is less than 50 percent, generating a corresponding layer in an intermediate stream wherein a first predefined 1-bit value is used to encode each occurrence in the category stream of the scan category and a second predefined one bit value is used to encode each occurrence in the category stream of less frequent categories;
    (b) when the weighted likelihood of the scan category is greater than or equal to 50 percent, generating a corresponding layer in an intermediate stream wherein the second predefined 1-bit value is used to encode each occurrence in the category stream of the scan category and the first predefined one bit value is used to encode each occurrence in the category stream of less frequent categories;
    (c) when there is more than one less frequent category setting the scan category to the most frequent of the less frequent categories and repeating step (3);
    (d) when there is exactly one less frequent category, continuing with step (4); and
  (4) generating a series of Huffman values, each corresponding to a respective N-bit group from the intermediate stream, wherein N is a positive integer.

21. The method of claim 20 wherein the step of generating the series of Huffman values comprises, for each Huffman value, reading from a N-bit Huffman table a Huffman value whose address in the Huffman table is provided by the N-bit group.

22. The method of claim 21 wherein:
  N is 8 bits; and
  the Huffman value can at most comprise 9-bits.

23. The method of claim 20, wherein the appending step of claim 3 further comprises appending the statistical likelihood information to the compressed updating information, which enables the receiving device to decompress the stream of Huffman data composing the compressed updating information.

* * * * *